United States Patent
Ahadi et al.

(10) Patent No.: US 11,515,640 B2
(45) Date of Patent: Nov. 29, 2022

(54) EMNZ METAMATERIAL SWITCH CONFIGURED FOR ANTENNA MODULATION IN A SWITCHED-BEAM ARRAY ANTENNA

(71) Applicants: Mehran Ahadi, Tehran (IR); Amir Jafargholi, Tehran (IR); Parviz Parvin, Tehran (IR)

(72) Inventors: Mehran Ahadi, Tehran (IR); Amir Jafargholi, Tehran (IR); Parviz Parvin, Tehran (IR)

(73) Assignee: AMIRKABIR UNIVERSITY OF TECHNOLOGY, Tehran (IR)

( * ) Notice: Subject to any disclaimer, the term of this patent is extended or adjusted under 35 U.S.C. 154(b) by 0 days.

(21) Appl. No.: 17/180,839

(22) Filed: Feb. 21, 2021

(65) Prior Publication Data
US 2021/0194143 A1     Jun. 24, 2021

Related U.S. Application Data

(63) Continuation-in-part of application No. 17/166,037, filed on Feb. 3, 2021, and a continuation-in-part of application No. 17/096,482, filed on Nov. 12, 2020.
(Continued)

(51) Int. Cl.
| | | |
|---|---|---|
| *H01Q 15/00* | (2006.01) | |
| *H01Q 9/06* | (2006.01) | |
| *H01Q 1/38* | (2006.01) | |
| *H01Q 3/26* | (2006.01) | |
| *H01P 1/10* | (2006.01) | |

(Continued)

(52) U.S. Cl.
CPC .......... *H01Q 15/0086* (2013.01); *H01P 1/10* (2013.01); *H01P 1/18* (2013.01); *H01Q 1/38* (2013.01); *H01Q 3/26* (2013.01); *H01Q 3/36* (2013.01); *H01Q 9/065* (2013.01); *H01Q 15/004* (2013.01); *H01Q 21/0075* (2013.01)

(58) Field of Classification Search
CPC ...... H01Q 3/36; H01Q 21/0075; H01Q 9/065; H01Q 9/047; H01P 1/10; H01P 1/18
USPC ........................................................ 333/164
See application file for complete search history.

(56) References Cited

PUBLICATIONS

"Parametric study on the use of magneto-dielectric materials for antenna miniaturization" by A. Louzir et al., published in 2010 IEEE Antennas and Propagation Society International Symposium, pp. 1-4. IEEE, 2010.

*Primary Examiner* — Benny T Lee
(74) *Attorney, Agent, or Firm* — Bajwa IP Law Firm; Haris Zaheer Bajwa

(57) ABSTRACT

A system for EMNZ metamaterial-based direct antenna modulation. The system includes a signal generator, a metamaterial switch and an antenna. The signal generator may is configured to generate a microwave signal. The metamaterial switch is configured to generate a modulated microwave signal from the microwave signal. The modulated microwave signal is generated by selectively passing the microwave signal through the metamaterial switch. The metamaterial switch includes a first conductive plate and a first loaded conductive plate. The first loaded conductive plate includes a second conductive plate and a first monolayer graphene. The first monolayer graphene includes a first tunable conductivity. The first monolayer graphene is positioned between the first conductive plate and the second conductive plate. An effective permittivity of the metamaterial switch is configured to be adjusted to a predetermined value. The effective permittivity of the metamaterial switch is adjusted responsive to tuning the first tunable conductivity.

20 Claims, 63 Drawing Sheets

Related U.S. Application Data

(60) Provisional application No. 62/980,154, filed on Feb. 22, 2020, provisional application No. 62/970,191, filed on Feb. 5, 2020, provisional application No. 62/934,012, filed on Nov. 12, 2019.

(51) Int. Cl.
*H01P 1/18* (2006.01)
*H01Q 3/36* (2006.01)
*H01Q 21/00* (2006.01)

EMNZ METAMATERIAL SWITCH CONFIGURED FOR ANTENNA MODULATION IN A SWITCHED-BEAM ARRAY ANTENNA

CROSS-REFERENCE TO RELATED APPLICATION

This application is a continuation-in-part of U.S. patent application Ser. No. 17/166,037, filed on Feb. 3, 2021, and entitled "SWITCH, MULTIPLEXER, AND PHASE SHIFTER BASED ON EMNZ METAMATERIALS," which is a continuation-in-part of U.S. patent application Ser. No. 17/096,482, filed on Nov. 12, 2020, and entitled "ADJUSTING A CUTOFF FREQUENCY OF AN EMNZ METAMATERIAL", which takes priority from U.S. Provisional Patent Application Ser. No. 62/934,012 filed on Nov. 12, 2019, and entitled "BROADBAND GUIDED STRUCTURE WITH NEAR-ZERO PERMITTIVITY, PERMEABILITY, AND REFRACTIVE INDEX" and U.S. Provisional Patent Application Ser. No. 62/970,191, filed on Feb. 5, 2020, and entitled "RECONFIGURABLE DEVICES USING EMNZ METAMATERIALS," and also claims the benefit of priority from U.S. Provisional Patent Application Ser. No. 62/980,154, filed on Feb. 22, 2020, and entitled "ANTENNAS AND ARRAYS USING EMNZ METAMATERIALS," which are all incorporated herein by reference in their entirety.

TECHNICAL FIELD

The present disclosure generally relates to metamaterials, and particularly, to microwave devices based on epsilon-and-mu-near-zero (EMNZ) metamaterials.

BACKGROUND

Metamaterials are artificial composites with physical characteristics that are not naturally available. Among physical characteristics, refractive index near-zero (INZ) characteristic is attractive to researchers and engineers because INZ metamaterials may transmit waves without altering phase of waves. As a result, a transient wave phase may remain constant when the transient wave travels in an INZ metamaterial. In other words, wavelengths of propagating waves in INZ metamaterials may tend to be infinite, making wave phase independent of waveguide dimensions and shape.

INZ metamaterials are divided into three categories: epsilon-near-zero (ENZ) metamaterials with near-zero permittivity coefficient, mu-near-zero (MNZ) metamaterials with near-zero permeability coefficient, and epsilon-and-mu-near-zero (EMNZ) metamaterials with near-zero permittivity and permeability coefficients. An application of ENZ or EMNZ metamaterials may include antenna design, where ENZ or EMNZ metamaterials are utilized for tailoring antenna radiation patterns, that is, to attain highly directive radiation patterns or enhancing a radiation efficiency. Metamaterials with near-zero parameters are also utilized for tunneling of electromagnetic energy within ultra-thin sub-wavelength ENZ channels or bends (a phenomenon referred to as super-coupling), tunneling through large volumes using MNZ structures, and to overcome weak coupling between different electromagnetic components that are conventionally not well matched, for example, for transition from a coaxial cable to a waveguide.

A permittivity and a permeability of a material may vary in different frequencies. As a result, an EMNZ metamaterial may exhibit near-zero characteristics, that is, near-zero permittivity and near-zero permeability, only in a specific frequency range. In contrast to appealing characteristics for use in microwave and antenna engineering, EMNZ metamaterials may suffer from very limited bandwidth, that is, near-zero characteristics may be attainable only in a limited frequency range, which may limit applications of EMNZ metamaterials with regards to microwave and antenna engineering. Moreover, for an EMNZ metamaterial, a frequency range with near-zero characteristics may not be adjustable, that is, a cutoff frequency of the EMNZ metamaterial may be constant. As a result, applications of the EMNZ metamaterial may be confined to a specific frequency range.

There is, therefore, a need for an EMNZ metamaterial exhibiting near-zero characteristics in a wide frequency range. There is also a need for an EMNZ metamaterial with an adjustable cutoff frequency. There is further a need for reconfigurable microwave devices such as switches, multiplexers, phase shifters, antennas, and arrays in a compact size and operating in a wide frequency range.

SUMMARY

This summary is intended to provide an overview of the subject matter of the present disclosure, and is not intended to identify essential elements or key elements of the subject matter, nor is it intended to be used to determine the scope of the claimed implementations. The proper scope of the present disclosure may be ascertained from the claims set forth below in view of the detailed description below and the drawings.

In one general aspect, the present disclosure describes an exemplary system for epsilon-and-mu-near-zero (EMNZ) metamaterial-based direct antenna modulation. An exemplary system may include a signal generator, a metamaterial switch, and an antenna. An exemplary signal generator may be configured to generate a microwave signal. An exemplary metamaterial switch may be configured to generate a modulated microwave signal from the microwave signal. An exemplary modulated microwave signal may be generated by selectively passing the microwave signal through the metamaterial switch.

An exemplary metamaterial switch may include a first conductive plate, a first loaded conductive plate, and a first magneto-dielectric material. In an exemplary embodiment, the first loaded conductive plate may include a second conductive plate and a first graphene monolayer. An exemplary second conductive plate may be parallel with the first conductive plate. In an exemplary embodiment, the first graphene monolayer may include a first tunable conductivity. In an exemplary embodiment, the first graphene monolayer may be positioned between the first conductive plate and the second conductive plate. An exemplary first magneto-dielectric material may be deposited on the first loaded conductive plate. In an exemplary embodiment, an effective permittivity of the metamaterial switch may be configured to be adjusted to a predetermined value. In an exemplary embodiment, the effective permittivity of the metamaterial switch may be adjusted responsive to tuning the first tunable conductivity.

An exemplary metamaterial switch may further include a second loaded conductive plate. An exemplary second loaded conductive plate may include a third conductive plate and a second graphene monolayer. In an exemplary embodiment, the third conductive plate may be parallel with the second conductive plate. In an exemplary embodiment, the second graphene monolayer may include a second tunable conductivity. An exemplary second tunable conductivity may be equal to the first tunable conductivity. In an exemplary embodiment, the second monolayer graphene monolayer may be positioned between the first conductive plate and the third conductive plate. An exemplary first conductive plate may be vertically positioned between the first loaded conductive plate and the second loaded conductive plate. An exemplary first conductive plate may be horizontally positioned between a respective proximal end and a respective distal end of each of the first graphene monolayer and the second graphene monolayer.

An exemplary metamaterial switch may further include a first dielectric spacer and a second dielectric spacer. In an exemplary embodiment, the first dielectric spacer may be coated on the first graphene monolayer. In an exemplary embodiment, the first dielectric spacer may be attached to the second conductive plate. In an exemplary embodiment, a thickness of the first dielectric spacer may be equal to or smaller than a quarter of a guided wavelength of the microwave signal. In an exemplary embodiment, a permittivity of the first dielectric spacer may be equal to a permittivity of the first magneto-dielectric material. In an exemplary embodiment, a permeability of the first dielectric spacer may be equal to a permeability of the first magneto-dielectric material.

In an exemplary embodiment, the second dielectric spacer may be coated on the second graphene monolayer. In an exemplary embodiment, the second dielectric spacer may be attached to the third conductive plate. In an exemplary embodiment, a thickness the second dielectric spacer may be equal to or smaller than a quarter of the guided wavelength. In an exemplary embodiment, a permittivity of the second dielectric spacer may be equal to the permittivity of the first magneto-dielectric material. In an exemplary embodiment, a permeability of the second dielectric spacer may be equal to a permeability of the first magneto-dielectric material.

In an exemplary embodiment, the metamaterial switch may be configured to selectively pass the microwave signal by being closed responsive to receiving a data bit equal to a first value and being opened responsive to receiving the data bit equal to a second value. An exemplary metamaterial switch may be configured to be closed by setting each of the first tunable conductivity and the second tunable conductivity to be larger than a conductivity threshold. In an exemplary embodiment, each of the first tunable conductivity and the second tunable conductivity may be configured to be set to be larger than the conductivity threshold by applying a first electric potential to each of the first graphene monolayer and the second graphene monolayer. An exemplary metamaterial switch may be further configured to be opened by setting each of the first tunable conductivity and the second tunable conductivity smaller than the conductivity threshold. In an exemplary embodiment, each of the first tunable conductivity and the second tunable conductivity may be configured to be set smaller than the conductivity threshold by applying a second electric potential to each of the first graphene monolayer and the second graphene monolayer.

An exemplary antenna may include one of a rectangular microstrip antenna and a dipole microstrip antenna. An exemplary rectangular microstrip antenna may include a ground plane, a second magneto-dielectric material, a first strip conductor, and a first rectangular metal patch. An exemplary ground plane may be connected to the second conductive plate. An exemplary second magneto-dielectric material may be deposited on the ground plane. An exemplary second magneto-dielectric material may be attached to the first magneto-dielectric material. In an exemplary embodiment, a permittivity of the second magneto-dielectric material may be equal to a permittivity of the first magneto-dielectric material. In an exemplary embodiment, a permeability of the second magneto-dielectric material may be equal to a permeability of the first magneto-dielectric material. An exemplary first strip conductor may be connected to the first conductive plate. An exemplary first strip conductor may be printed on the second magneto-dielectric material. An exemplary first rectangular metal patch may be connected to the first strip conductor. An exemplary first rectangular metal patch may be printed on the second magneto-dielectric material.

An exemplary dipole microstrip antenna may include a third magneto-dielectric material, a first arm, and a second arm. An exemplary third magneto-dielectric material may be attached to the first magneto-dielectric material. In an exemplary embodiment, a permittivity of the third magneto-dielectric material may be equal to a permittivity of the first magneto-dielectric material. In an exemplary embodiment, a permeability of the third magneto-dielectric material may be equal to a permeability of the first magneto-dielectric material. An exemplary first arm may include a second strip conductor and a second rectangular metal patch. In an exemplary embodiment, the second strip conductor may be connected to the first conductive plate. An exemplary second strip conductor may be printed on a top surface of the third magneto-dielectric material. An exemplary second rectangular metal patch may be connected to the second strip conductor. An exemplary second rectangular metal patch may be printed on the top surface. An exemplary second arm may include a third strip conductor and a third rectangular metal patch. An exemplary third strip conductor may be connected to the second conductive plate. An exemplary third strip conductor may be printed on a bottom surface of the third magneto-dielectric material. An exemplary third rectangular metal patch may be connected to the third strip conductor. An exemplary third rectangular metal patch may be printed on the bottom surface.

In an exemplary embodiment, the dipole microstrip antenna may further include a plurality of reflector patches and a plurality of director patches. In an exemplary embodiment, the plurality of reflector patches may be configured to reflect a radiation of the microwave signal. In an exemplary embodiment, the plurality of reflector patches may include a first reflector patch, a second reflector patch, a third reflector patch, and a fourth reflector patch. An exemplary first reflector patch may be printed on the top surface. In an exemplary embodiment, the first reflector patch may be placed on a left-side of the second strip conductor. An exemplary second reflector patch may be printed on the top surface. In an exemplary embodiment, the second reflector patch may be placed on a right-side of the second strip conductor. An exemplary third reflector patch may be printed on the bottom surface. In an exemplary embodiment, the third reflector patch may be placed on a left-side of the third strip conductor. An exemplary fourth reflector patch may be printed on the bottom surface. In an exemplary embodiment, the fourth reflector patch may be placed on a right-side of the third strip conductor. In an exemplary embodiment, the plurality of director patches may be printed on the top surface. In an exemplary embodiment, the plurality of director patches may be placed in parallel with the second rectangular metal patch. In an exemplary embodiment, the plurality of director patches may be configured to direct a radiation of the microwave signal in a plane parallel with the second rectangular metal patch.

In another general aspect, the present disclosure describes an exemplary EMNZ metamaterial-based switched-beam array antenna. In an exemplary embodiment, the EMNZ metamaterial-based switched-beam array antenna may include a plurality of antennas and a plurality of metamaterial switches. In an exemplary embodiment, the plurality of antennas may be configured to radiate a microwave signal. In an exemplary embodiment, each of the plurality of antennas may be associated with a respective direction of a plurality of directions. In an exemplary embodiment, the plurality of directions may include a predetermined direction and a direction set. In an exemplary embodiment, the plurality of metamaterial switches may include a predetermined metamaterial switch and a metamaterial switch set. In an exemplary embodiment, the plurality of metamaterial switches may be configured to direct a radiation of the microwave signal to the predetermined direction. In an exemplary embodiment, each of the plurality of metamaterial switches may be coupled with a respective antenna of the plurality of antennas. In an exemplary embodiment, the predetermined metamaterial switch may be configured to direct a radiation of the microwave signal to the predetermined direction by being closed. In an exemplary embodiment, each respective metamaterial switch in the metamaterial switch set may be configured to block the microwave signal from a respective direction in the direction set by being open.

In an exemplary embodiment, the predetermined metamaterial switch may be configured to be closed by setting each of the first tunable conductivity and the second tunable conductivity to be larger than a conductivity threshold. In an exemplary embodiment, each metamaterial switch in the metamaterial switch set may be configured to be opened by setting each of the first tunable conductivity and the second tunable conductivity smaller than the conductivity threshold. An exemplary EMNZ metamaterial-based switched-beam array antenna may further include an array feed line, a power splitter, and a plurality of antenna feed lines. In an exemplary embodiment, the power splitter may be configured to receive the microwave signal from the array feed line. In an exemplary embodiment, the plurality of antenna feed lines may be connected to the power splitter. In an exemplary embodiment, each of the plurality antenna feed lines may be configured to receive the microwave signal from the power splitter and transmit the microwave signal to a respective metamaterial switch of the plurality of metamaterial switches. In an exemplary embodiment, each of the plurality of antennas may include a dipole microstrip antenna.

In another general aspect, the present disclosure describes an exemplary EMNZ metamaterial-based phased array antenna. In an exemplary embodiment, the EMNZ metamaterial-based phased array antenna may include a plurality of metamaterial phase shifters and a plurality of antennas. In an exemplary embodiment, the plurality of metamaterial phase shifters may be configured to form a radiation pattern of a microwave signal. In an exemplary embodiment, an $m^{th}$ metamaterial phase shifter of the metamaterial phase shifters may be configured to generate an $m^{th}$ phase shifted microwave signal of a plurality of phase shifted microwave signals. In an exemplary embodiment, the $m^{th}$ phase shifted microwave signal may be generated by applying an $m^{th}$ phase shift of a plurality of phase shifts on the microwave signal where $1 \leq m \leq M$ and M is a number of the plurality of metamaterial phase shifters. In an exemplary embodiment, the plurality of phase shifts may be associated with the radiation pattern. In an exemplary embodiment, the $m^{th}$ metamaterial phase shifter may include an input line, an output line, and a plurality of transmission lines. In an exemplary embodiment, an $i^{th}$ transmission line of the plurality of transmission lines may include an $(i, k)^{th}$ metamaterial switch. In an exemplary embodiment, the $(i, k)^{th}$ metamaterial switch may be configured to apply the $m^{th}$ phase shift to the microwave signal. In an exemplary embodiment, the $m^{th}$ phase shift may be applied by routing the microwave signal from the input line to the output line through the $i^{th}$ transmission line, where $1 \leq i \leq N$, $k \in \{1,2\}$, and N is a number of the plurality of transmission lines.

An exemplary $(i, k)^{th}$ metamaterial switch may include an $(i, k)^{th}$ first conductive plate, an $(i, k)^{th}$ first loaded conductive plate, and an $(i, k)^{th}$ magneto-dielectric material. An exemplary $(i, k)^{th}$ first loaded conductive plate may include an $(i, k)^{th}$ second conductive plate and an $(i, k)^{th}$ first graphene monolayer. An exemplary $(i, k)^{th}$ second conductive plate may be parallel with the $(i, k)^{th}$ first conductive plate. An exemplary $(i, k)^{th}$ first graphene monolayer may include an $(i, k)^{th}$ first tunable conductivity. In an exemplary embodiment, the $(i, k)^{th}$ first graphene monolayer may be positioned between the $(i, k)^{th}$ first conductive plate and the $(i, k)^{th}$ second conductive plate. An exemplary $(i, k)^{th}$ magneto-dielectric material may be deposited on the $(i, k)^{th}$ first loaded conductive plate. In an exemplary embodiment, an $(i, k)^{th}$ effective permittivity of the $(i, k)^{th}$ metamaterial switch may be configured to be adjusted to an $(i, k)^{th}$ predetermined value. In an exemplary embodiment, the $(i, k)^{th}$ effective permittivity may be configured to be adjusted responsive to tuning the $(i, k)^{th}$ first tunable conductivity.

In an exemplary embodiment, the $(i, k)^{th}$ metamaterial switch may further include an $(i, k)^{th}$ second loaded conductive plate, an $(i, k)^{th}$ first dielectric spacer, and an $(i, k)^{th}$ second dielectric spacer. An exemplary $(i, k)^{th}$ second loaded conductive plate may include an $(i, k)^{th}$ third conductive plate and an $(i, k)^{th}$ second graphene monolayer. In an exemplary embodiment, the $(i, k)^{th}$ third conductive plate may be parallel with the $(i, k)^{th}$ second conductive plate. An exemplary $(i, k)^{th}$ second graphene monolayer may include an $(i, k)^{th}$ second tunable conductivity. An exemplary $(i, k)^{th}$ second tunable conductivity may be equal to the $(i, k)^{th}$ first tunable conductivity. An exemplary $(i, k)^{th}$ second graphene monolayer may be positioned between the $(i, k)^{th}$ first conductive plate and the $(i, k)^{th}$ third conductive plate.

In an exemplary embodiment, $(i, k)^{th}$ first dielectric spacer may be coated on the $(i, k)^{th}$ first graphene monolayer. An exemplary $(i, k)^{th}$ first dielectric spacer may be attached to the $(i, k)^{th}$ second conductive plate. In an exemplary embodiment, a thickness of the $(i, k)^{th}$ first dielectric spacer may be equal to or smaller than a quarter of a guided wavelength of the microwave signal. In an exemplary embodiment, a permittivity of the $(i, k)^{th}$ first dielectric spacer may be equal to a permittivity of the $(i, k)^{th}$ magneto-dielectric material. In an exemplary embodiment, permeability of the $(i, k)^{th}$ first dielectric spacer equal to a permeability of the $(i, k)^{th}$ magneto-dielectric material.

In an exemplary embodiment, $(i, k)^{th}$ second dielectric spacer may be coated on the $(i, k)^{th}$ second graphene monolayer. An exemplary $(i, k)^{th}$ second dielectric spacer may be attached to the $(i, k)^{th}$ third conductive plate. In an exemplary embodiment, a thickness of the $(i, k)^{th}$ second dielectric spacer may be equal to or smaller than a quarter of the guided wavelength. In an exemplary embodiment, a permittivity of the $(i, k)^{th}$ second dielectric spacer may be equal to a permittivity of the $(i, k)^{th}$ magneto-dielectric material. In an exemplary embodiment, permeability of the (i, k)$^{th}$ second dielectric spacer equal to a permeability of the (i, k)$^{th}$ magneto-dielectric material.

In an exemplary embodiment, the (i, k)$^{th}$ first conductive plate may be vertically positioned between the (i, k)$^{th}$ first loaded conductive plate and the (i, k)$^{th}$ second loaded conductive plate. An exemplary (i, k)$^{th}$ first conductive plate may be horizontally positioned between a respective proximal end and a respective distal end of each of the (i, k)$^{th}$ first graphene monolayer and the (i, k)$^{th}$ second graphene monolayer.

In an exemplary embodiment, the m$^{th}$ metamaterial phase shifter may be configured to route the microwave signal by closing the (i, k)$^{th}$ metamaterial switch and opening a (j, k)$^{th}$ metamaterial switch of a j$^{th}$ transmission line, where j≠i. In an exemplary embodiment, the (i, k)$^{th}$ metamaterial switch may be closed by setting each of the (i, k)$^{th}$ first tunable conductivity and the (i, k)$^{th}$ second tunable conductivity to be larger than a conductivity threshold. In an exemplary embodiment, each of the (i, k)$^{th}$ first tunable conductivity and the (i, k)$^{th}$ second tunable conductivity may be configured to be set larger than the conductivity threshold by applying a first electric potential to each of the (i, k)$^{th}$ first graphene monolayer and the (i, k)$^{th}$ second graphene monolayer.

In an exemplary embodiment, the (j, k)$^{th}$ metamaterial switch may be opened by setting each of a (j, k)$^{th}$ first tunable conductivity of a (j, k)$^{th}$ first graphene monolayer and a (j, k)$^{th}$ second tunable conductivity of a (j, k)$^{th}$ second graphene monolayer smaller than the conductivity threshold. In an exemplary embodiment, each of the (j, k)$^{th}$ first tunable conductivity and the (j, k)$^{th}$ second tunable conductivity may be configured to be set smaller than the conductivity threshold by applying a second electric potential to each of the (j, k)$^{th}$ first graphene monolayer and the (j, k)$^{th}$ second graphene monolayer.

In an exemplary embodiment, an m$^{th}$ antenna of the plurality of antennas may be configured to radiate the m$^{th}$ phase shifted microwave signal. In an exemplary embodiment, the m$^{th}$ antenna may be coupled with the m$^{th}$ metamaterial phase shifter. In an exemplary embodiment, the m$^{th}$ metamaterial phase shifter may be configured to route the microwave signal by closing the (i, k)$^{th}$ metamaterial switch and opening a (j, k)$^{th}$ metamaterial switch of a j$^{th}$ transmission line, where j≠i.

In an exemplary embodiment, the m$^{th}$ metamaterial phase shifter may further include a power splitter and a power combiner. In an exemplary embodiment, the power splitter may be configured to receive the microwave signal from the input line and transmit the microwave signal to each of the plurality of transmission lines. In an exemplary embodiment, the power combiner may be configured to receive the m$^{th}$ phase shifted microwave signal from the i$^{th}$ transmission line and transmit the m$^{th}$ phase shifted microwave signal to the output line.

In an exemplary embodiment, the i$^{th}$ transmission line may further include an i$^{th}$ delay line. An exemplary i$^{th}$ delay line may include an i$^{th}$ first delay line segment, an i$^{th}$ first transmission line bend, an i$^{th}$ second delay line segment, an i$^{th}$ second transmission line bend, an i$^{th}$ third delay line segment. In an exemplary embodiment, the i$^{th}$ first transmission line bend may be connected to the i$^{th}$ first delay line segment. An exemplary i$^{th}$ second delay line segment may be connected to the i$^{th}$ first transmission line bend. An exemplary i$^{th}$ second transmission line bend may be connected to the i$^{th}$ second delay line segment. An exemplary i$^{th}$ third delay line segment may be connected to the i$^{th}$ second transmission line bend.

In another general aspect, the present disclosure describes an exemplary EMNZ metamaterial-based leaky-wave antenna. An exemplary EMNZ metamaterial-based leaky-wave antenna may include a first conductive plate, a first loaded conductive plate, and a magneto-dielectric material. In an exemplary embodiment, the first loaded conductive plate may include a second conductive plate and a first tunable impedance surface set. An exemplary second conductive plate may be parallel with the first conductive plate. In an exemplary embodiment, each tunable impedance surface in the first tunable impedance surface set may include a respective tunable conductivity. In an exemplary embodiment, the first tunable impedance surface set may be positioned between the first conductive plate and the second conductive plate. In an exemplary embodiment, a length $l_i$ of an i$^{th}$ tunable impedance surface in the first tunable impedance surface set may satisfy a length condition according to $$l_i \geq \frac{\lambda}{2}$$

where 1≤i≤N−1, N is a size of the first tunable impedance surface set, and λ is an operating wavelength of the EMNZ metamaterial-based leaky-wave antenna. An exemplary magneto-dielectric material may be deposited on the first loaded conductive plate. In an exemplary embodiment, an effective permittivity of the EMNZ metamaterial-based leaky-wave antenna may be configured to be adjusted to a first predetermined value. In an exemplary embodiment, the effective permittivity of the EMNZ metamaterial-based leaky-wave antenna may be adjusted responsive to tuning a respective tunable conductivity of each respective tunable impedance surface in the first tunable impedance surface set.

An exemplary EMNZ metamaterial-based leaky-wave antenna may be configured to be radiate a microwave signal by setting a respective tunable conductivity of each tunable impedance surface in the first tunable impedance surface set to be larger than a conductivity threshold. In an exemplary embodiment, a frequency of the microwave signal may be equal to an operating frequency of the EMNZ metamaterial-based leaky-wave antenna.

An exemplary EMNZ metamaterial-based leaky-wave antenna may further include a second loaded conductive plate. An exemplary second loaded conductive plate may include a third conductive plate and a second tunable impedance surface set. In an exemplary embodiment, the third conductive plate may be parallel with the second conductive plate. In an exemplary embodiment, each tunable impedance surface in the second tunable impedance surface set may include a respective tunable conductivity. In an exemplary embodiment, the second tunable impedance surface set may be positioned between the first conductive plate and the third conductive plate. In an exemplary embodiment, a length of each tunable impedance surface in the second tunable impedance surface set may be equal to a length of a respective tunable impedance surface in the first tunable impedance surface set. An exemplary first conductive plate may be positioned between the first loaded conductive plate and the second loaded conductive plate. In an exemplary embodiment, the effective permittivity of the EMNZ metamaterial-based leaky-wave antenna is configured to be adjusted to a second predetermined value. In an exemplary embodiment, the effective permittivity of the EMNZ metamaterial-based leaky-wave antenna may be adjusted responsive to tuning a respective tunable conductivity of each respective tunable impedance surface in the second tunable impedance surface set.

In an exemplary embodiment, a respective tunable conductivity of each tunable impedance surface in the second tunable impedance surface set may be equal to a respective tunable conductivity of each respective tunable impedance surface in the first tunable impedance surface set.

In an exemplary embodiment, each tunable impedance surface in the first tunable impedance surface set may include a respective graphene monolayer of a graphene monolayer set. In an exemplary embodiment, each tunable impedance surface in the second tunable impedance surface set may include a respective graphene monolayer of the graphene monolayer set.

In an exemplary embodiment, a respective tunable conductivity of each tunable impedance surface in each of the first tunable impedance surface set and the second tunable impedance surface set may be configured to be set larger than the conductivity threshold by applying a first electric potential to each respective graphene monolayer in the graphene monolayer set.

An exemplary EMNZ metamaterial-based leaky-wave antenna may further include a first dielectric spacer set and a second dielectric spacer set. In an exemplary embodiment, each dielectric spacer in the first dielectric spacer set may be coated on a respective graphene monolayer in the graphene monolayer set. In an exemplary embodiment, each dielectric spacer in the first dielectric spacer set may be attached to the second conductive plate. In an exemplary embodiment, a thickness of each dielectric spacer in the first dielectric spacer set may be equal to or smaller than a quarter of an operating wavelength of the EMNZ metamaterial-based leaky-wave antenna. In an exemplary embodiment, a permittivity of each dielectric spacer in the first dielectric spacer set may be equal to a permittivity of the magneto-dielectric material. In an exemplary embodiment, a permeability of each dielectric spacer in the first dielectric spacer set may be equal to a permeability of the magneto-dielectric material.

In an exemplary embodiment, each dielectric spacer in the second dielectric spacer set may be coated on a respective graphene monolayer in the graphene monolayer set. In an exemplary embodiment, each dielectric spacer in the second dielectric spacer set may be attached to the third conductive plate. In an exemplary embodiment, a thickness of each dielectric spacer in the second dielectric spacer set may be equal to or smaller than a quarter of the operating wavelength. In an exemplary embodiment, a permittivity of each dielectric spacer in the second dielectric spacer set may be equal to the permittivity of the magneto-dielectric material. In an exemplary embodiment, a permeability of each dielectric spacer in the second dielectric spacer set may be equal to a permeability of the magneto-dielectric material.

In an exemplary embodiment, a length of each impedance surface in each of the first tunable impedance surface set and the second tunable impedance surface set may satisfy one of a first length condition, a second length condition, a third length condition, and a fourth length condition. An exemplary first length condition may include $l_i < l_{i+1}$, where $l_i$ is a length of an $i^{th}$ tunable impedance surface in each of the first tunable impedance surface set and the second tunable impedance surface set, $1 \leq i \leq N-1$, and N is a size of each of the first tunable impedance surface set and the second tunable impedance surface set. An exemplary second length condition may include $l_j > l_{j+1}$. An exemplary third length condition may include $l_j < l_{j+1}$ and $$l_{\left\lfloor \frac{N+1}{2}+k \right\rfloor} = l_{\left\lfloor \frac{N+1}{2}-k \right\rfloor},$$

where $$1 \leq j \leq \left\lceil \frac{N}{2} \right\rceil, 1 \leq k \leq \left\lfloor \frac{N}{2} \right\rfloor,$$

$\lfloor \cdot \rfloor$ is a floor operator, and $\lceil \cdot \rceil$ is a ceiling operator. An exemplary fourth length condition may include $l_j > l_{j+1}$ and $$l_{\left\lfloor \frac{N+1}{2}+k \right\rfloor} = l_{\left\lfloor \frac{N+1}{2}-k \right\rfloor}.$$

An exemplary first conductive plate is positioned between a respective proximal end and a respective distal end of each respective tunable impedance surface in each of the first tunable impedance surface set and the second tunable impedance surface set.

Other exemplary systems, methods, features and advantages of the implementations will be, or will become, apparent to one of ordinary skill in the art upon examination of the following figures and detailed description. It is intended that all such additional systems, methods, features and advantages be included within this description and this summary, be within the scope of the implementations, and be protected by the claims herein.

BRIEF DESCRIPTION OF THE DRAWINGS

The drawing figures depict one or more implementations in accord with the present teachings, by way of example only, not by way of limitation. In the figures and in the detail description, like reference numerals refer to the same or similar elements.

DETAILED DESCRIPTION OF THE INVENTION

Figure 1A:
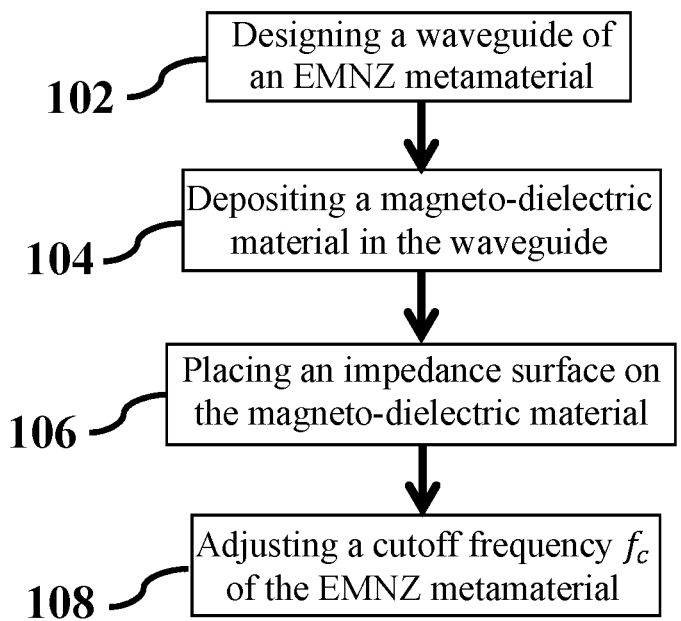
FIG. 1A shows a flowchart of a method for adjusting a cutoff frequency $f_c$ of an epsilon-and-mu-near-zero (EMNZ) metamaterial, consistent with one or more exemplary embodiments of the present disclosure.

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings.

The following detailed description is presented to enable a person skilled in the art to make and use the methods and devices disclosed in exemplary embodiments of the present disclosure. For purposes of explanation, specific nomenclature is set forth to provide a thorough understanding of the present disclosure. However, it will be apparent to one skilled in the art that these specific details are not required to practice the disclosed exemplary embodiments. Descriptions of specific exemplary embodiments are provided only as representative examples. Various modifications to the exemplary implementations will be readily apparent to one skilled in the art, and the general principles defined herein may be applied to other implementations and applications without departing from the scope of the present disclosure. The present disclosure is not intended to be limited to the implementations shown, but is to be accorded the widest possible scope consistent with the principles and features disclosed herein.

Herein is disclosed an exemplary epsilon-and-mu-near-zero (EMNZ) metamaterial. Herein is also disclosed an exemplary method for adjusting a cutoff frequency of an exemplary EMNZ metamaterial. An exemplary EMNZ metamaterial may include a waveguide with a small length compared with an operating wavelength. At frequencies smaller than an exemplary cutoff frequency of the waveguide, an insertion loss of the waveguide may be negligible while the waveguide may exhibit near-zero characteristics. Some waveguide structures such as parallel-plate waveguides may not include a cutoff frequency, that is, a minimum frequency of an exemplary electromagnetic wave that may pass through a waveguide. As a result, parallel plate waveguides may not exhibit near-zero characteristics. In an exemplary embodiment, "near-zero characteristics" may refer to near-zero permittivity and near-zero permeability. Utilizing an impedance surface in a waveguide may change a propagation mode to a transverse magnetic (TM) propagation mode. As a result, a waveguide with an impedance surface may introduce a cutoff frequency. Therefore, utilizing an impedance surface, near-zero characteristics may be obtained in various waveguide structures.

A cutoff frequency may depend on geometric properties of a waveguide. As a result, a cutoff frequency of an exemplary EMNZ metamaterial constructed by a waveguide may be constant. To make the cutoff frequency adjustable, a tunable impedance surface may be utilized instead of a simple impedance surface. An exemplary tunable impedance surface may include an adjustable conductivity. Therefore, a cutoff frequency of the EMNZ metamaterial may be adjusted by adjusting a conductivity of a tunable impedance surface. An exemplary graphene monolayer may exhibit an appreciable impedance at Terahertz, visible light, and GHz frequency ranges. As a result, an exemplary graphene monolayer may be utilized as a tunable impedance surface. However, to benefit from using a graphene monolayer, the graphene monolayer may be separated from an upper wall of the waveguide by a dielectric spacer to avoid a short circuit.

A number of microwave devices such as switches, multiplexers, and phase shifters may be implemented utilizing adjustability of an exemplary EMNZ metamaterial. An insertion loss of an EMNZ metamaterial in frequencies larger than a cutoff frequency of the EMNZ metamaterial may be negligible. An exemplary cutoff frequency of the EMNZ metamaterial may be increased utilizing adjustability of an EMNZ metamaterial. As a result, an insertion loss of the EMNZ metamaterial may be very high in frequencies smaller than an increased cutoff frequency of the EMNZ metamaterial. Therefore, an insertion loss of an EMNZ metamaterial may be adjusted by adjusting a cutoff frequency of the EMNZ metamaterial.

Adjustability of an insertion loss of an EMNZ metamaterial may pave a way for implementation of a microwave switch. An EMNZ metamaterial may be regarded as a metamaterial switch and may be configured to be opened and closed by adjusting a cutoff frequency of the EMNZ metamaterial. Moreover, a multiplexer may be implemented utilizing a number of transmission lines, such as microstrips and striplines, that are controllable by a number of switches. Therefore, metamaterial switches may be implemented utilizing metamaterial switches. Moreover, a phase shifter may be implemented utilizing a number of transmission lines with various delay lines and controlling an output of each transmission line by a switch. As a result, a phase shifter may also be implemented by a metamaterial switch.

Exemplary EMNZ metamaterial-based devices such as switches and phase shifters may facilitate implementation of EMNZ metamaterial-based antennas and arrays. An exemplary metamaterial switch may be conveniently integrated in a direct antenna modulation system. As a result, an on-off key modulated microwave signal may be directly transmitted via an antenna by integrating a metamaterial switch and selectively closing and opening the metamaterial switch to selectively pass a microwave signal. In addition, metamaterial phase shifters may be integrated with an exemplary antenna array and may constitute a phased array antenna. An exemplary metamaterial leaky-wave antenna may also be implemented by adjusting sizes of a metamaterial switch dimensions to a set of values that simultaneously provide small values of return loss and insertion loss of the metamaterial switch. As a result, a metamaterial switch with adjusted dimension sizes may perform as a leaky-wave antenna.

FIG. 1A shows a flowchart of a method for adjusting a cutoff frequency $f_c$ of an EMNZ metamaterial, consistent with one or more exemplary embodiments of the present disclosure. In an exemplary embodiment, a method 100 may include designing a waveguide of an EMNZ metamaterial (step 102), depositing a magneto-dielectric material (step 104), placing an impedance surface on the magneto-dielectric material (step 106), and adjusting a cutoff frequency $f_c$ of the EMNZ metamaterial (step 108). In an exemplary embodiment, method 100 may be utilized to design an EMNZ metamaterial based on a waveguide. In an exemplary embodiment, method 100 may be further utilized for adjusting a cutoff frequency of the EMNZ metamaterial.

Figure 2A:
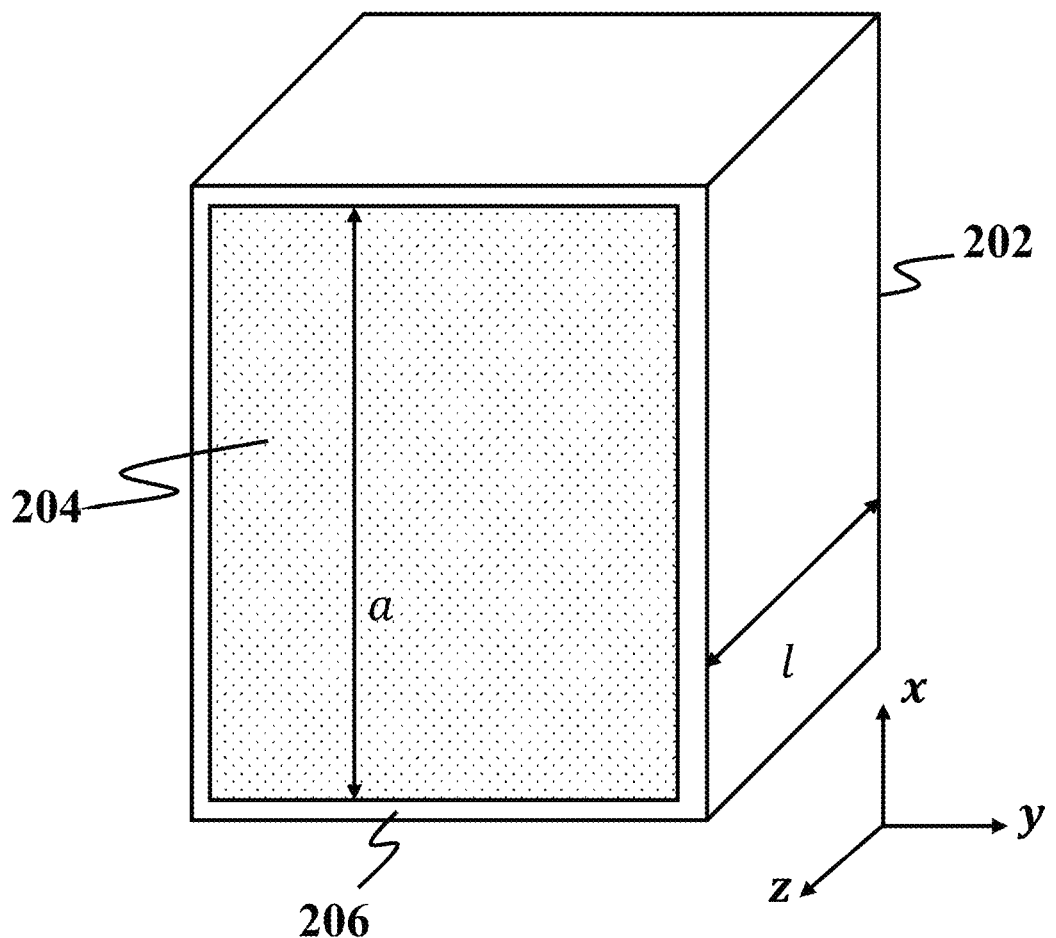
FIG. 2A shows a schematic of an EMNZ metamaterial, consistent with one or more exemplary embodiments of the present disclosure.

FIG. 2A shows a schematic of an EMNZ metamaterial, consistent with one or more exemplary embodiments of the present disclosure. In an exemplary embodiment, different steps of method 100 in FIG. 1A may be implemented utilizing an EMNZ metamaterial 200. In an exemplary embodiment, EMNZ metamaterial 200 may include a waveguide 202 and a magneto-dielectric material 204.

In an exemplary embodiment, step 102 in FIG. 1A may include designing waveguide 202 by determining a length l of waveguide 202. In an exemplary embodiment, length l may be determined based on a length condition defined by l≤0.1λ, where λ is an operating wavelength of EMNZ metamaterial 200. In an exemplary embodiment, length l may refer to a length of a path that a wave may travel in waveguide 202, that is, a length of waveguide 202 along the z direction. In an exemplary embodiment, an ability of waveguide 202 for passing a wave may depend on a size of a cross-section of waveguide 202 and a wavelength of the wave. In an exemplary embodiment, when a wavelength of a wave is larger than a threshold, an insertion loss of waveguide 202 may be very large, that is, the wave may not pass through waveguide 202. An exemplary threshold may refer to a "cutoff wavelength" (or consistently, a "cutoff frequency") of waveguide 202. On the other hand, in an exemplary embodiment, an effective permittivity and an effective permeability of waveguide 202 may be near-zero in frequencies smaller than the cutoff frequency. As a result, waveguide 202 may act as an EMNZ metamaterial in frequencies smaller than the cutoff frequency. However, an energy of an exemplary wave with a frequency smaller than the cutoff frequency may be significantly decreased due to high insertion loss. An exemplary insertion loss of waveguide 202 for frequencies smaller than the cutoff frequency may depend on length 1, that is, the insertion loss may be larger for larger values of length 1. As a result, in an exemplary embodiment, when length 1 is very small compared with a wavelength of a passing wave, the insertion loss may become small and the passing wave may pass through waveguide 202 without a significant energy dissipation. As a result, in an exemplary embodiment, waveguide 202 with a small length, that is l≤0.1λ, may act as an EMNZ metamaterial at frequencies smaller than the cutoff frequency.

Figure 2B:
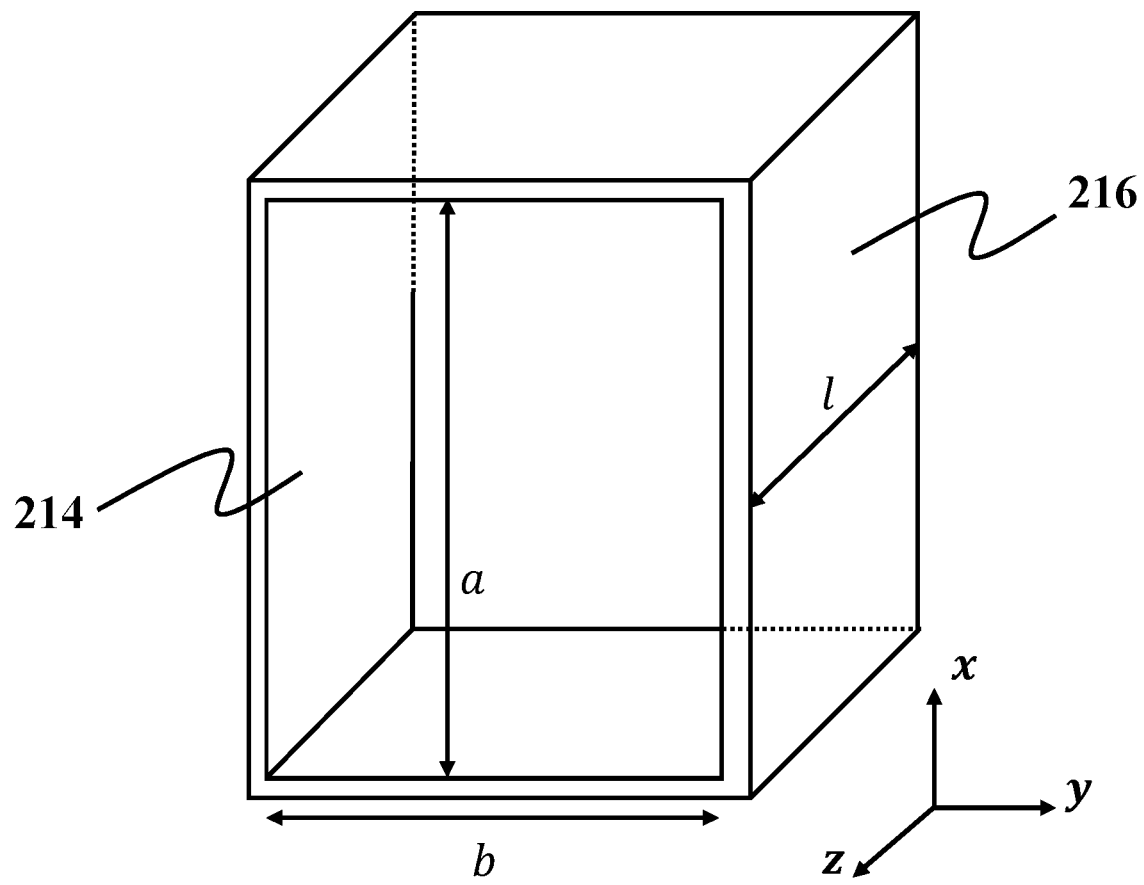
FIG. 2B shows a schematic of a rectangular waveguide, consistent with one or more exemplary embodiments of the present disclosure.
Figure 2C:
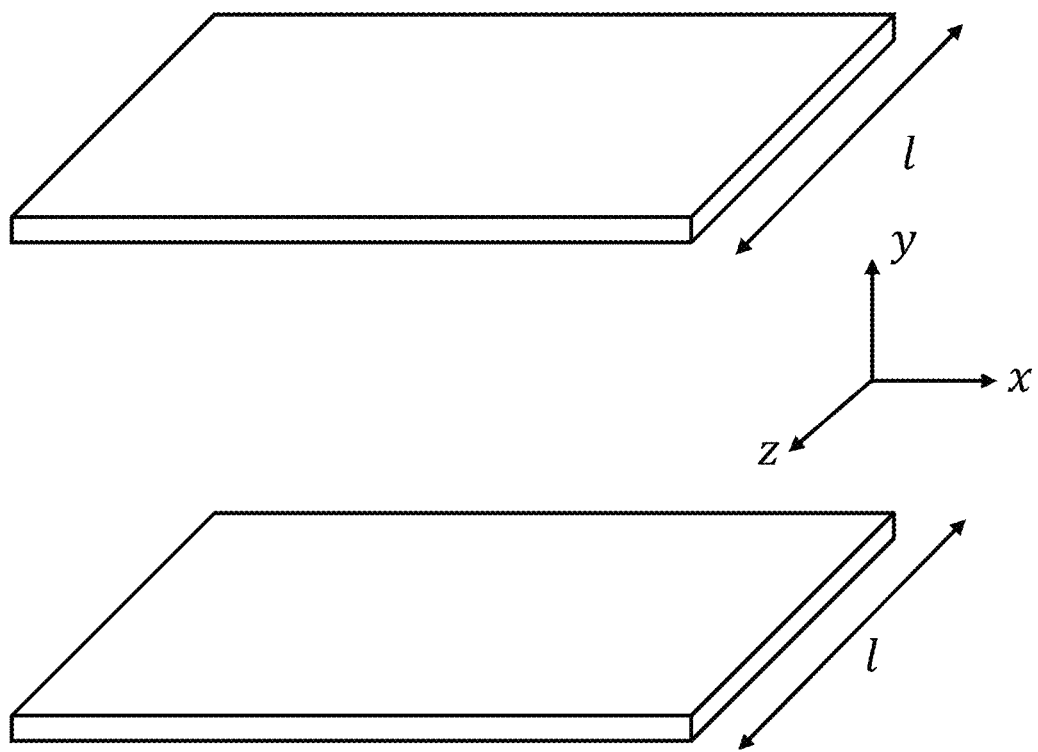
FIG. 2C shows a schematic of a parallel-plate waveguide, consistent with one or more exemplary embodiments of the present disclosure.

FIG. 2B shows a schematic of a rectangular waveguide, consistent with one or more exemplary embodiments of the present disclosure. FIG. 2C shows a schematic of a parallel-plate waveguide, consistent with one or more exemplary embodiments of the present disclosure. Referring to FIGS. 2A-2C, in an exemplary embodiment, designing waveguide 202 in step 102 in FIG. 1A may include designing one of a rectangular waveguide 202A and a parallel-plate waveguide 202B. In an exemplary embodiment, rectangular waveguide 202A in FIG. 2B may include a first implementation of waveguide 202. In an exemplary embodiment, parallel-plate waveguide 202B in FIG. 2C may include a second implementation of waveguide 202. In an exemplary embodiment, parallel-plate waveguide 202B may be infinitely extended in the x direction.

In an exemplary embodiment, as shown in FIG. 2A, step 104 in FIG. 1A may include depositing magneto-dielectric material 204. In an exemplary embodiment, magneto-dielectric material 204 may be deposited on a lower wall 206 of waveguide 202 by deposition techniques such as chemical deposition and physical deposition. In an exemplary embodiment, chemical deposition may cause a chemical change in a fluid on a solid surface, resulting in a solid layer. In an exemplary embodiment, physical deposition may utilize mechanical, electromechanical or thermodynamic means to produce a solid layer. In an exemplary embodiment, waveguide 202 may be filled by depositing magneto-dielectric material 204. In an exemplary embodiment, a cutoff frequency of waveguide 202 may depend on a permittivity and a permeability of magneto-dielectric material 204. In an exemplary embodiment, as shown in FIG. 2B, a cutoff frequency of rectangular waveguide 202A may be given according to an operation defined by:

$$f_c = \frac{1}{2d\sqrt{\mu_0 \epsilon}} \quad \text{Equation (1)}$$

where d=max {a, b}, a is a height of rectangular waveguide 202A, b is a width of rectangular waveguide 202A, $\mu_0$ is a permeability of free space, and E is a permittivity of magneto-dielectric material 204.

Figure 2D:
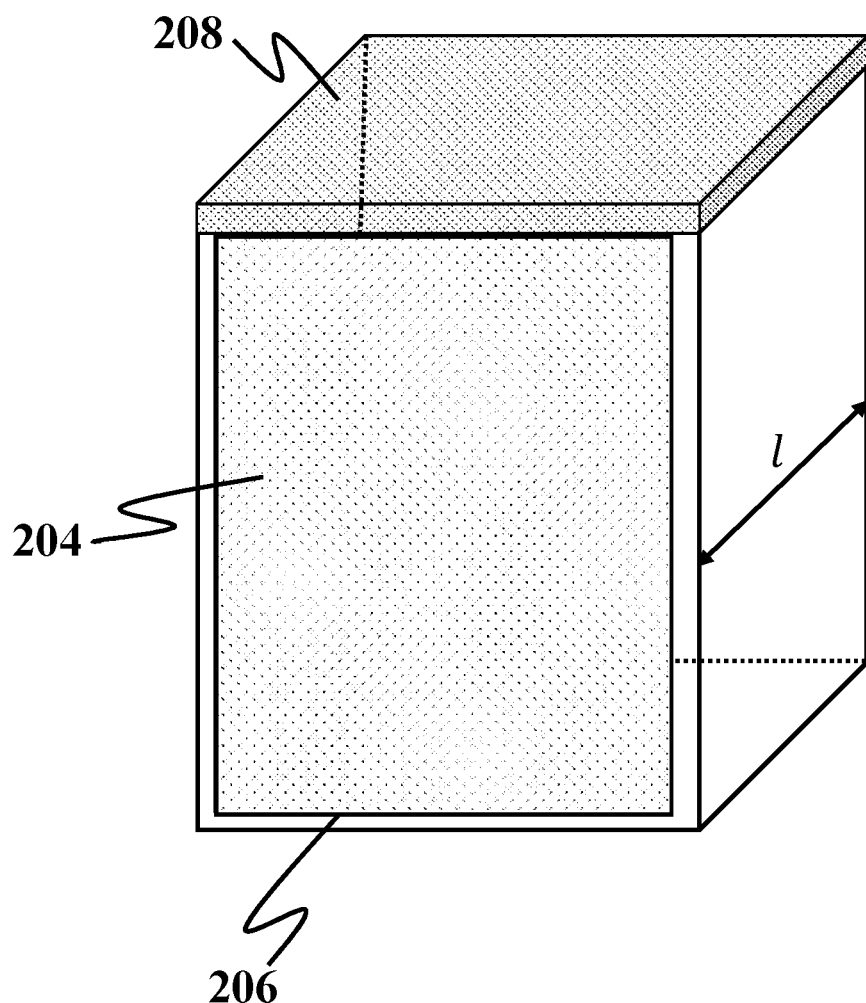
FIG. 2D shows a schematic of an impedance surface waveguide, consistent with one or more exemplary embodiments of the present disclosure.

FIG. 2D shows a schematic of an impedance surface waveguide, consistent with one or more exemplary embodiments of the present disclosure. In an exemplary embodiment, an impedance surface waveguide 202C may include a third implementation of waveguide 202. In an exemplary embodiment, impedance surface waveguide 202C may include an impedance surface 208.

In an exemplary embodiment, as shown in FIG. 2D, step 106 in FIG. 1A may include placing impedance surface 208 on magneto-dielectric material 204. In an exemplary embodiment, impedance surface 208 may operate as an upper wall of impedance surface waveguide 202C. In an exemplary embodiment, placing impedance surface 208 may change a transverse electric (TE) propagation mode in waveguide 202 in FIG. 2A to a TM propagation mode in impedance surface waveguide 202C in FIG. 2D.

Figure 2E:
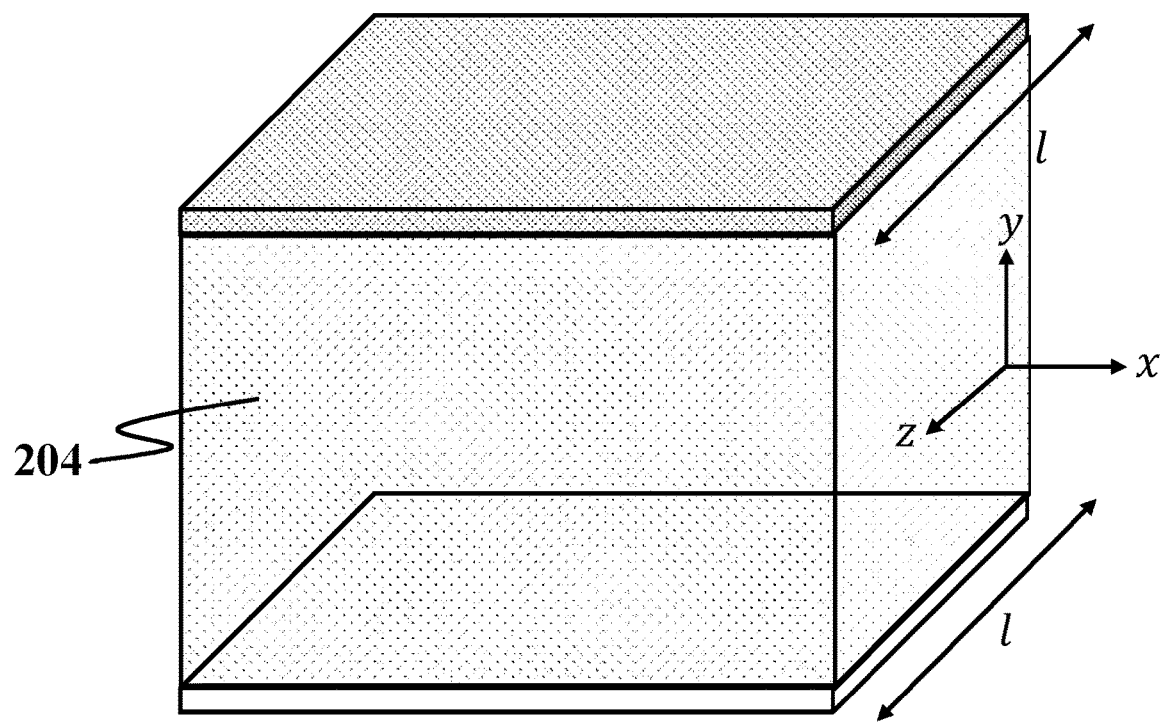
FIG. 2E shows a schematic of an impedance surface parallel-plate waveguide, consistent with one or more exemplary embodiments of the present disclosure.

FIG. 2E shows a schematic of an impedance surface parallel-plate waveguide, consistent with one or more exemplary embodiments of the present disclosure. In an exemplary embodiment, an impedance surface parallel-plate waveguide 202D may be obtained by placing an impedance surface on magneto-dielectric material 204. In an exemplary embodiment, impedance surface parallel-plate waveguide 202D may be an exemplary implementation of parallel-plate waveguide 202B in FIG. 2C. In an exemplary embodiment, parallel-plate waveguide 202B may not include a cutoff frequency in a dominant transverse electromagnetic (TEM) propagation mode. In an exemplary embodiment, placing impedance surface 208 may change a propagation mode of a passing wave in parallel-plate waveguide 202B in FIG. 2C to a TM propagation mode in impedance surface parallel-plate waveguide 202D in FIG. 2E. As a result, a cutoff frequency may be introduced for a dominant TM propagation mode in impedance surface parallel-plate waveguide 202D and impedance surface parallel-plate waveguide 202D may operate as an EMNZ metamaterial in frequencies smaller than the cutoff frequency.

Figure 3A:
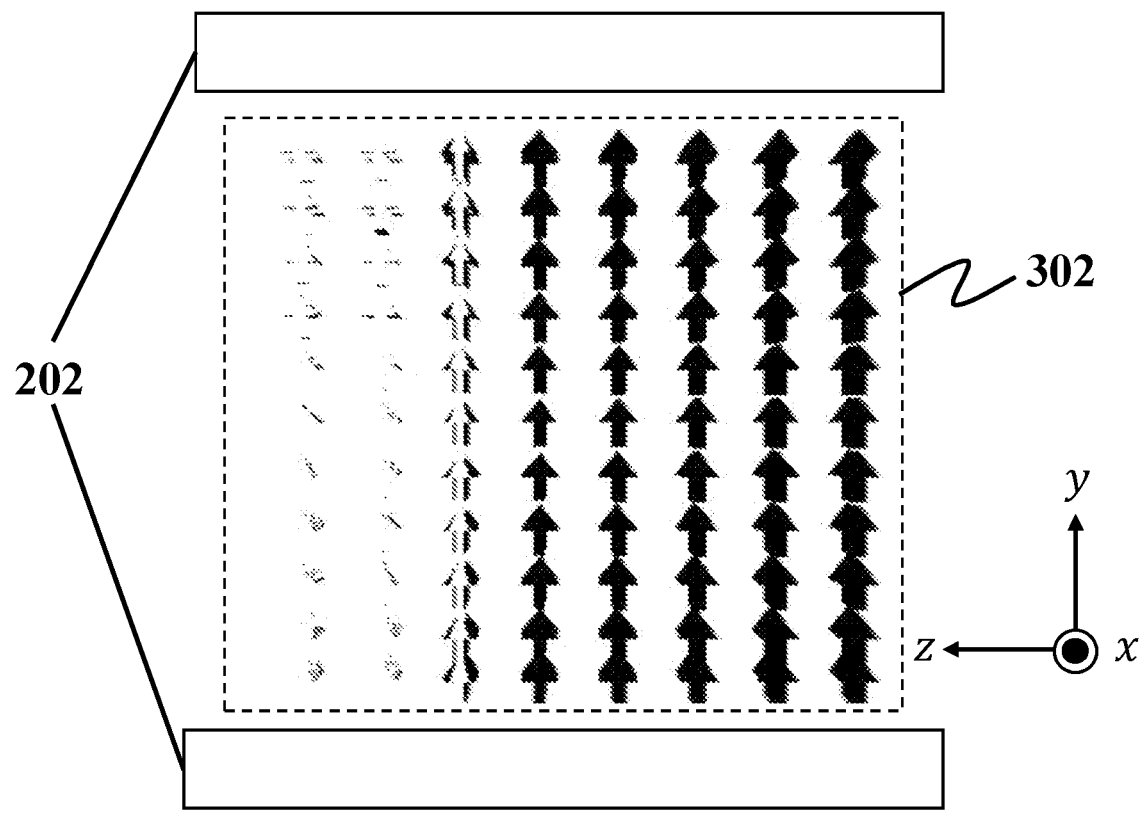
FIG. 3A shows an electric field in a side view of a waveguide, consistent with one or more exemplary embodiments of the present disclosure.

FIG. 3A shows an electric field in a side view of a waveguide, consistent with one or more exemplary embodiments of the present disclosure. In an exemplary embodiment, a first electric field 302 of a passing wave in waveguide 202 may be perpendicular to a direction of propagation, that is, z direction (first electric field 302 is more intense in points with darker electric field arrows). An exemplary passing wave may include a TE propagation mode in waveguide 202 with a cutoff frequency according to Equation (1).

Figure 3B:
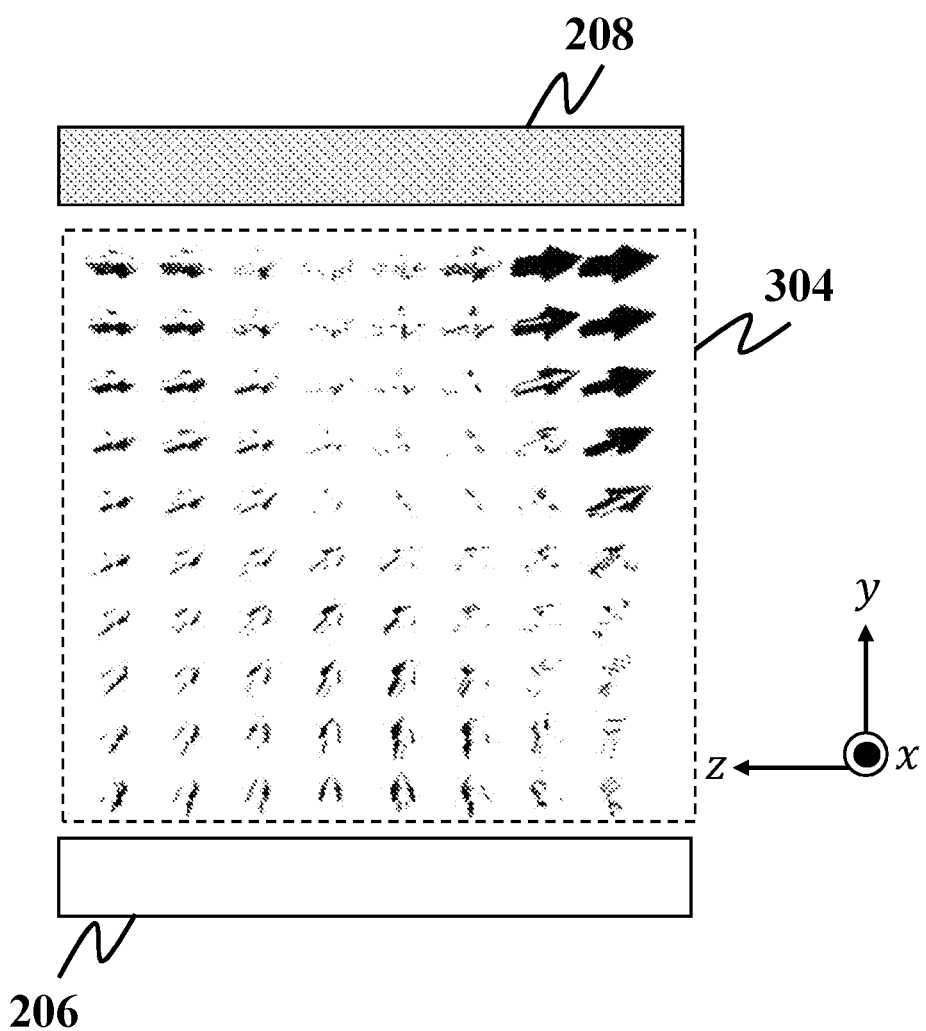
FIG. 3B shows an electric field in a side view of an impedance surface waveguide, consistent with one or more exemplary embodiments of the present disclosure.

FIG. 3B shows an electric field in a side view of an impedance surface waveguide, consistent with one or more exemplary embodiments of the present disclosure. In an exemplary embodiment, placing impedance surface 208 may impose an impedance boundary condition on a passing wave through impedance surface waveguide 202C (shown from a side view in FIG. 2D). As a result, in an exemplary embodiment, a second electric field 304 of a passing wave in impedance surface waveguide 202C may be parallel with impedance surface 208 (second electric field 304 is more intense in points with darker electric field arrows). In an exemplary embodiment, second electric field 304 may not be perpendicular to z direction. In an exemplary embodiment, second electric field 304 may show an electric field of a passing wave in a TM propagation mode. As a result, in an exemplary embodiment, placing impedance surface 208 may change a propagation mode from a TE propagation mode to a TM propagation mode.

Referring again to FIGS. 1A and 2A, in an exemplary embodiment, placing impedance surface 208 in step 106 in FIG. 1A may include placing a tunable impedance surface. An exemplary tunable impedance surface may include a tunable conductivity. An exemplary tunable impedance surface may include an artificial structure imposing an impedance boundary condition on a passing wave. Moreover, a tunable impedance surface may be electrically tuned to exhibit different values of surface impedances. An exemplary tunable impedance surface may be tuned by applying an electric potential to the tunable impedance surface. In an exemplary embodiment, a desired surface impedance of the tunable impedance surface may be obtained by applying an electric potential related to the desired surface impedance. In an exemplary embodiment, a relation between different electric potential values and resulting surface impedances of the tunable impedance surface may be obtained empirically. In an exemplary embodiment, by tuning the tunable impedance surface to each value of surface impedance a respective cutoff frequency of EMNZ metamaterial 200 may be obtained. As a result, in an exemplary embodiment, a cutoff frequency of EMNZ metamaterial 200 may be adjusted by tuning the tunable impedance surface to exhibit a respective surface impedance to the cutoff frequency. In an exemplary embodiment, a relation between different values of surface impedances and respective cutoff frequencies for each surface impedance may be obtained empirically.

Figure 1B:
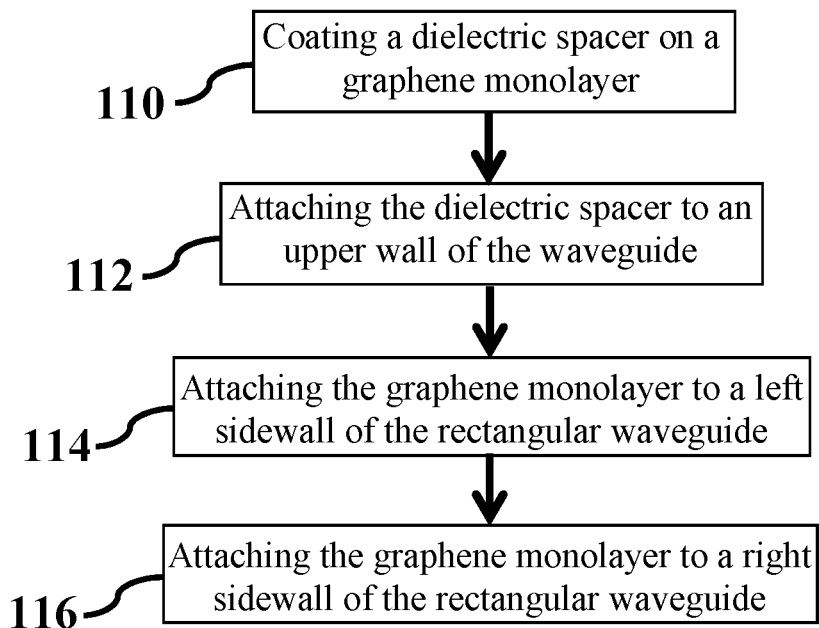
FIG. 1B shows a flowchart of a method for placing a graphene monolayer on a magneto-dielectric material, consistent with one or more exemplary embodiments of the present disclosure.

FIG. 1B shows a flowchart of a method for placing a graphene monolayer on a magneto-dielectric material, consistent with one or more exemplary embodiments of the present disclosure. Specifically, FIG. 1B shows exemplary details of step 106 in FIG. 1A. In an exemplary embodiment, placing the tunable impedance surface on magneto-dielectric material 204 may include placing a graphene monolayer on magneto-dielectric material 204. In an exemplary embodiment, placing the graphene monolayer may include coating a dielectric spacer on the graphene monolayer (step 110), attaching the dielectric spacer to an upper wall of a graphene-loaded waveguide (step 112), attaching graphene monolayer 210 to a left sidewall of the rectangular waveguide (step 114), and attaching graphene monolayer 210 to a right sidewall of the rectangular waveguide (step 116).

Figure 2F:
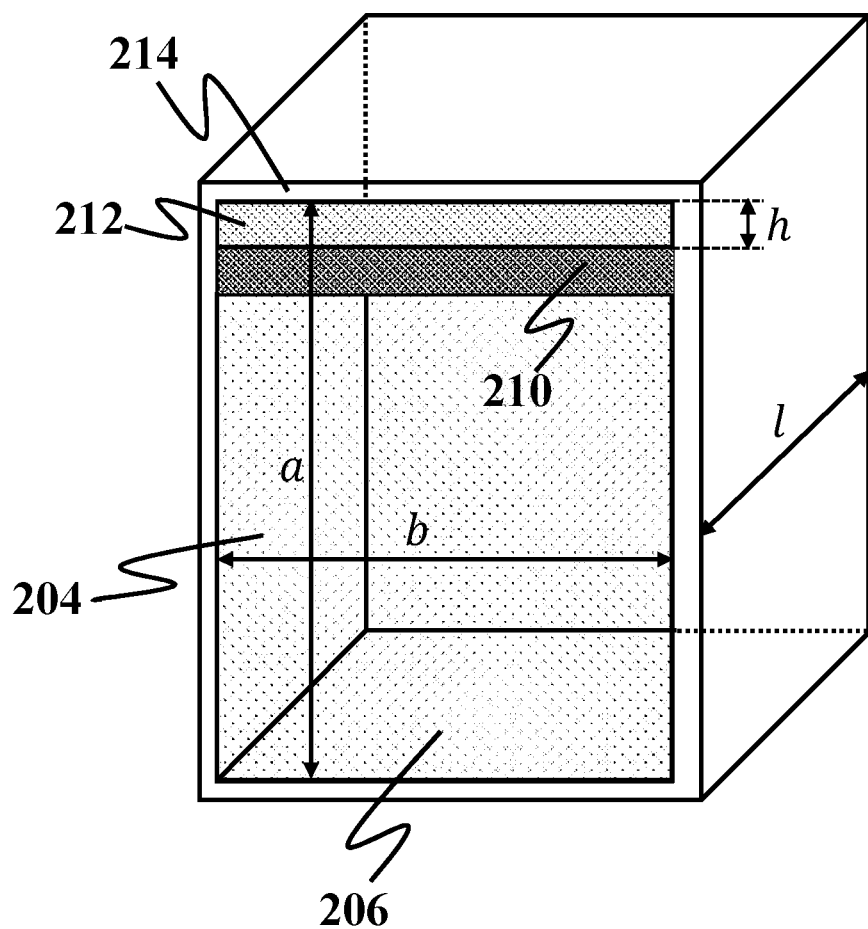
FIG. 2F shows a schematic of a graphene-loaded waveguide, consistent with one or more exemplary embodiments of the present disclosure.

FIG. 2F shows a schematic of a graphene-loaded waveguide, consistent with one or more exemplary embodiments of the present disclosure. In an exemplary embodiment, a graphene-loaded waveguide 202E may include a fourth implementation of waveguide 202. In an exemplary embodiment, different steps of flowchart 106 in FIG. 1B may be implemented utilizing graphene-loaded waveguide 202E. In an exemplary embodiment, graphene-loaded waveguide 202E may include a graphene monolayer 210 and a dielectric spacer 212. In an exemplary embodiment, a permittivity of dielectric spacer 212 may be equal to a permittivity $\epsilon$ of magneto-dielectric material 204. In an exemplary embodiment, a permeability of dielectric spacer 212 may be equal to a permeability $\mu$ of magneto-dielectric material 204. In an exemplary embodiment, graphene monolayer 210 may exhibit various surface impedances in different frequency bands. In an exemplary embodiment, a surface impedance of graphene monolayer 210 may change a propagation mode to a TM propagation mode in various frequency bands including visible light, terahertz, and gigahertz frequency bands. As a result, graphene-loaded waveguide 202E may exhibit EMNZ characteristic in visible light, terahertz, and gigahertz frequency bands. In an exemplary embodiment, a surface impedance of graphene monolayer 210 may depend on a value of a chemical potential of graphene monolayer 210. As a result, a surface impedance of graphene monolayer 210 may be adjusted by adjusting a chemical potential of graphene monolayer. In an exemplary embodiment, a chemical potential of graphene monolayer 210 may depend on an electric potential applied to graphene monolayer 210. As a result, an exemplary chemical potential of graphene monolayer 210 may be adjusted by adjusting an electric potential applied to graphene monolayer 210. An exemplary electric potential applied to graphene monolayer may include a direct current (DC) electric potential. In an exemplary embodiment, graphene monolayer 210 may exhibit a specific surface impedance by applying a respective electric potential to graphene monolayer 210. An exemplary electric potential may be applied to graphene monolayer 210 by connecting graphene monolayer 210 to a DC power supply node. In an exemplary embodiment, graphene monolayer 210 may include a single atomic layer of graphite. In an exemplary embodiment, when a thickness of graphene monolayer 210 is large, graphene monolayer 210 may turn to a graphene plasmon. As a result, graphene monolayer 210 may not impose an impedance surface boundary condition on a passing wave in graphene-loaded waveguide 202E, and consequently, graphene-loaded waveguide 202E may not exhibit EMNZ characteristics.

Referring again to FIGS. 1B and 2F, in an exemplary embodiment, step 110 in FIG. 1B may include coating a dielectric spacer 212 on a graphene monolayer 210. In an exemplary embodiment, coating dielectric spacer 212 may include determining a thickness h (FIG. 2F) of dielectric spacer 212. In an exemplary embodiment, the thickness h (FIG. 2F) may be determined based on a thickness condition defined by $$h \le \frac{\lambda}{4}.$$

In an exemplary embodiment, when thickness h is large compared with operating wavelength λ, a combination of graphene monolayer 210 and dielectric spacer 212 may not impose an impedance surface boundary condition, and consequently, a propagation mode may not change to a TM mode. As a result, in an exemplary embodiment, graphene-loaded waveguide 202E may not exhibit EMNZ characteristics.

In an exemplary embodiment, step 112 in FIG. 1B may include directly attaching dielectric spacer 212 to an upper wall 214 of graphene-loaded waveguide 202E in FIG. 2F. As a result, in an exemplary embodiment, dielectric spacer 212 may be positioned between upper wall 214 and graphene monolayer 210. Otherwise, in an exemplary embodiment, graphene monolayer 210 may be short-circuited with upper wall 214. As a result, graphene monolayer 210 may not impose an impedance surface boundary condition on a passing wave in graphene-loaded waveguide 202E. In an exemplary embodiment, dielectric spacer 212 may avoid graphene monolayer 210 to be short-circuited with upper wall 214.

Figure 2G:
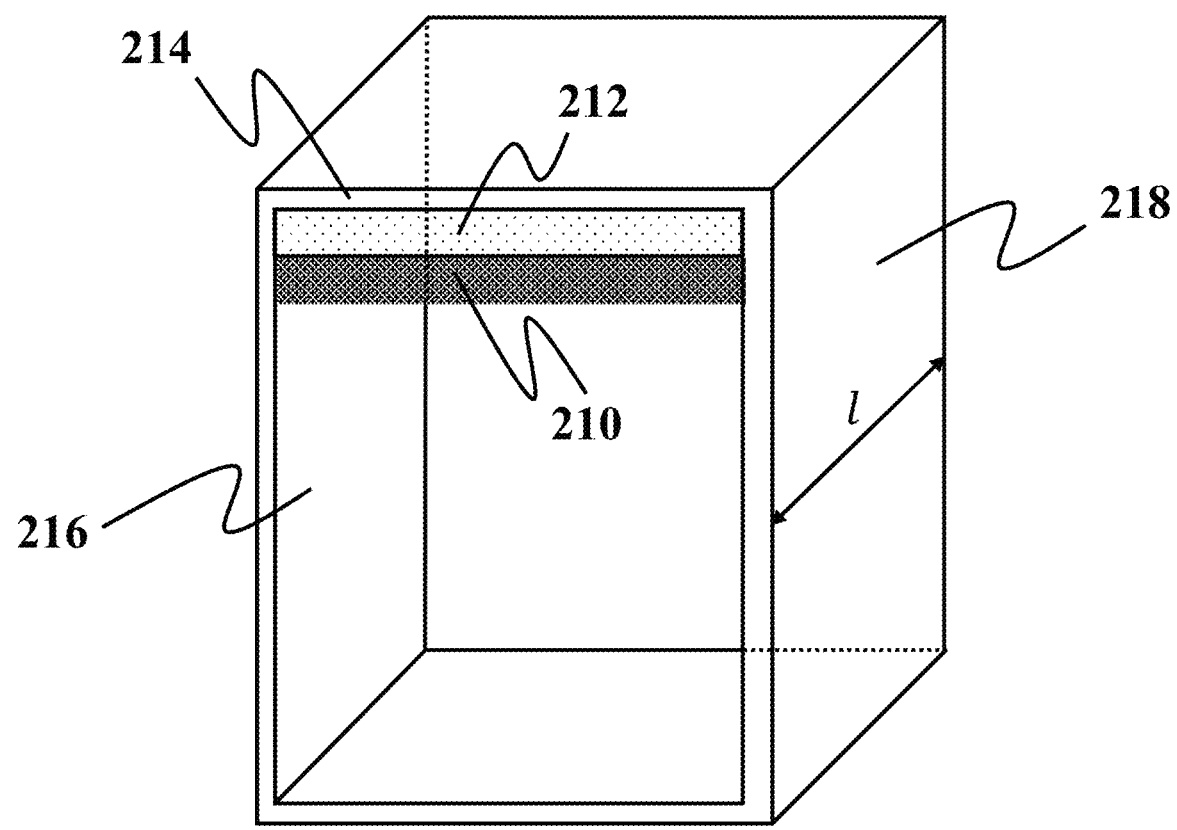
FIG. 2G shows a schematic of a graphene-loaded rectangular waveguide, consistent with one or more exemplary embodiments of the present disclosure.

FIG. 2G shows a schematic of a graphene-loaded rectangular waveguide, consistent with one or more exemplary embodiments of the present disclosure. In an exemplary embodiment, a graphene-loaded rectangular waveguide 202F may include an exemplary implementation of graphene-loaded waveguide 202E. In an exemplary embodiment, different steps of flowchart 106 in FIG. 1B may be implemented utilizing graphene-loaded rectangular waveguide 202F. In an exemplary embodiment, step 114 in FIG. 1B may include directly attaching graphene monolayer 210 to a left sidewall 216 of graphene-loaded rectangular waveguide 202F. In an exemplary embodiment, an impedance surface boundary condition may be imposed on a passing wave over entire of upper wall 214. As a result, graphene monolayer 210 may cover entire of upper wall 214. In an exemplary embodiment, graphene monolayer 210 may be directly attached to left sidewall 216 to ensure imposing the impedance surface boundary condition over entire of upper wall 214.

Referring again to FIGS. 1B and 2G, in an exemplary embodiment, step 116 in FIG. 1B may include directly attaching graphene monolayer 210 to a right sidewall 218 of graphene-loaded rectangular waveguide 202F. In an exemplary embodiment, an impedance surface boundary condition may be imposed on a passing wave over entire of upper wall 214. As a result, graphene monolayer 210 may cover entire of upper wall 214. In an exemplary embodiment, graphene monolayer 210 may be directly attached to right sidewall 218 to ensure imposing the impedance surface boundary condition over entire of upper wall 214.

In an exemplary embodiment, step 108 in FIG. 1A may include adjusting cutoff frequency $f_c$. In an exemplary embodiment, the cutoff frequency may be adjusted by adjusting a chemical potential $\mu_c$ of graphene monolayer 210. An exemplary chemical potential may be adjusted according to an operation defined by:

$$f_c = \frac{1}{4a\sqrt{\mu\epsilon_{\mathit{eff}}}} \qquad \text{Equation (2)}$$

where a is a distance between upper wall 214 and lower wall 206 μ is the permeability of the magneto-dielectric material 204 and $\epsilon_{\mathit{eff}}$ is an effective permittivity of magneto-dielectric material 204 and graphene monolayer 210, where $\epsilon_{\mathit{eff}}=\epsilon(1-165\sqrt{a}\mu_c)$. In an exemplary embodiment, chemical potential $\mu_c$ of graphene monolayer 210 may be adjusted by applying a respective DC electric potential to graphene monolayer 210. In an exemplary embodiment, a relation between chemical potential $\mu_c$ of graphene monolayer 210 and a respective DC electric potential may be obtained empirically.

Figure 4A:
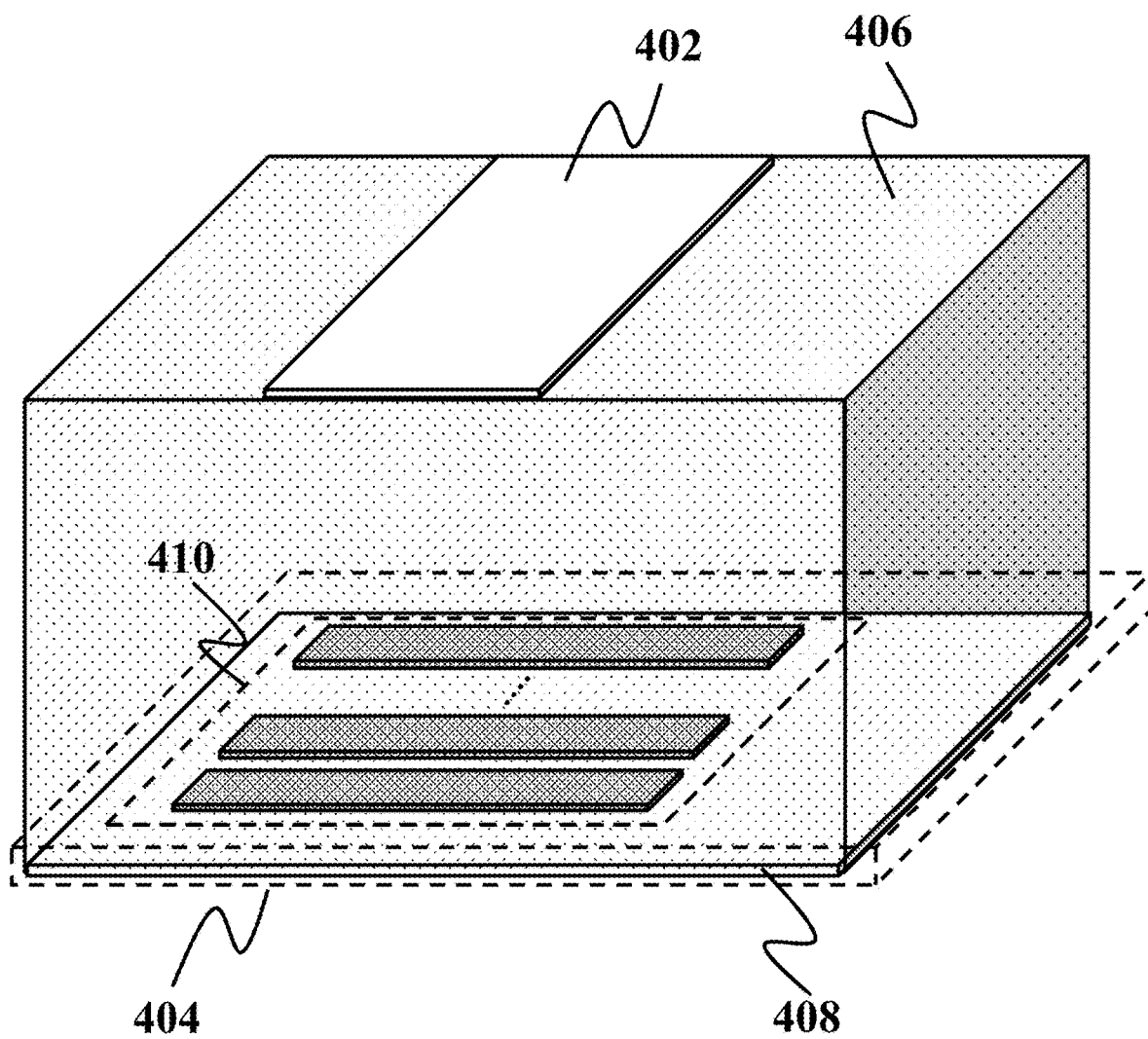
FIG. 4A shows a schematic of a metamaterial switch, consistent with one or more exemplary embodiments of the present disclosure.

FIG. 4A shows a schematic of a metamaterial switch, consistent with one or more exemplary embodiments of the present disclosure. In an exemplary embodiment, metamaterial switch 400 may include a first conductive plate 402, a first loaded conductive plate 404, and a magneto-dielectric material 406. In an exemplary embodiment, first loaded conductive plate 404 may include a second conductive plate 408 and a first tunable impedance surface set 410. In an exemplary embodiment, second conductive plate 408 may be parallel with first conductive plate 402. In an exemplary embodiment, each tunable impedance surface in first tunable impedance surface set 410 may include a respective tunable conductivity. In an exemplary embodiment, first tunable impedance surface set 410 may be positioned between first conductive plate 402 and second conductive plate 408. In an exemplary embodiment, magneto-dielectric material 406 may be deposited on first loaded conductive plate 404. In an exemplary embodiment, an effective permittivity of metamaterial switch 400 may be configured to be adjusted to a first predetermined value. In an exemplary embodiment, the effective permittivity of metamaterial switch 400 may be adjusted responsive to tuning a respective tunable conductivity of each respective tunable impedance surface in first tunable impedance surface set 410.

In an exemplary embodiment, when the first predetermined value is near-zero, adjusting the effective permittivity of metamaterial switch 400 may result in a near-zero effective permittivity of metamaterial switch 400. As a result, a microwave signal may be blocked by metamaterial switch 400 due to a near-zero effective permittivity metamaterial switch 400. In other words, metamaterial switch 400 may be configured to be opened when the first predetermined value is near-zero. In contrast, in an exemplary embodiment, when the first predetermined value is a positive value, adjusting the effective permittivity of metamaterial switch 400 may result in a positive effective permittivity of metamaterial switch 400. As a result, a microwave signal may pass through metamaterial switch 400 due to a positive effective permittivity of metamaterial switch 400. In other words, metamaterial switch 400 may be configured to be closed when the first predetermined value is positive.

In an exemplary embodiment, metamaterial switch 400 may be implemented utilizing a microstrip. An exemplary microstrip may include a strip conductor and a ground plane. An exemplary strip conductor of the microstrip may include first conductive plate 402. An exemplary ground plane of the microstrip may include second conductive plate 408.

In an exemplary embodiment, metamaterial switch 400 may be configured to be closed by setting a respective tunable conductivity of each tunable impedance surface in first tunable impedance surface set 410 to be larger than a conductivity threshold. In an exemplary embodiment, increasing a conductivity of a tunable impedance surface may increase the effective permittivity of metamaterial switch 400. As a result, a microwave signal may pass through a medium with large effective permittivity, that is, metamaterial switch 400 is closed. In an exemplary embodiment, metamaterial switch 400 may be further configured to be opened by setting a respective tunable conductivity of each tunable impedance surface in first tunable impedance surface set 410 smaller than the conductivity threshold. In an exemplary embodiment, decreasing a conductivity of a tunable impedance surface may decrease the effective permittivity of metamaterial switch 400. As a result, a microwave signal may be blocked by a medium with small effective permittivity, that is, metamaterial switch 400 is opened.

Figure 4B:
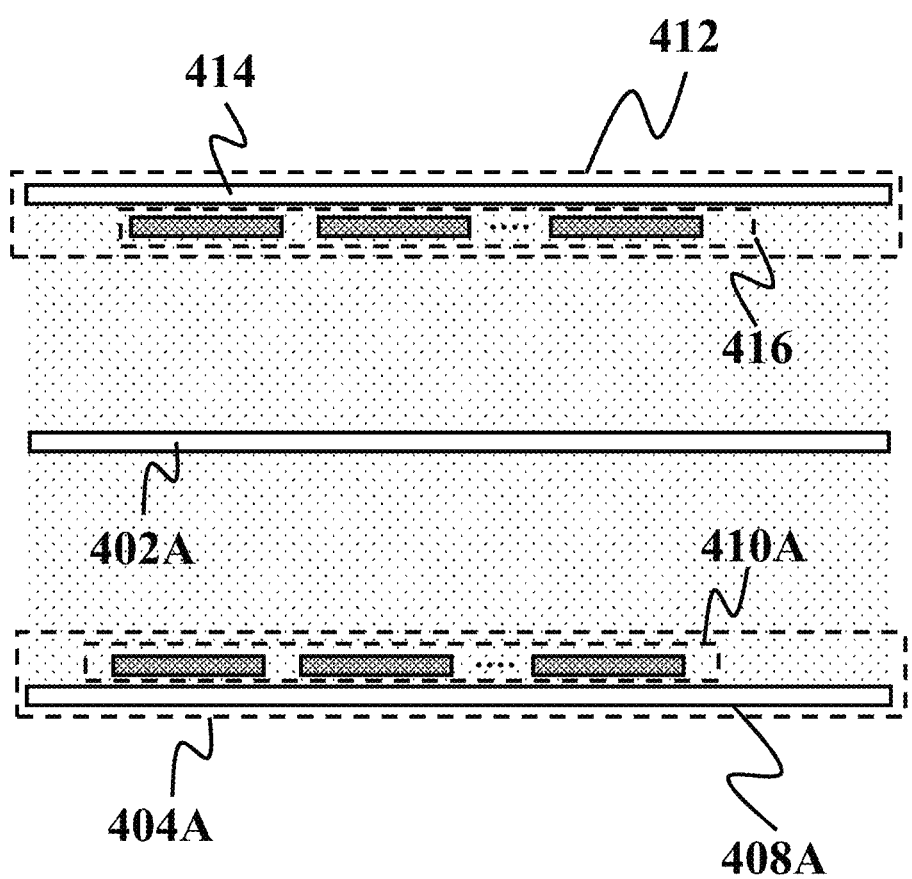
FIG. 4B shows a schematic of a side view of a metamaterial switch, consistent with one or more exemplary embodiments of the present disclosure.

FIG. 4B shows a schematic of a side view of a metamaterial switch, consistent with one or more exemplary embodiments of the present disclosure. In an exemplary embodiment, stripline metamaterial switch 400A may include an implementation of metamaterial switch 400. In an exemplary embodiment, stripline metamaterial switch 400A may include a second loaded conductive plate 412. In an exemplary embodiment, second loaded conductive plate 412 may include a third conductive plate 414 and a second tunable impedance surface set 416. In an exemplary embodiment, third conductive plate 414 may be parallel with a second conductive plate 408A. In an exemplary embodiment, second conductive plate 408A may include an implementation of second conductive plate 408 in FIG. 4A. In an exemplary embodiment, each tunable impedance surface in second tunable impedance surface set 416 may include a respective tunable conductivity. In an exemplary embodiment, second tunable impedance surface set 416 may be positioned between a first conductive plate 402A and third conductive plate 414. In an exemplary embodiment, first conductive plate 402A may include an implementation of the first conductive plate. In an exemplary embodiment, first conductive plate 402A may be positioned between a first loaded conductive plate 404A and second loaded conductive plate 412. In an exemplary embodiment, first loaded conductive plate 404A may include an implementation of first loaded conductive plate 404 in FIG. 4A. In an exemplary embodiment, an effective permittivity of stripline metamaterial switch 400A is configured to be adjusted to a second predetermined value. In an exemplary embodiment, the effective permittivity of stripline metamaterial switch 400A may be adjusted responsive to tuning a respective tunable conductivity of each respective tunable impedance surface in second tunable impedance surface set 416. In an exemplary embodiment, when the second predetermined value is near-zero, adjusting the effective permittivity of stripline metamaterial switch 400A may result in a near-zero effective permittivity of stripline metamaterial switch 400A. As a result, a microwave signal may be blocked by stripline metamaterial switch 400A due to a near-zero effective permittivity stripline metamaterial switch 400A. In other words, stripline metamaterial switch 400A may be configured to be opened when the second predetermined value is near-zero. In contrast, in an exemplary embodiment, when the second predetermined value is a positive value, adjusting the effective permittivity of stripline metamaterial switch 400A may result in a positive effective permittivity of stripline metamaterial switch 400A. As a result, a microwave signal may pass through stripline metamaterial switch 400A due to a positive effective permittivity of stripline metamaterial switch 400A. In other words, metamaterial switch 400 may be configured to be closed when the second predetermined value is positive.

In an exemplary embodiment, stripline metamaterial switch 400A may be implemented utilizing a stripline. An exemplary stripline may include a strip conductor, a first ground plane, and a second ground plane. An exemplary strip conductor of the stripline may include first conductive plate 402A. An exemplary first ground plane of the stripline may include second conductive plate 408A. An exemplary second ground plane of the stripline may include third conductive plate 414.

In an exemplary embodiment, a respective tunable conductivity of each tunable impedance surface in second tunable impedance surface set 416 may be equal to a respective tunable conductivity of each respective tunable impedance surface in a first tunable impedance surface set 410A. In an exemplary embodiment, first tunable impedance surface set 410A may include an implementation of first tunable impedance surface set 410 in FIG. 4A.

In an exemplary embodiment, each tunable impedance surface in first tunable impedance surface set 410 in FIG. 4A may include a respective graphene monolayer of a graphene monolayer set. In an exemplary embodiment, each tunable impedance surface in second tunable impedance surface set 416 may include a respective graphene monolayer of the graphene monolayer set.

In an exemplary embodiment, a respective tunable conductivity of each tunable impedance surface in each of first tunable impedance surface set 410 in FIG. 4A and second tunable impedance surface set 416 may be configured to be set larger than the conductivity threshold by applying a first electric potential to each respective graphene monolayer in the graphene monolayer set. In an exemplary embodiment, a respective tunable conductivity of each tunable impedance surface in each of first tunable impedance surface set 410 in FIG. 4A and second tunable impedance surface set 416 may be configured to be set smaller than the conductivity threshold by applying a second electric potential to each respective graphene monolayer in the graphene monolayer set.

Figure 4C:
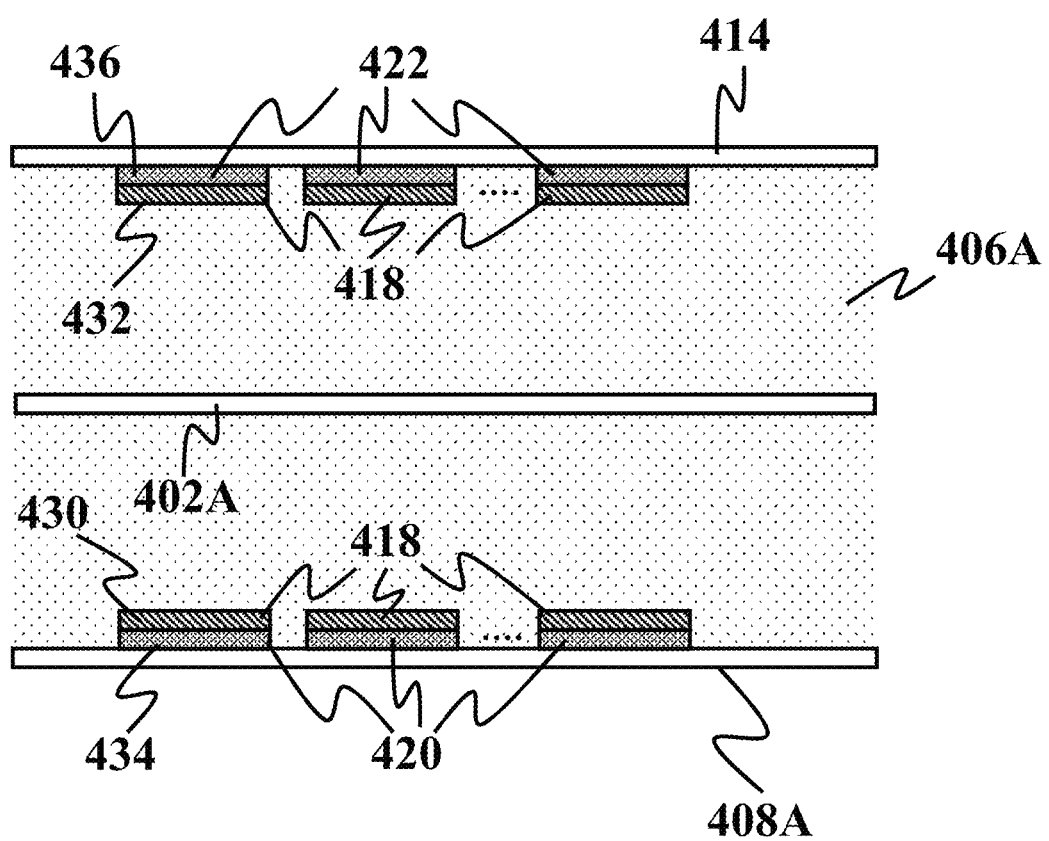
FIG. 4C shows a schematic of a side view of a graphene-loaded metamaterial switch, consistent with one or more exemplary embodiments of the present disclosure.

FIG. 4C shows a schematic of a side view of a graphene-loaded metamaterial switch, consistent with one or more exemplary embodiments of the present disclosure. In an exemplary embodiment, stripline metamaterial switch 400A may further include a first dielectric spacer set 420 and a second dielectric spacer set 422. In an exemplary embodiment, each dielectric spacer in first dielectric spacer set 420 may be coated on a respective graphene monolayer in a graphene monolayer set 418. In an exemplary embodiment, each dielectric spacer in first dielectric spacer set 420 may be attached to second conductive plate 408A. In an exemplary embodiment, a thickness of each dielectric spacer in first dielectric spacer set 420 may be equal to or smaller than a quarter of an operating wavelength of stripline metamaterial switch 400A. In an exemplary embodiment, a permittivity of each dielectric spacer in first dielectric spacer set 420 may be equal to a permittivity of a magneto-dielectric material 406A. In an exemplary embodiment, magneto-dielectric material 406A may be an implementation of magneto-dielectric material 406. In an exemplary embodiment, a permeability of each dielectric spacer in first dielectric spacer set 420 may be equal to a permeability of magneto-dielectric material 406A.

In an exemplary embodiment, each dielectric spacer in second dielectric spacer set 422 may be coated on a respective graphene monolayer in graphene monolayer set 418. In an exemplary embodiment, each dielectric spacer in second dielectric spacer set 422 may be attached to third conductive plate 414. In an exemplary embodiment, a thickness of each dielectric spacer in second dielectric spacer set 422 may be equal to or smaller than a quarter of the operating wavelength. In an exemplary embodiment, a permittivity of each dielectric spacer in second dielectric spacer set 422 may be equal to the permittivity of magneto-dielectric material 406A. In an exemplary embodiment, a permeability of each dielectric spacer in second dielectric spacer set 422 may be equal to a permeability of magneto-dielectric material 422.

An exemplary length of each impedance surface in metamaterial switch 400 may impact an insertion loss of metamaterial switch 400. In an exemplary embodiment, different lengths of impedance surfaces may result in different cutoff frequency of a metamaterial implemented by a guided structure and impedance surfaces. In other words, different lengths of impedance surfaces may result in different cutoff frequencies in a wide frequency range. As a result, utilizing a set of impedances with various lengths may provide a wideband metamaterial switch. In an exemplary embodiment, a length of each impedance surface in each of first tunable impedance surface set 410 and second tunable impedance surface set 416 may satisfy one of a first length condition, a second length condition, a third length condition, and a fourth length condition.

Figure 5A:
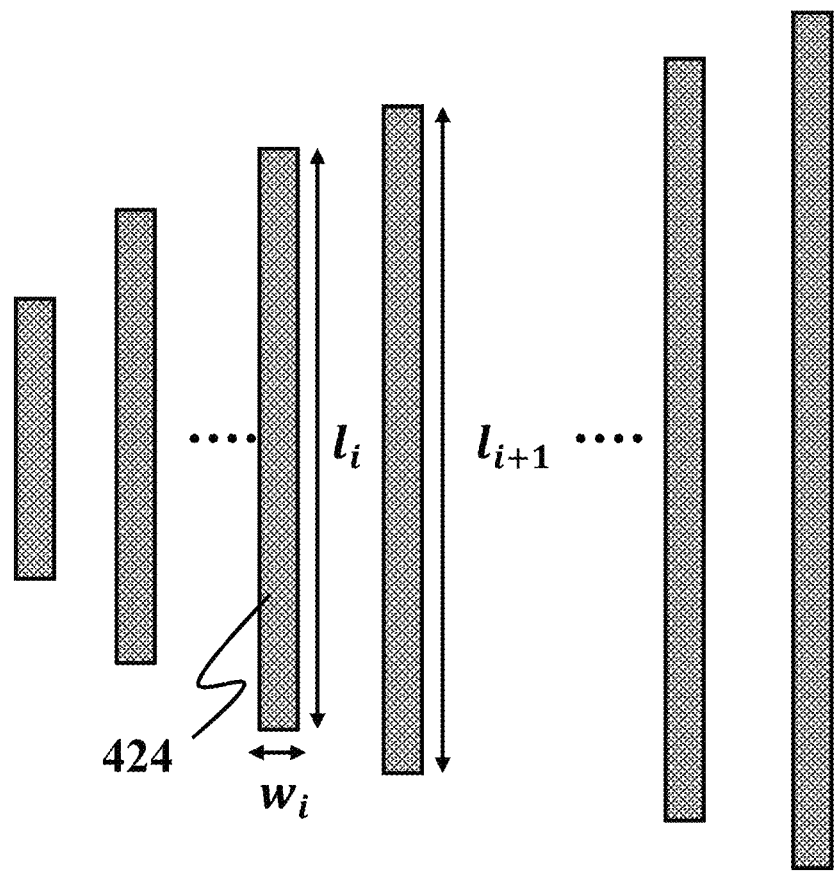
FIG. 5A shows a schematic of a tunable impedance surface set satisfying a first condition, consistent with one or more exemplary embodiments of the present disclosure.

FIG. 5A shows a schematic of a tunable impedance surface set satisfying a first condition, consistent with one or more exemplary embodiments of the present disclosure. An exemplary first length condition may include $l_i < l_{i+1}$, where $l_i$ is a length of an $i^{th}$ tunable impedance surface 424 in each of first tunable impedance surface set 410 and the second tunable impedance surface set 416, $1 \le i \le N-1$, and N is a size of each of first tunable impedance surface set 410 and second tunable impedance surface set 416. In an exemplary embodiment, lengths of tunable impedance surfaces in first tunable impedance surface set 410 may be arranged in an increasing order. In an exemplary embodiment, since an arrangement of tunable impedance surfaces in first tunable impedance surface set 410 may not be symmetrical with respect to an input line and an output line of metamaterial switch 400, metamaterial switch 400 may not be reciprocal, that is, the insertion loss of metamaterial switch 400 from the input line from the output line may not be equal to the insertion loss of metamaterial switch 400 from the output line from the input line.

Figure 5B:
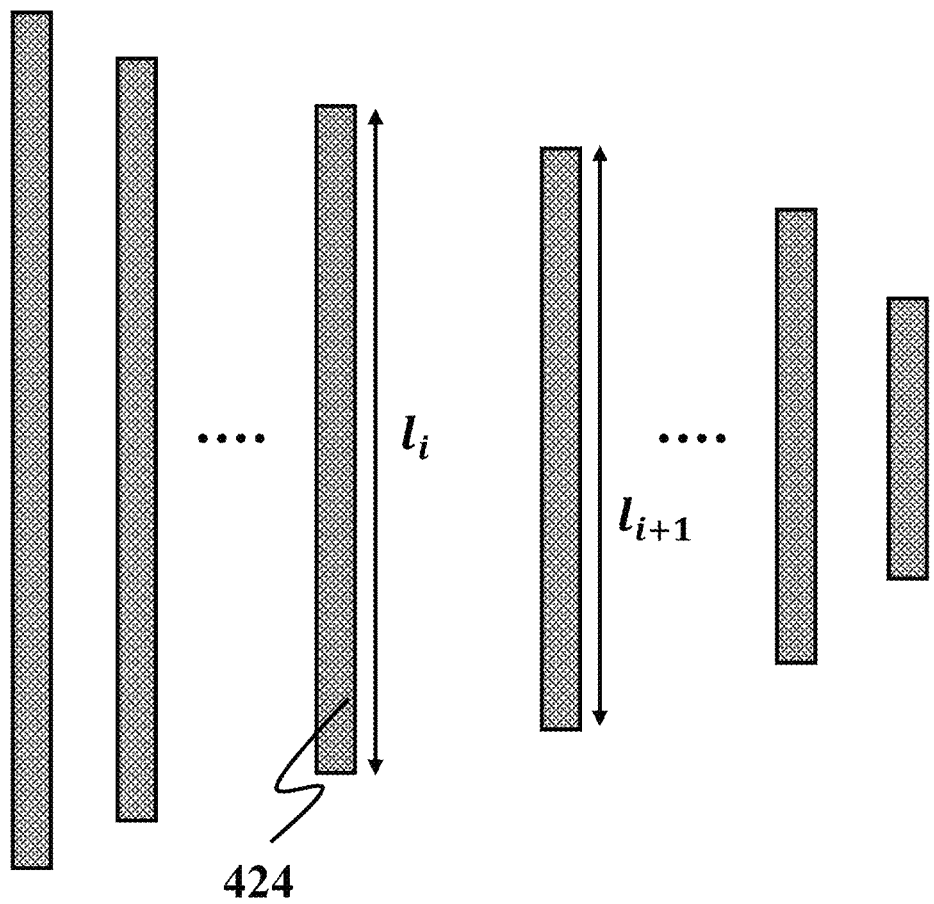
FIG. 5B shows a schematic of a tunable impedance surface set satisfying a second condition, consistent with one or more exemplary embodiments of the present disclosure.

FIG. 5B shows a schematic of a tunable impedance surface set satisfying a second condition, consistent with one or more exemplary embodiments of the present disclosure. An exemplary second length condition may include $l_i > l_{i+1}$. In an exemplary embodiment, similar to the first length condition, metamaterial switch 400 may not be reciprocal when lengths of tunable impedance surfaces in first tunable impedance surface set 410 may be arranged in a decreasing order.

Figure 5C:
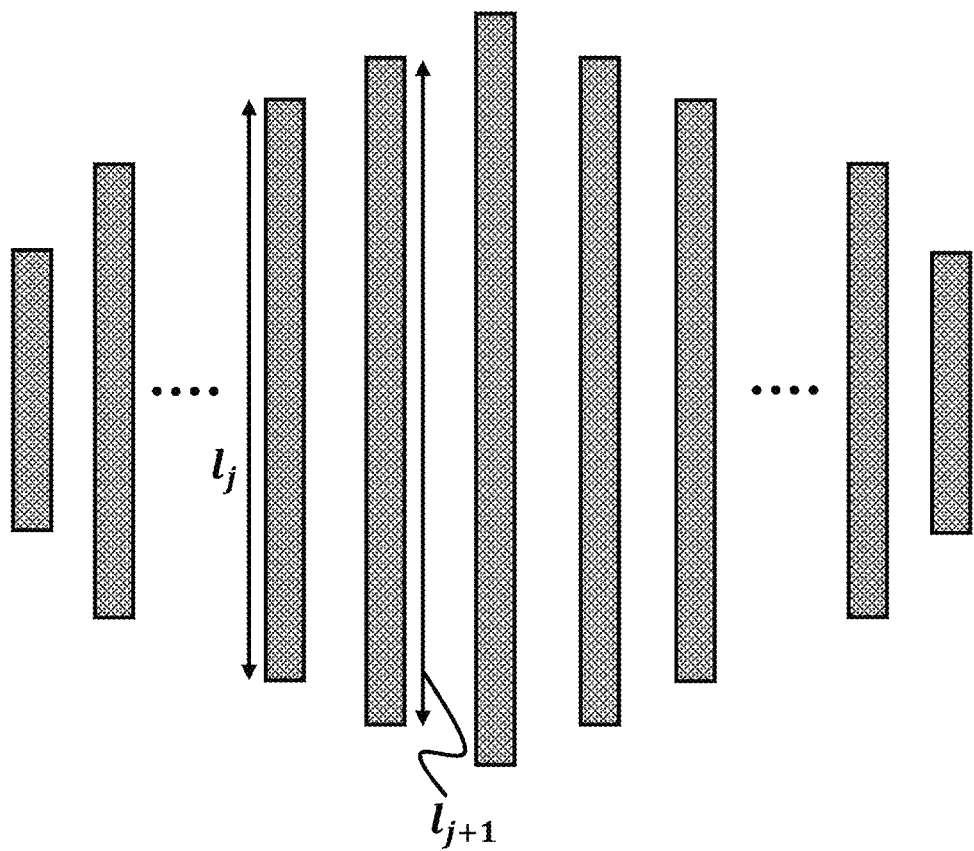
FIG. 5C shows a schematic of a tunable impedance surface set satisfying a third length condition, consistent with one or more exemplary embodiments of the present disclosure.

FIG. 5C shows a schematic of a tunable impedance surface set satisfying a third length condition, consistent with one or more exemplary embodiments of the present disclosure. An exemplary third length condition may include $l_j < l_{j+1}$ and $$l_{\left\lfloor \frac{N+1}{2} + k \right\rfloor} = l_{\left\lfloor \frac{N+1}{2} - k \right\rfloor},$$

where $$1 \le j \le \left\lceil \frac{N}{2} \right\rceil, 1 \le k \le \left\lfloor \frac{N}{2} \right\rfloor,$$

$\lfloor \cdot \rfloor$ is a floor operator, and $\lceil \cdot \rceil$ is a ceiling operator. In an exemplary embodiment, the "floor operator" may refer to a mathematical function that outputs a largest integer number that is smaller than an input of the floor operator. In an exemplary embodiment, the "ceiling operator" may refer to a mathematical function that outputs a smallest integer number that is larger than an input of the ceiling operator. In an exemplary embodiment, when lengths of tunable impedance surfaces in first tunable impedance surface set 410 satisfy the third condition, an arrangement of tunable impedance surfaces in first tunable impedance surface set 410 may be symmetrical with respect to the input line and the output line of metamaterial switch 400. As a result, metamaterial switch 400 may be reciprocal, that is, the insertion loss of metamaterial switch 400 from the input line from the output line may be equal to the insertion loss of metamaterial switch 400 from the output line from the input line.

Figure 5D:
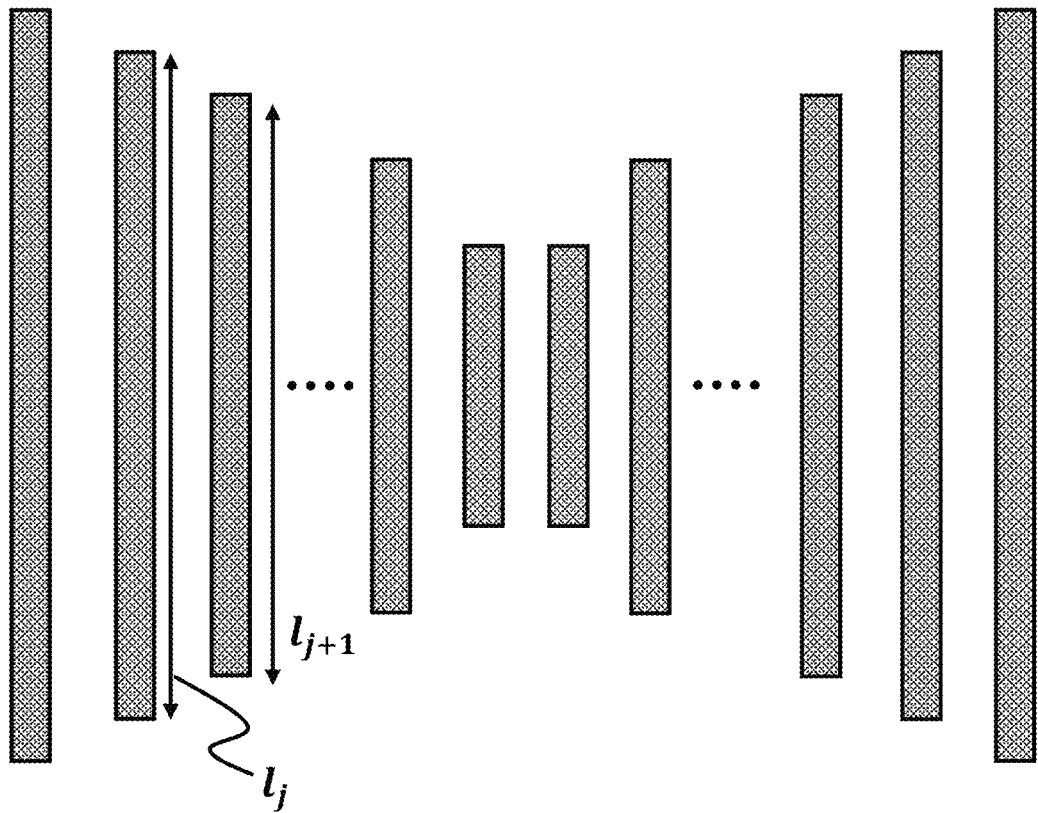
FIG. 5D shows a schematic of a tunable impedance surface set satisfying a fourth length condition, consistent with one or more exemplary embodiments of the present disclosure.

FIG. 5D shows a schematic of a tunable impedance surface set satisfying a fourth length condition, consistent with one or more exemplary embodiments of the present disclosure. An exemplary fourth length condition may include $l_j > l_{j+1}$ and $$l_{\left\lfloor \frac{N+1}{2} + k \right\rfloor} = l_{\left\lfloor \frac{N+1}{2} - k \right\rfloor}.$$

In an exemplary embodiment, similar to the third condition, an arrangement of tunable impedance surfaces in first tunable impedance surface set 410 may be symmetrical with respect to the input line and the output line of metamaterial switch 400. As a result, metamaterial switch 400 may be reciprocal when lengths of tunable impedance surfaces in first tunable impedance surface set 410 satisfy the fourth condition.

Figure 4D:
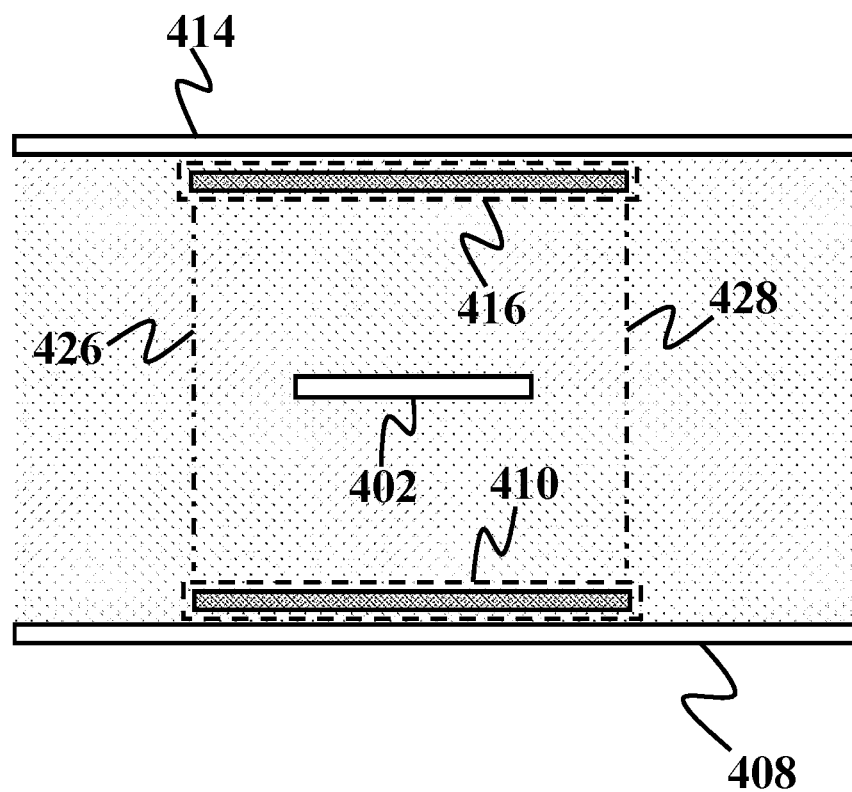
FIG. 4D shows a schematic of a front view of a metamaterial switch, consistent with one or more exemplary embodiments of the present disclosure.

FIG. 4D shows a schematic of a front view of a metamaterial switch, consistent with one or more exemplary embodiments of the present disclosure. In an exemplary embodiment, first conductive plate 402 may be positioned between a respective proximal end 426 and a respective distal end 428 of each respective tunable impedance surface in each of first tunable impedance surface set 410 and second tunable impedance surface set 416. In an exemplary embodiment, when first conductive plate 402 is not positioned between proximal end 426 and distal end 428, an effective permittivity of metamaterial switch 400 may not be near-zero, and consequently, an isolation of metamaterial switch 400 may be small when metamaterial switch 400 is configured to be open. In other words, metamaterial switch 400 may not sufficiently attenuate a power of a passing wave when metamaterial switch 400 is configured to be open.

In an exemplary embodiment, a metamaterial leaky-wave antenna may be implemented utilizing metamaterial switch 400. Referring again to FIGS. 4D and 5A, in an exemplary embodiment, a length $l_i$ of $i^{th}$ tunable impedance surface 424 in each of first tunable impedance surface set 410 and second tunable impedance surface set 416 may satisfy a length condition according to $$l_i \geq \frac{\lambda}{2},$$

where $\lambda$ is an operating wavelength of the leaky-wave antenna. In an exemplary embodiment, a radiation of the leaky-wave antenna may be maximized at a predetermined frequency by adjusting length $l_i$. In an exemplary embodiment, a width $w_i$ (FIG. 5A) of $i^{th}$ tunable impedance surface 424 in each of first tunable impedance surface set 410 and second tunable impedance surface set 416 may be adjusted to match an impedance of the leaky-wave antenna to an impedance of a feed line of the leaky-wave antenna. In an exemplary embodiment, metamaterial switch 400 may radiate when a return loss and an insertion loss of metamaterial switch 400 is less than a loss threshold. An exemplary loss threshold in many applications may be set to about −10 dB.

Figure 6A:
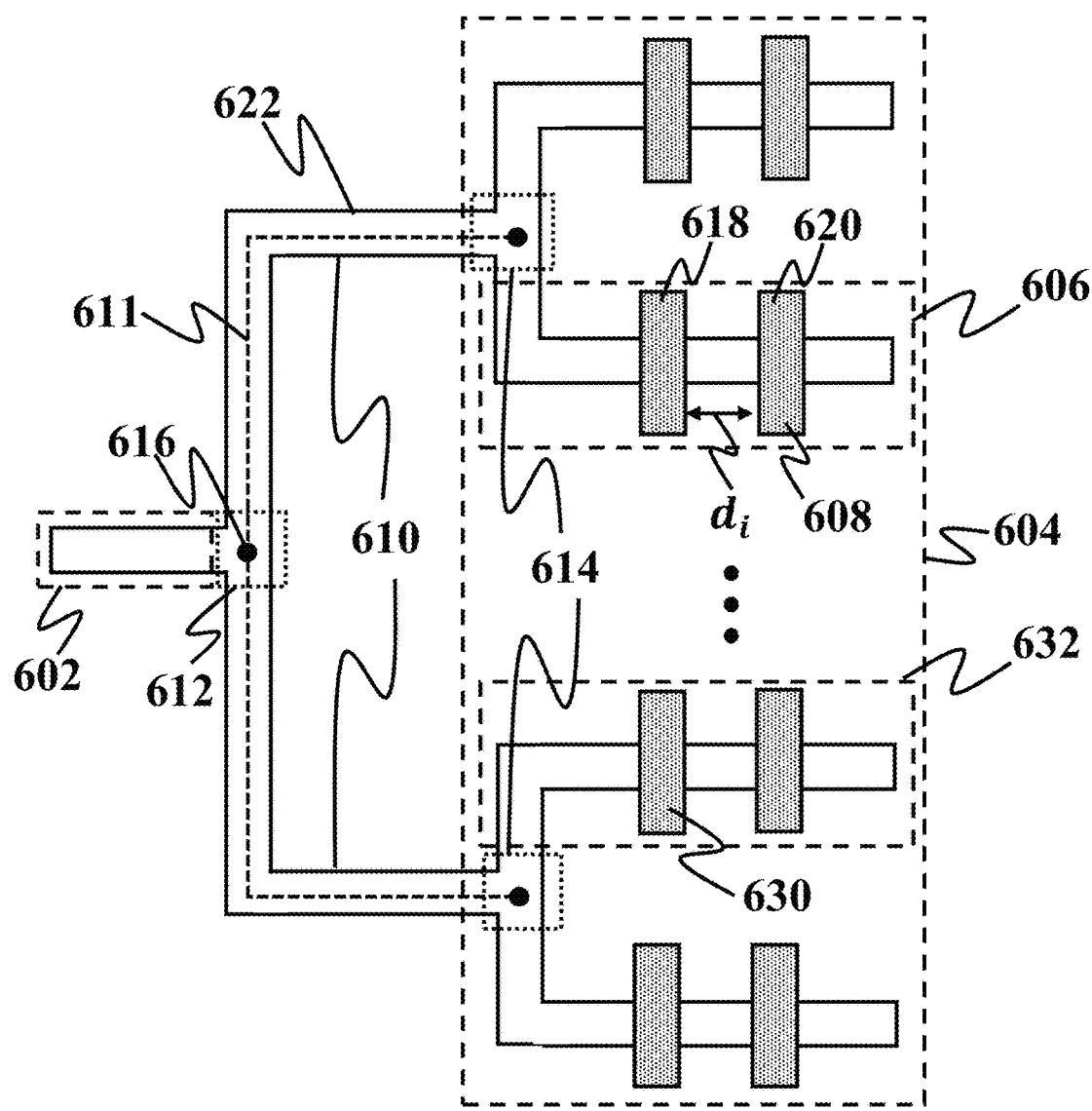
FIG. 6A shows a schematic of a top view of a metamaterial multiplexer, consistent with one or more exemplary embodiments of the present disclosure.

FIG. 6A shows a schematic of a top view of a metamaterial multiplexer, consistent with one or more exemplary embodiments of the present disclosure. In an exemplary embodiment, a metamaterial multiplexer 600 may include an input line 602 and a plurality of output lines 604. In an exemplary embodiment, an $i^{th}$ output line 606 of plurality of output lines 604 may include an $(i, k)^{th}$ metamaterial switch 608, where $1 \leq i \leq N$, $k \in \{1,2\}$, and N is a number of plurality of output lines 604. In an exemplary embodiment, $(i, k)^{th}$ metamaterial switch 608 may be configured to route a microwave signal from input line 602 to $i^{th}$ output line 606. In an exemplary embodiment, $(i, k)^{th}$ metamaterial switch 608 may route the microwave signal responsive to $(i, k)^{th}$ metamaterial switch 608 being closed. In an exemplary embodiment, $(i, k)^{th}$ metamaterial switch 608 may be similar to one of metamaterial switch 400 and stripline metamaterial switch 400A as shown in FIG. 4B.

In an exemplary embodiment, metamaterial multiplexer 600 may further include a plurality of power splitters and a plurality of transmission lines 610. An exemplary power splitter of the plurality of power splitters may divide a power of the microwave signal to a set of transmission lines that are connected to the power splitter. An exemplary transmission line of the plurality of transmission lines 610 may be implemented utilizing one of a microstrip and a stripline. In an exemplary embodiment, each of the plurality of power splitters may be placed on a respective node of a plurality of nodes. In an exemplary embodiment, the plurality of nodes may form a tree graph 611. In an exemplary embodiment, the plurality of power splitters may include a root power splitter 612 and a plurality of branching power splitters 614. In an exemplary embodiment, root power splitter 612 may be connected to input line 602 and placed on a root node 616 of the graph. In an exemplary embodiment, each branching power splitter of plurality of branching power splitters 614 may be connected to a respective output line of plurality of output lines 604 and placed on a respective branching node of graph 611. In an exemplary embodiment, each of the plurality of transmission lines 610 placed on a respective edge of graph 611.

In an exemplary embodiment, a distance $d_i$ between an $(i, 1)^{th}$ metamaterial switch 618 and an $(i, 2)^{th}$ metamaterial switch 620 of $i^{th}$ output line 606 satisfies a condition according to $$\left| d_i - \frac{\lambda_g}{4} \right| \leq \frac{\lambda_g}{20},$$

where $\lambda_g$ is a guided wavelength of the microwave signal. Starting from an open circuit transmission line, a short circuit transmission line may be achieved one-quarter wavelength away. In contrast, starting from a short circuit transmission line, an open circuit mission line may be achieved one-quarter wavelength away. As a result, in an exemplary embodiment, distance $d_i$ may be set to $$\frac{\lambda_g}{4}$$

to increase an isolation of metamaterial multiplexer 600.

Figure 6B:
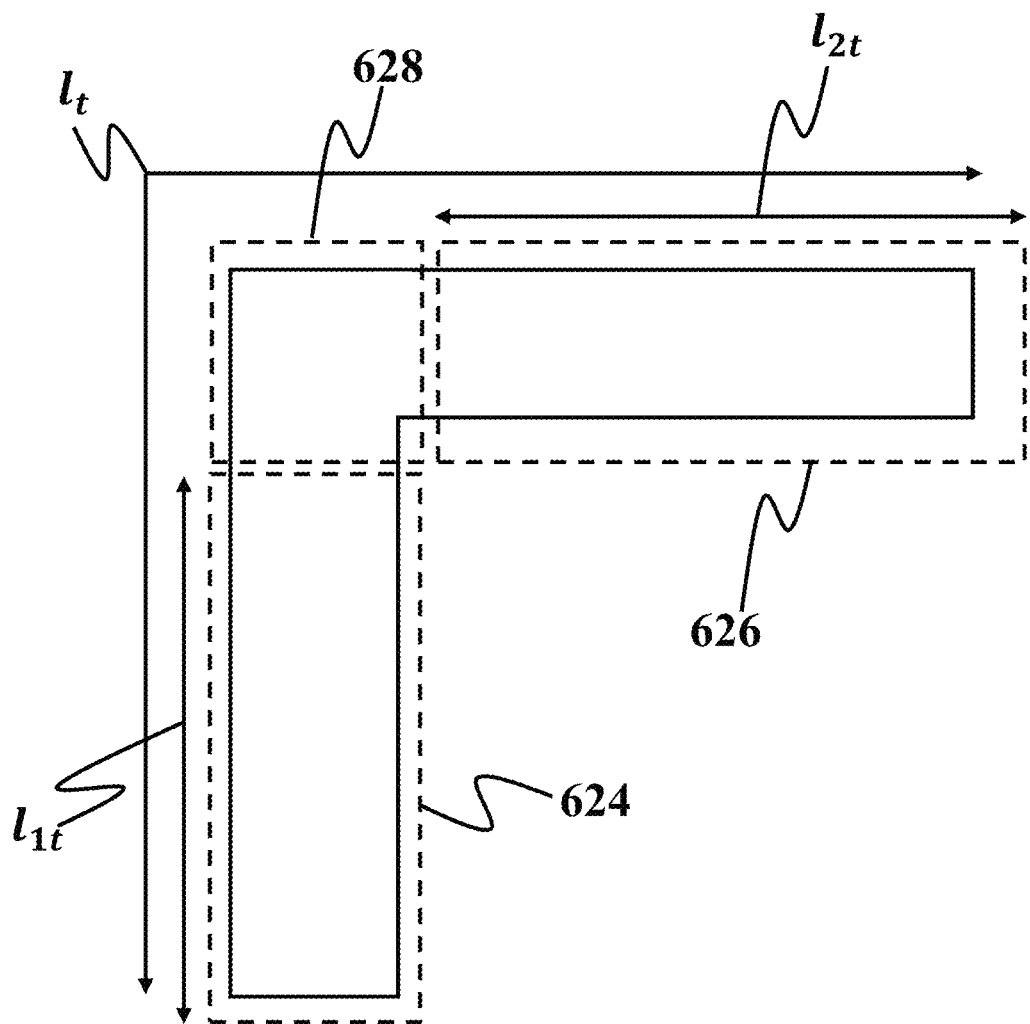
FIG. 6B shows a schematic of a transmission line, consistent with one or more exemplary embodiments of the present disclosure.

FIG. 6B shows a schematic of a transmission line, consistent with one or more exemplary embodiments of the present disclosure. In an exemplary embodiment, a transmission line 622 of plurality of transmission lines 610 may include a first transmission line segment 624, a second transmission line segment 626, and a transmission line bend 628. In an exemplary embodiment, a respective length $l_t$ of transmission line 622 may satisfy a condition according to $$\left| l_t - n\frac{\lambda_g}{2} - \frac{\lambda_g}{12} \right| \leq \frac{\lambda_g}{20},$$

where n is an integer equal to or larger than 1. In an exemplary embodiment, when the microwave signal meets $(i, 1)^{th}$ metamaterial switch 618 in a closed state, the microwave signal may be reflected without shift in a phase of the microwave signal. As a result, to avoid a negative impact of a reflected wave, a length of each transmission line of plurality of transmission lines 610 may need to be a multiply of $\lambda_g/2$. Additionally, in an exemplary embodiment, a length of $$\frac{\lambda_g}{12}$$

may be added to transmission lines to take an phase shifting impact of a transmission line bend into account.

In an exemplary embodiment, first transmission line segment 624 may include a first length $l_{1t}$. In an exemplary embodiment, first length $l_{1t}$ may satisfy a condition according to $$\left|l_{1t} - (2m+1)\frac{\lambda_g}{8}\right| \leq \frac{\lambda_g}{20},$$

where m is a non-negative integer. In an exemplary embodiment, second transmission line segment 626 may include a second length $l_{2t}$. In an exemplary embodiment, second length $l_{2t}$ may satisfy a condition according to $$\left|l_{2t} - (2p+1)\frac{\lambda_g}{8}\right| \leq \frac{\lambda_g}{20},$$

where p is a non-negative integer. In an exemplary embodiment, transmission line bend 628 may connect first transmission line segment 624 and a second transmission line segment 626.

Referring to FIGS. 4A and 6A, in an exemplary embodiment, $(i, k)^{th}$ metamaterial switch 608 may be configured to be closed similar to configuring metamaterial switch 400 to be closed. In an exemplary embodiment, a $(j, k)^{th}$ metamaterial switch 630 of a $j^{th}$ output line 632 of plurality of output lines 604 is configured to be opened similar to configuring metamaterial switch 400 to be opened, where $1 \leq j \leq N$ and $j \neq i$. In an exemplary embodiment, when metamaterial switches of all output lines except metamaterial switches of $i^{th}$ output line 606 are open and metamaterial switches of $i^{th}$ output line 606 are close, the microwave is blocked in all output lines and only passes $i^{th}$ output line 606, that is, the microwave may be routed from input line 602 to $i^{th}$ output line 606.

Figure 7A:
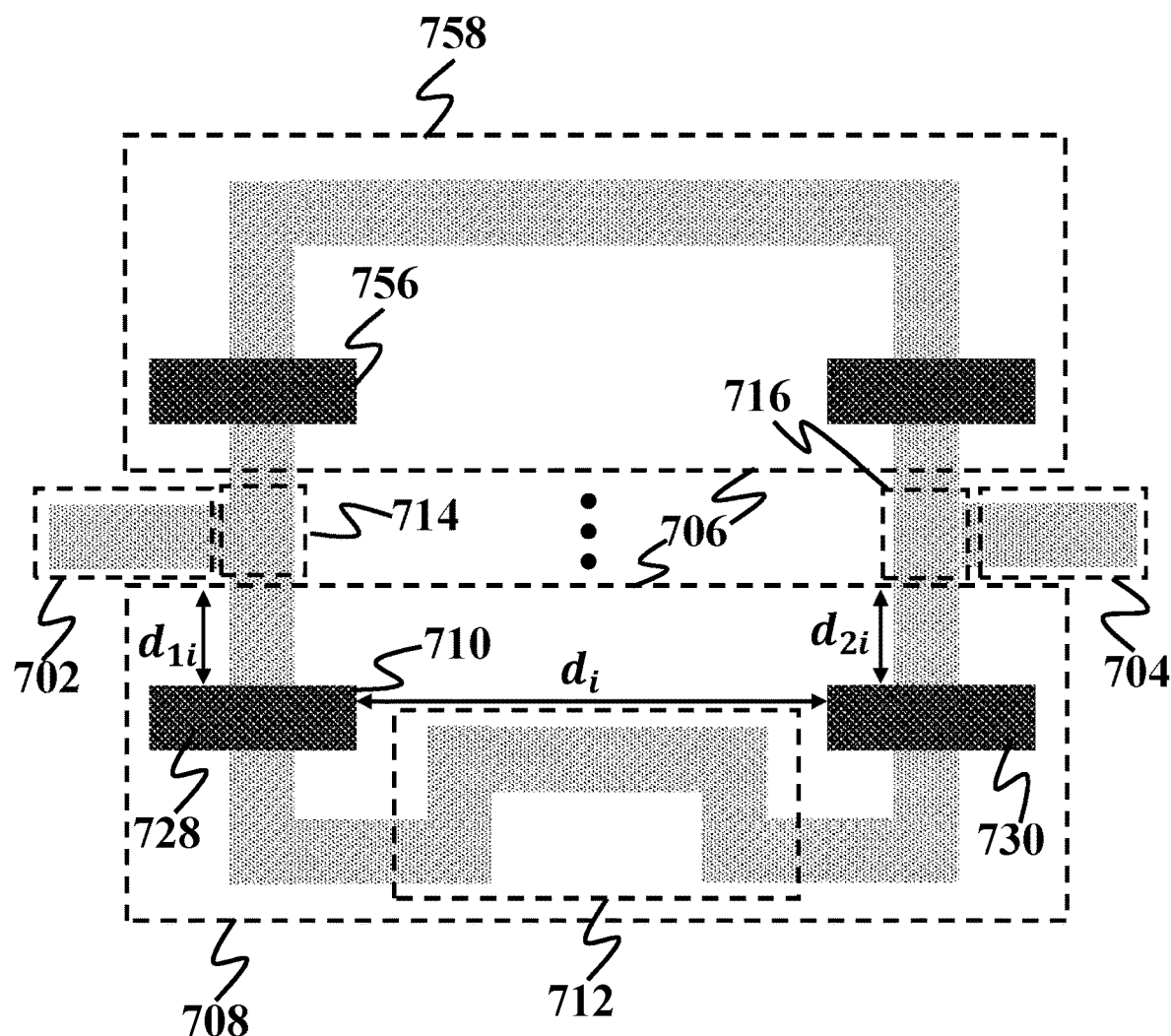
FIG. 7A shows a schematic of a top view of a metamaterial phase shifter, consistent with one or more exemplary embodiments of the present disclosure.

FIG. 7A shows a schematic of a top view of a metamaterial phase shifter, consistent with one or more exemplary embodiments of the present disclosure. In an exemplary embodiment, a metamaterial phase shifter 700 may include an input line 702, an output line 704, and a plurality of transmission lines 706. In an exemplary embodiment, an $i^{th}$ transmission line 708 of plurality of transmission lines 706 may include an $(i, k)^{th}$ metamaterial switch 710 and an $i^{th}$ delay line 712, where $1 \leq i \leq N$, $k \in \{1, 2\}$, and N is a number of plurality of transmission lines 706. In an exemplary embodiment, $(i, k)^{th}$ metamaterial switch 710 may be configured to apply an $i^{th}$ phase shift to a microwave signal. In an exemplary embodiment, $(i, k)^{th}$ metamaterial switch 710 may apply the $i^{th}$ phase shift by routing the microwave signal from input line 702 to output line 704 responsive to $(i, k)^{th}$ metamaterial switch 710 be closed. In an exemplary embodiment, $(i, k)^{th}$ metamaterial switch 710 may be similar to one of metamaterial switch 400 and stripline metamaterial switch 400A. In an exemplary embodiment, when a length of $i^{th}$ transmission line 708 is a multiple of $\lambda_g$, $i^{th}$ transmission line 708 may apply no phase shift on a microwave signal that passes $i^{th}$ transmission line 708. However, when a length of $i^{th}$ transmission line 708 differs from a multiple of $\lambda_g$, the $i^{th}$ phase shift proportional to difference of the length of $i^{th}$ transmission line 708 and multiple of $\lambda_g$, that is, a length of $i^{th}$ delay line 712, may be applied to the microwave signal. As a result, in an exemplary embodiment, by blocking the microwave signal in all transmission lines but $i^{th}$ transmission line 708, the microwave signal may be received from output line 704 with the $i^{th}$ phase shift.

In an exemplary embodiment, metamaterial phase shifter 700 may further include a power splitter 714 and a power combiner 716. In an exemplary embodiment, power splitter 714 may connect input line 702 to plurality of transmission lines 706. In an exemplary embodiment, power combiner 716 may connect output line 704 to the plurality of transmission lines 706. In an exemplary embodiment, a distance $d_{1i}$ between power splitter 714 and an $(i, 1)^{th}$ metamaterial switch 728 of $i^{th}$ transmission line 708 may satisfy a condition according to $$\left|d_{1i} - (2n+1)\frac{\lambda_g}{2}\right| \leq \frac{\lambda_g}{20},$$

where n is a non-negative integer and $\lambda_g$ is a guided wavelength of the microwave signal. In an exemplary embodiment, a distance $d_{2i}$ between power combiner 716 and an $(i, 2)^{th}$ metamaterial switch 730 of $i^{th}$ transmission line 708 may be equal to distance $d_{1i}$.

Figure 7B:
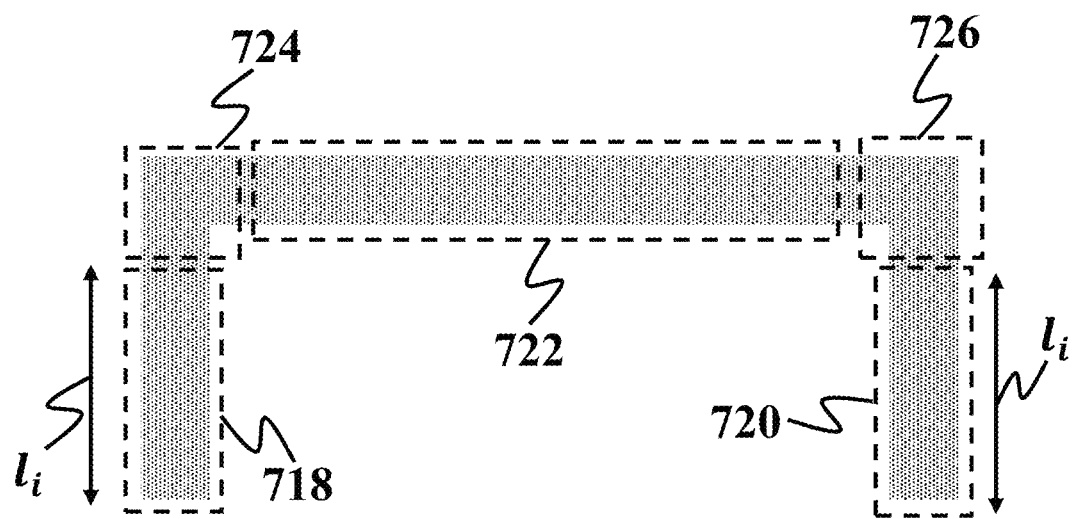
FIG. 7B shows a schematic of a delay line, consistent with one or more exemplary embodiments of the present disclosure.

FIG. 7B shows a schematic of a delay line, consistent with one or more exemplary embodiments of the present disclosure. In an exemplary embodiment, $i^{th}$ delay line 712 may include an $i^{th}$ first delay line segment 718, an $i^{th}$ second delay line segment 720, an $i^{th}$ third delay line segment 722, an $i^{th}$ first transmission line bend 724, an $i^{th}$ second transmission line bend 726. In an exemplary embodiment, a length $l_i$ of $i^{th}$ first delay line segment 718 may satisfy a condition according to $$\left|l_i - \frac{\lambda_g}{2} \times \frac{\Delta \phi_i}{360} - \frac{\lambda_g}{24}\right| \leq \frac{\lambda_g}{20},$$

where $\Delta \phi_i$ is the $i^{th}$ phase shift. In an exemplary embodiment, a length of $i^{th}$ second delay line segment 720 may be equal to length $l_i$. In an exemplary embodiment, $i^{th}$ first transmission line bend 724 may connect $i^{th}$ first delay line segment 718 and $i^{th}$ third delay line segment 722. In an exemplary embodiment, $i^{th}$ second transmission line bend 726 may connect $i^{th}$ second delay line segment 720 to $i^{th}$ third delay line segment 722. Referring to FIGS. 7A and 7B in an exemplary embodiment, a distance $d_i$ between $(i, 1)^{th}$ metamaterial switch 728 and $(i, 2)^{th}$ metamaterial switch 730 may satisfy a condition according to $$|d_i - 2l_i - m\lambda_g| \leq \frac{\lambda_g}{20},$$

where m is an integer equal to or larger than 1.

Figure 7C:
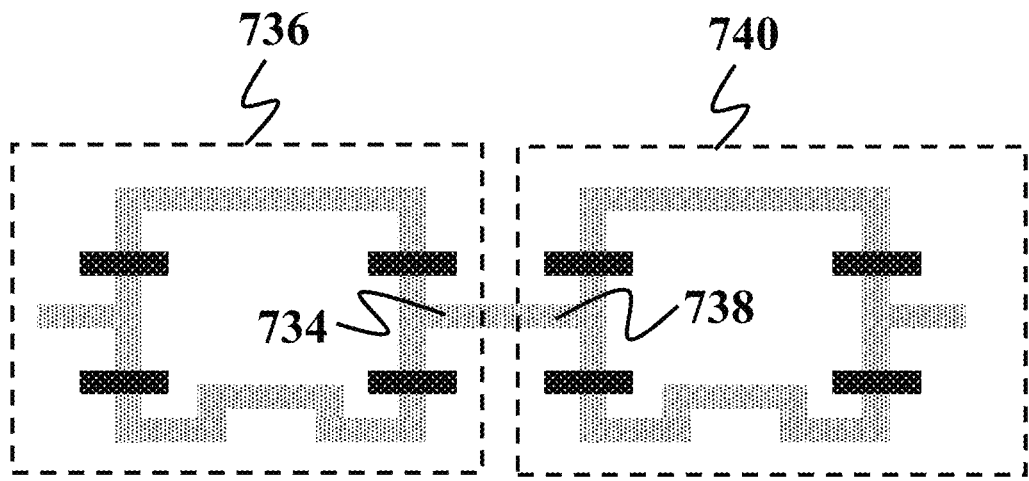
FIG. 7C shows a schematic of a top view of a serial metamaterial phase shifter, consistent with one or more exemplary embodiments of the present disclosure.

FIG. 7C shows a schematic of a top view of a serial metamaterial phase shifter, consistent with one or more exemplary embodiments of the present disclosure. In an exemplary embodiment, a serial metamaterial phase shifter 732 may be implemented by serially connecting a number of metamaterial phase shifters (each similar to metamaterial phase shifter 700). In an exemplary embodiment, serial metamaterial phase shifter 732 may be implemented by connecting an $n^{th}$ output line 734 of an $n^{th}$ metamaterial phase shifter 736 to an $(n+1)^{th}$ input line 738 of an $(n+1)^{th}$ metamaterial phase shifter 740.

Figure 7D:
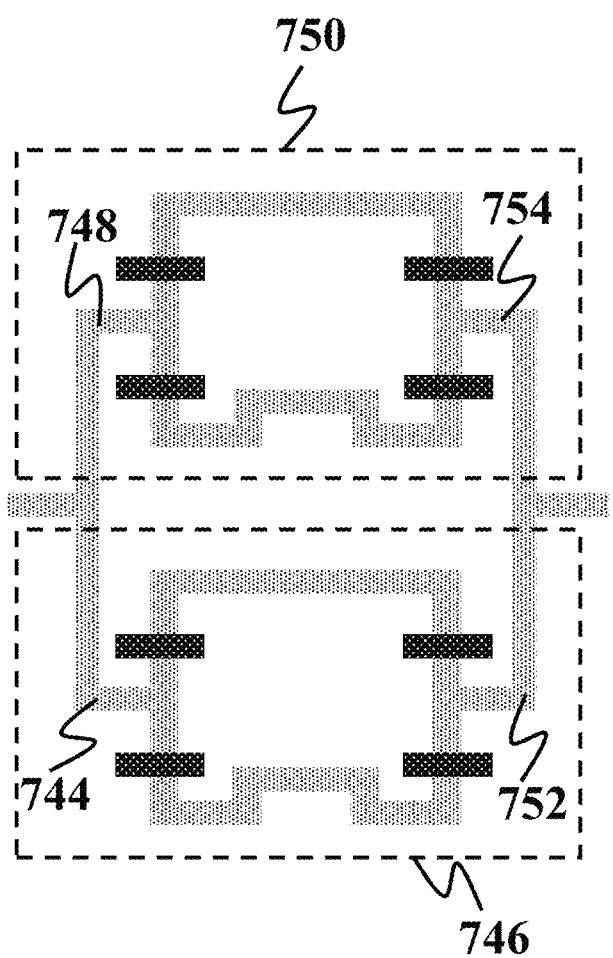
FIG. 7D shows a schematic of a top view of a parallel metamaterial phase shifter, consistent with one or more exemplary embodiments of the present disclosure.

FIG. 7D shows a schematic of a top view of a parallel metamaterial phase shifter, consistent with one or more exemplary embodiments of the present disclosure. In an exemplary embodiment, a parallel metamaterial phase shifter 742 may be implemented by in a parallel manner by connecting a plurality of metamaterial phase shifters (each similar to metamaterial phase shifter 700). In an exemplary embodiment, parallel metamaterial phase shifter 742 may be implemented by connecting an $n^{th}$ input line 744 of an $n^{th}$ metamaterial phase shifter 746 to a $(n+1)^{th}$ input line 748 of an $(n+1)^{th}$ metamaterial phase shifter 750 and connecting an $n^{th}$ output line 752 of $n^{th}$ metamaterial phase shifter 746 to an $(n+1)^{th}$ output line 754 of an $(n+1)^{th}$ metamaterial phase shifter 750.

Figure 8A:
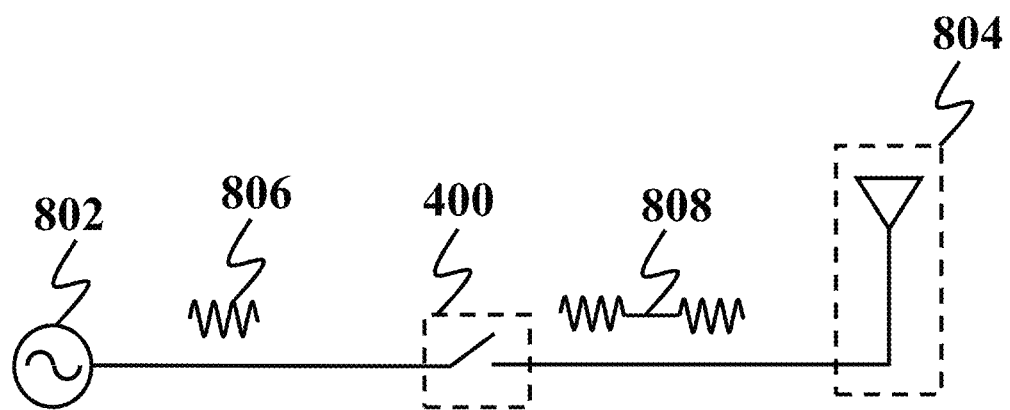
FIG. 8A shows a system for EMNZ metamaterial-based direct antenna modulation, consistent with one or more exemplary embodiments of the present disclosure.

FIG. 8A shows a system for EMNZ metamaterial-based direct antenna modulation, consistent with one or more exemplary embodiments of the present disclosure. In an exemplary embodiment, system 800 may include a signal generator 802, metamaterial switch 400 and an antenna 804. In an exemplary embodiment, signal generator 802 may be configured to generate microwave signal 806. In an exemplary embodiment, metamaterial switch 400 may be configured to generate a modulated microwave signal 808.

Figure 8B:
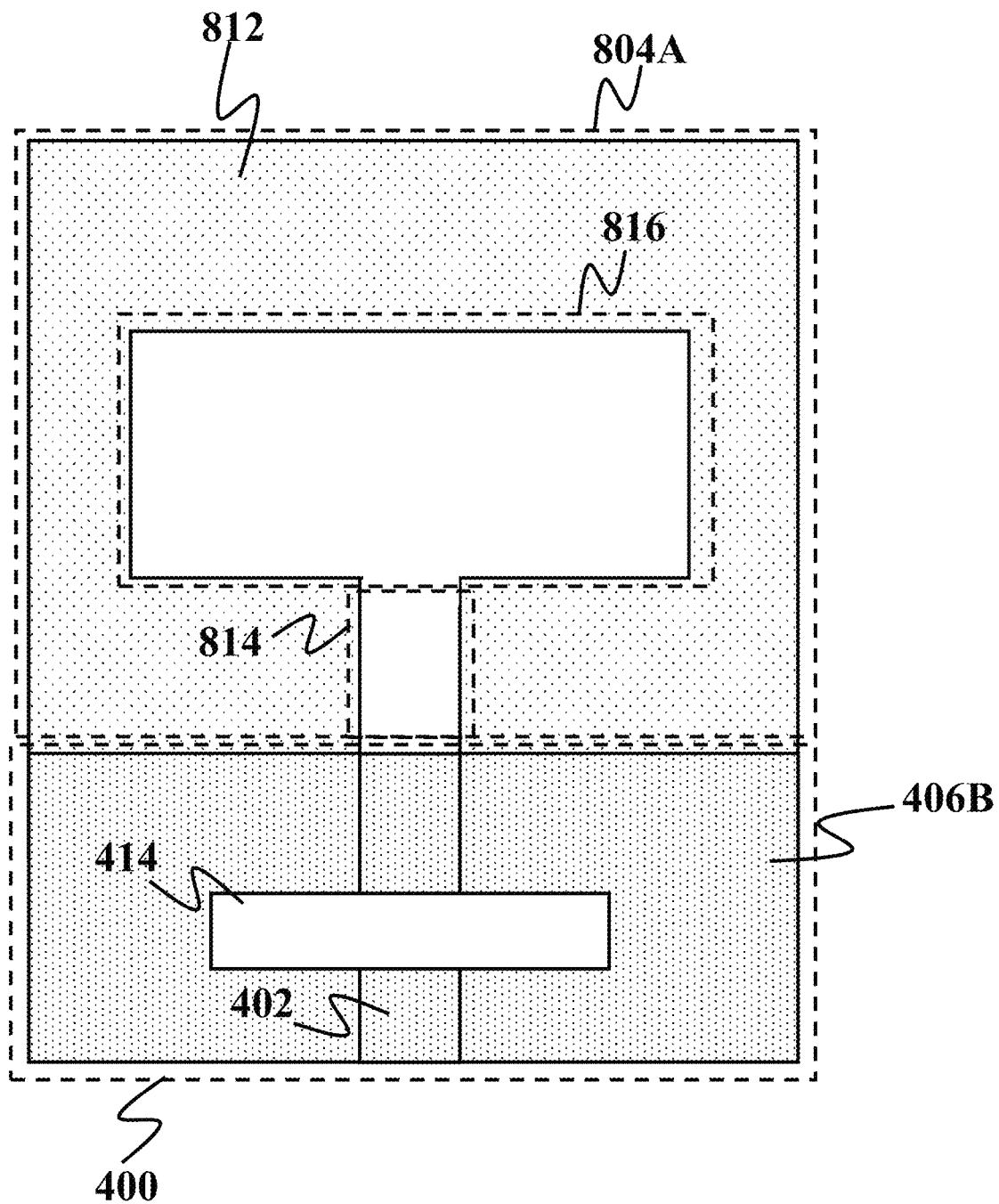
FIG. 8B shows a top view of a rectangular microstrip antenna integrated with a metamaterial switch, consistent with one or more exemplary embodiments of the present disclosure.
Figure 8C:
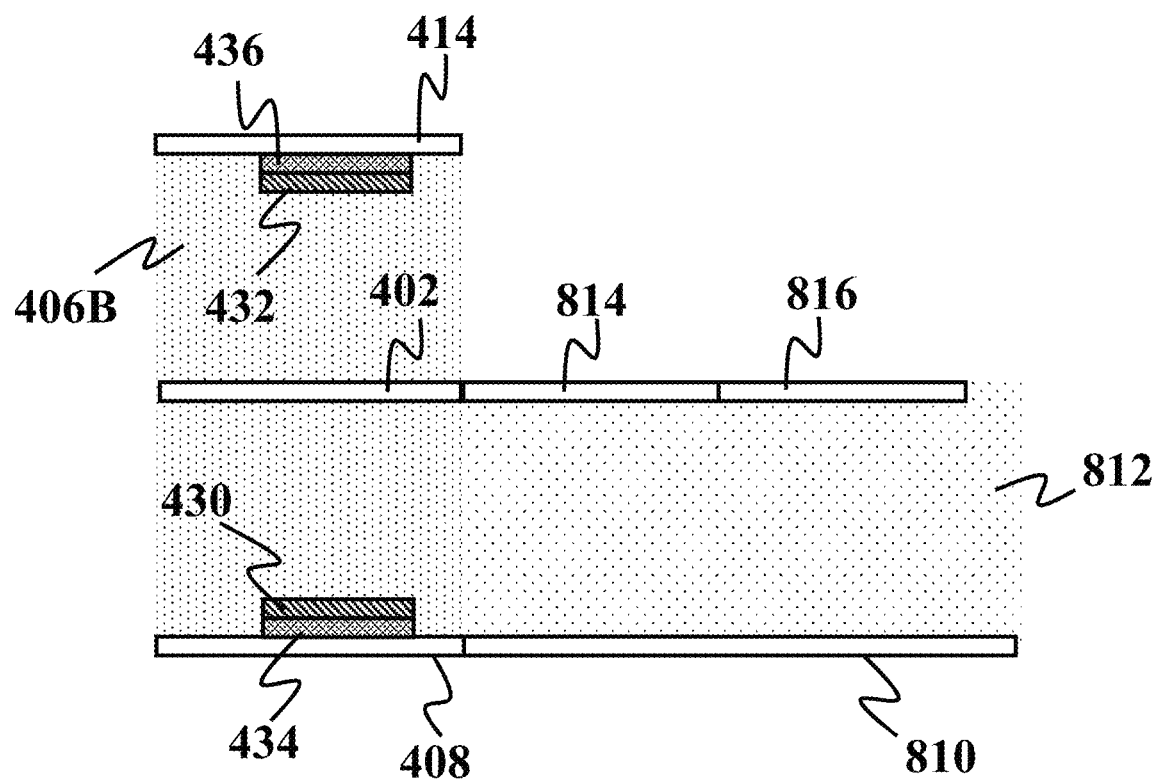
FIG. 8C shows a side view of a rectangular microstrip antenna integrated with a metamaterial switch, consistent with one or more exemplary embodiments of the present disclosure.

FIG. 8B shows a top view of a rectangular microstrip antenna integrated with a metamaterial switch, consistent with one or more exemplary embodiments of the present disclosure. FIG. 8C shows a side view of a rectangular microstrip antenna integrated with a metamaterial switch, consistent with one or more exemplary embodiments of the present disclosure. In an exemplary embodiment, metamaterial switch 400 may include a first magneto-dielectric material 406B. Referring to FIGS. 4C, 8B, and 8C, in an exemplary embodiment, first magneto-dielectric material 406B may include an implementation of magneto-dielectric material 406. In an exemplary embodiment, graphene monolayer set 418 may include a first graphene monolayer 430 and a second graphene monolayer 432. In an exemplary embodiment, first dielectric spacer set 420 may include a first dielectric spacer 434. In an exemplary embodiment, second dielectric spacer set 422 may include a second dielectric spacer 436.

Figure 8D:
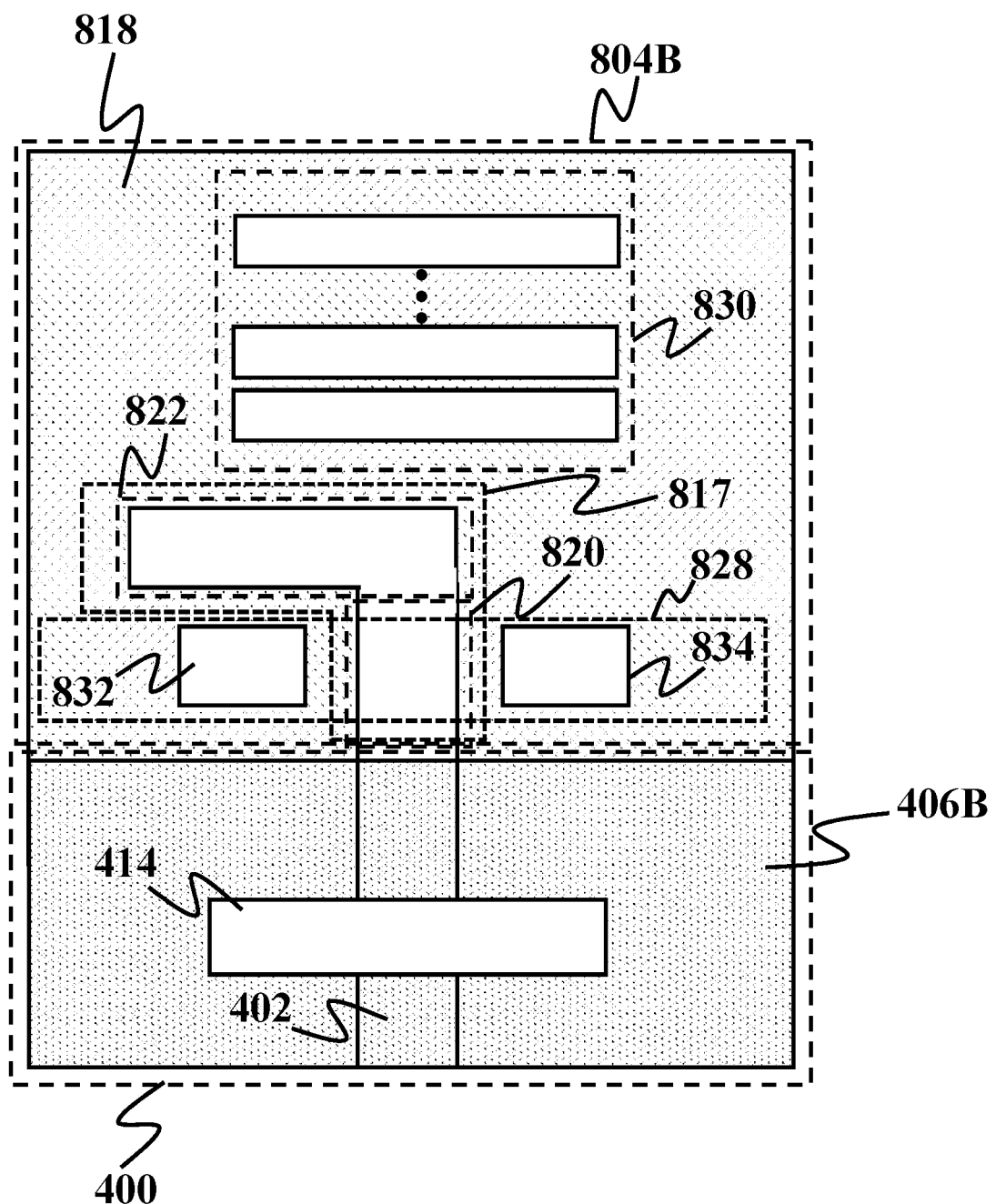
FIG. 8D shows a top view of a dipole microstrip antenna integrated with a metamaterial switch, consistent with one or more exemplary embodiments of the present disclosure.
Figure 8E:
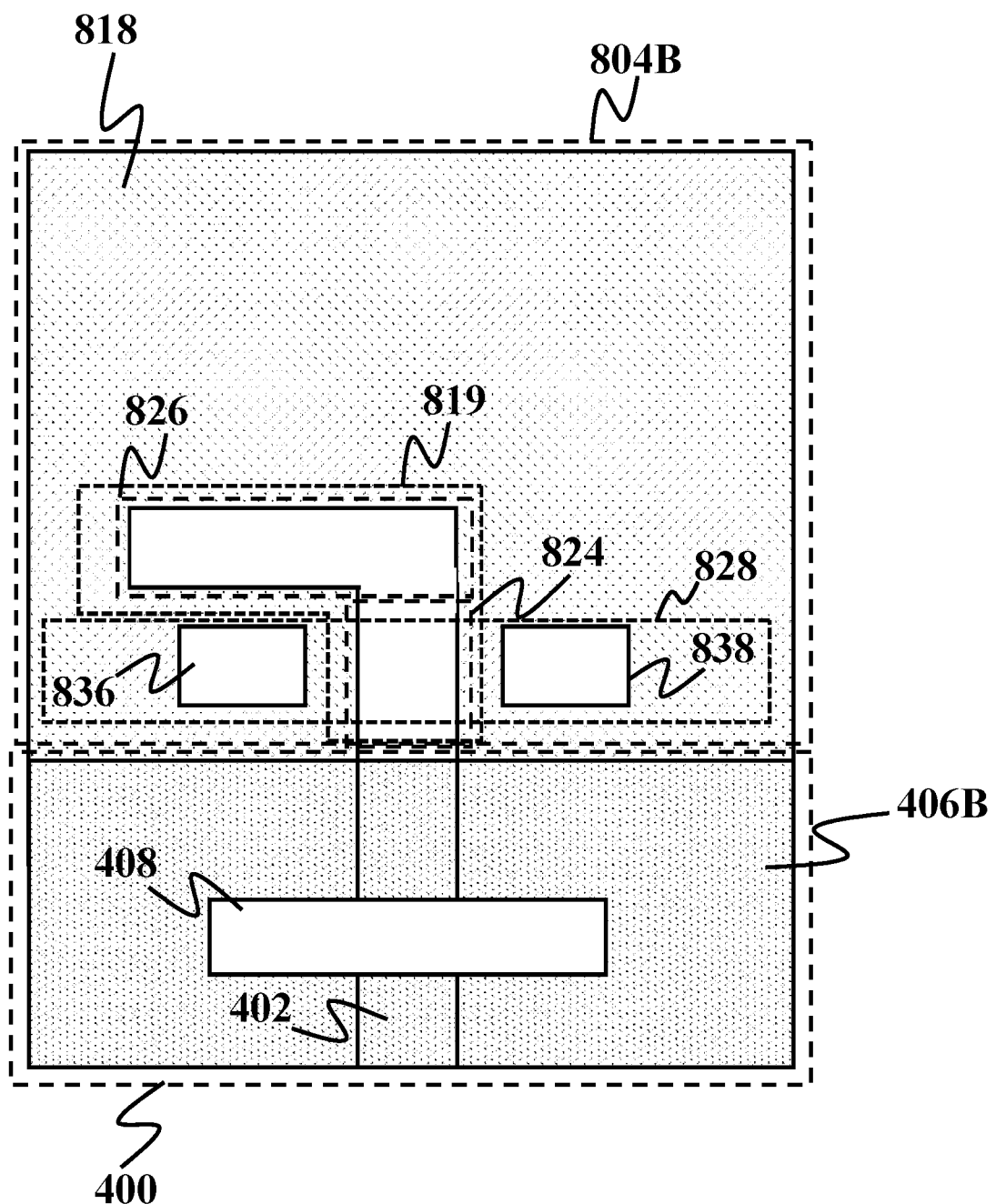
FIG. 8E shows a bottom view of a dipole microstrip antenna integrated with a metamaterial switch, consistent with one or more exemplary embodiments of the present disclosure.

FIG. 8D shows a top view of a dipole microstrip antenna integrated with a metamaterial switch, consistent with one or more exemplary embodiments of the present disclosure. FIG. 8E shows a bottom view of a dipole microstrip antenna integrated with a metamaterial switch, consistent with one or more exemplary embodiments of the present disclosure. In an exemplary embodiment, antenna 804 in FIG. 8A may include one of a rectangular microstrip antenna 804A in FIG. 8B and a dipole microstrip antenna 804B in FIG. 8D. Referring to FIGS. 8B and 8C, in an exemplary embodiment, rectangular microstrip antenna 804A may include a ground plane 810, a second magneto-dielectric material 812, a first strip conductor 814, and a first rectangular metal patch 816. Referring to FIGS. 8D and 8E, in an exemplary embodiment, dipole microstrip antenna 804B may include a first arm 817 (FIG. 8D), a third magneto-dielectric material 818, and a second arm 819 (FIG. 8E). In an exemplary embodiment, first arm 817 may include a second strip conductor 820 (FIG. 8D) and a second rectangular metal patch 822 (FIG. 8D). In an exemplary embodiment, second arm 819 may include a third strip conductor 824 (FIG. 8E) and a third rectangular metal patch 826 (FIG. 8E).

Figure 8F:
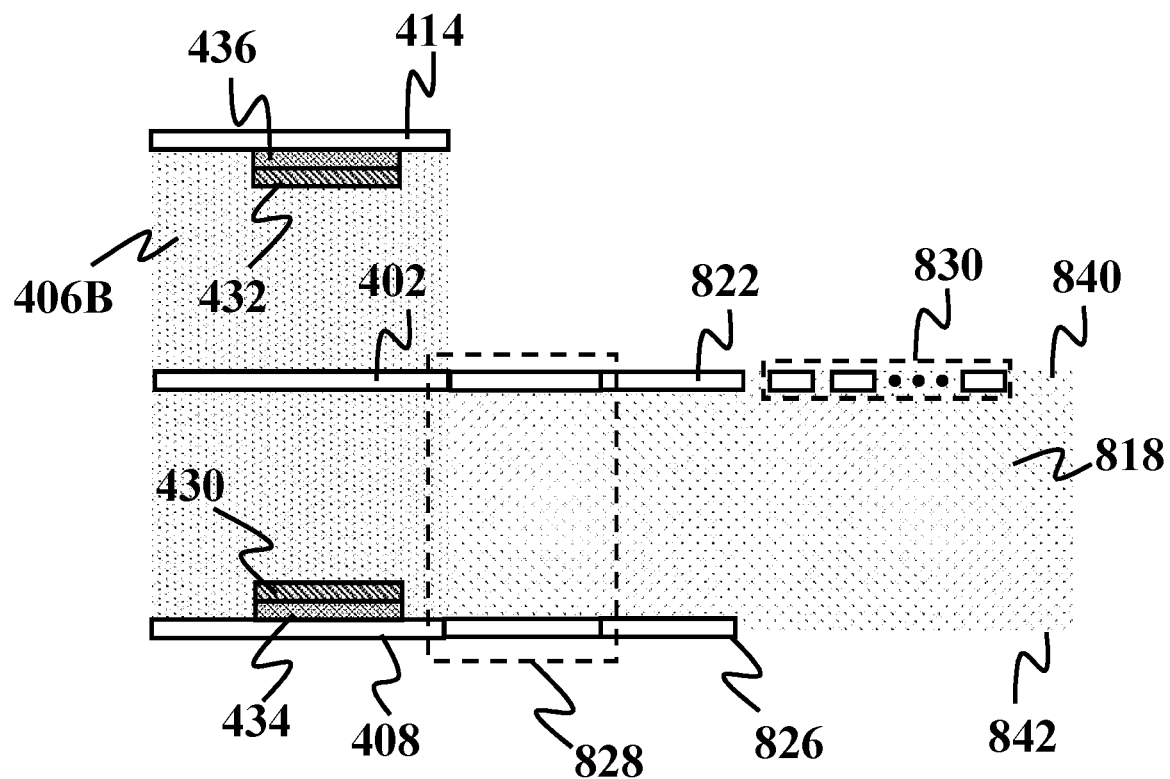
FIG. 8F shows a side view of a dipole microstrip antenna integrated with a metamaterial switch, consistent with one or more exemplary embodiments of the present disclosure.

FIG. 8F shows a side view of a dipole microstrip antenna integrated with a metamaterial switch, consistent with one or more exemplary embodiments of the present disclosure. Referring to FIGS. 8D-8F, in an exemplary embodiment, dipole microstrip antenna 804B may further include a plurality of reflector patches 828 and a plurality of director patches 830 (FIGS. 8D and 8F). In an exemplary embodiment, plurality of reflector patches 828 may include a first reflector patch 832 and a second reflector patch 834 (shown in FIG. 8D in the top view of dipole microstrip antenna 804B). In an exemplary embodiment, plurality of reflector patches 828 may further include a third reflector patch 836 and a fourth reflector patch 838 (shown in FIG. 8E in the bottom view of dipole microstrip antenna 804B). Referring to FIGS. 8A and 8F, in an exemplary embodiment, dipole microstrip antenna 804B may be integrated with metamaterial switch 400. An exemplary integration of dipole microstrip antenna 804B and metamaterial switch 400 may include elements discussed above in FIG. 8C.

Figure 9A:
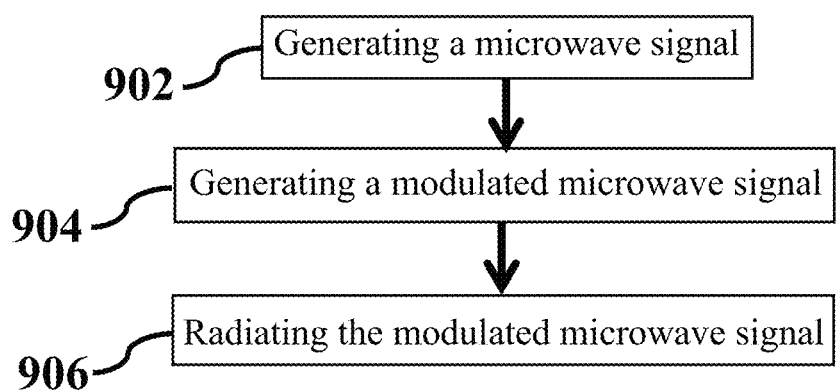
FIG. 9A shows a flowchart of a method for EMNZ metamaterial-based direct antenna modulation, consistent with one or more exemplary embodiments of the present disclosure.

FIG. 9A shows a flowchart of a method for EMNZ metamaterial-based direct antenna modulation, consistent with one or more exemplary embodiments of the present disclosure. In an exemplary embodiment, different steps of method 900 may be implemented utilizing system 800. In an exemplary embodiment, method 900 may include generating a microwave signal (step 902), generating a modulated microwave signal from the microwave signal (step 904), and radiating the modulated microwave signal (step 906). In an exemplary embodiment, method 900 may provide a communication system with an on-off keying modulation.

Referring to FIGS. 8A and 9A, in an exemplary embodiment, step 902 may include generating microwave signal 806 utilizing signal generator 802. In an exemplary embodiment, microwave signal 806 may include a sinusoidal wave. A frequency range of an exemplary sinusoidal wave may include one of an mmWave frequency band, THz frequency band, and a visible light frequency band.

In an exemplary embodiment, step 904 may include generating a modulated microwave signal 808 from microwave signal 806. In an exemplary embodiment, modulated microwave signal 808 may be generated utilizing metamaterial switch 400. In an exemplary embodiment, modulated microwave signal 808 may be generated by selectively passing microwave signal 806 through metamaterial switch 400.

Figure 9B:
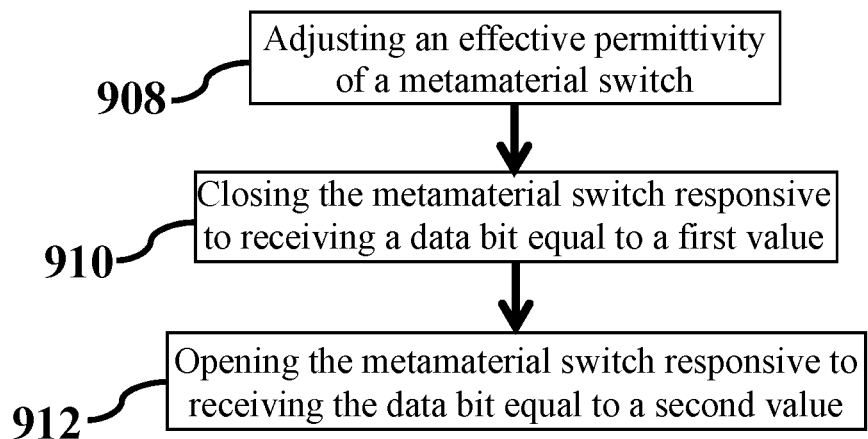
FIG. 9B shows a flowchart of a method for generating a modulated microwave signal by selectively passing a microwave signal through a metamaterial switch, consistent with one or more exemplary embodiments of the present disclosure.

In further detail with respect to step 904, FIG. 9B shows a flowchart of a method for generating a modulated microwave signal by selectively passing a microwave signal through a metamaterial switch, consistent with one or more exemplary embodiments of the present disclosure. Referring to FIGS. 8A and 9B, in an exemplary embodiment, selectively passing microwave signal 806 through metamaterial switch 400 may include adjusting an effective permittivity of metamaterial switch 400 (step 908), closing metamaterial switch 400 (step 910), and opening metamaterial switch 400 (step 912). In an exemplary embodiment, the effective permittivity may be adjusted to a predetermined value. In an exemplary embodiment, selectively passing microwave signal 806 may implement an on-off keying modulation on microwave signal 806.

Figure 9C:
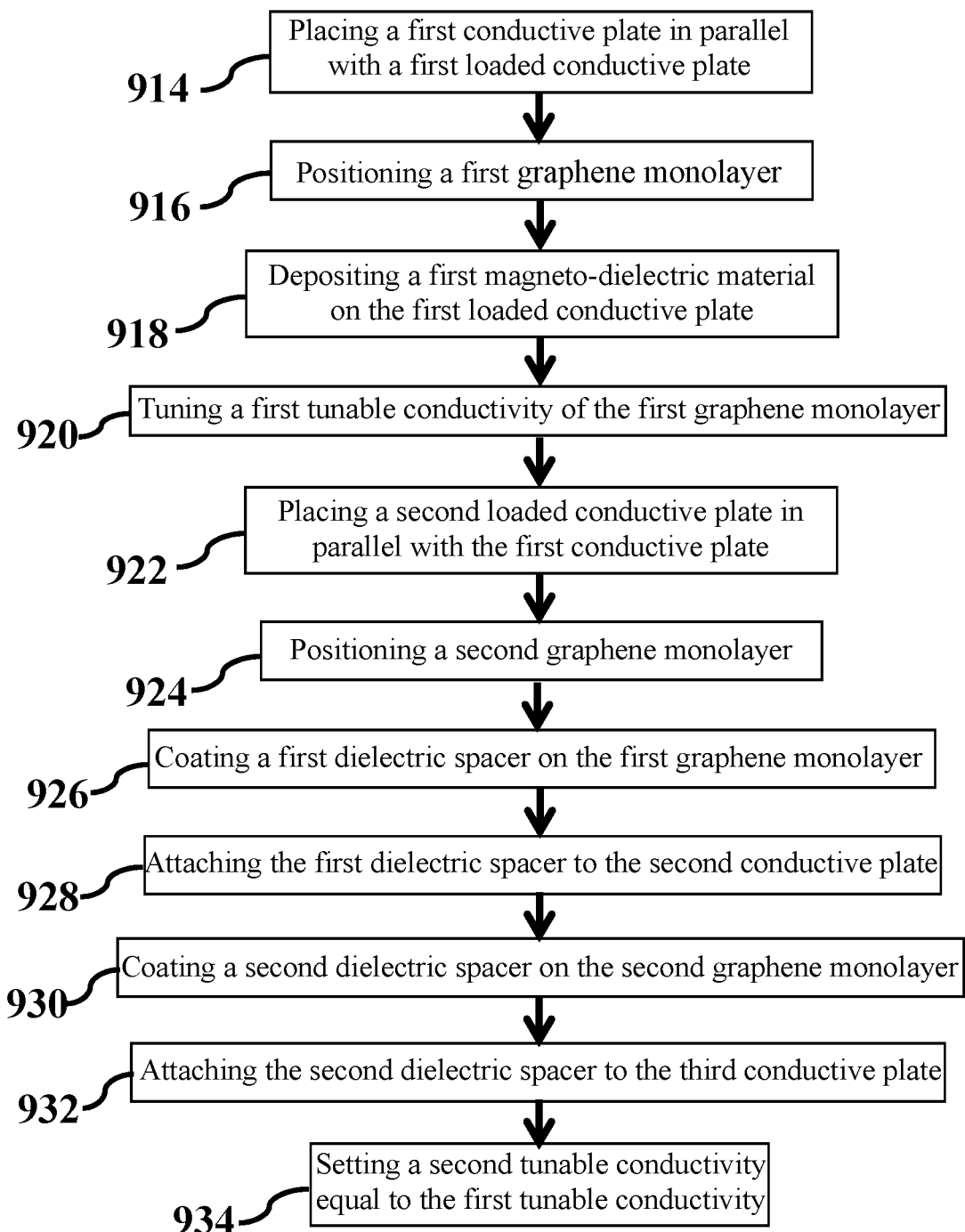
FIG. 9C shows a flowchart of a method for adjusting an effective permittivity of a metamaterial switch, consistent with one or more exemplary embodiments of the present disclosure.

For further detail regarding step 908, FIG. 9C shows a flowchart of a method for adjusting an effective permittivity of a metamaterial switch, consistent with one or more exemplary embodiments of the present disclosure. Referring to FIGS. 8A, 8C, 9B, and 9C, in an exemplary embodiment, step 908 may include adjusting an effective permittivity of metamaterial switch 400. In an exemplary embodiment, adjusting an effective permittivity of metamaterial switch 400 may include placing first conductive plate 402 (step 914), positioning first graphene monolayer 430 (step 916), depositing first magneto-dielectric material 406B (step 918), and tuning a first tunable conductivity of first graphene monolayer 430 (step 920).

In an exemplary embodiment, step 914 may include placing first conductive plate 402 in parallel with first loaded conductive plate 404. In an exemplary embodiment, metamaterial switch 400 may be integrated with a transmission line such as a microstrip. An exemplary transmission line may include two parallel conductive plates that facilitate a transmission of microwave signal 806 (FIG. 8A). As a result, first conductive plate 402 may be placed in parallel with first loaded conductive plate 404 to be integrated with parallel conductive plates of a transmission line crossing metamaterial switch 400. In an exemplary embodiment, placing first conductive plate 402 may include vertically positioning first conductive plate 402 between first loaded conductive plate 404 and second loaded conductive plate 412. In an exemplary embodiment, first conductive plate 402 may include a strip conductor of a stripline. In an exemplary embodiment, first loaded conductive plate 404 may include a first ground plane of the stripline. In an exemplary embodiment, second loaded conductive plate 412 may include a second ground plane of the stripline. An exemplary strip conductor of a stripline may be vertically positioned between a first ground plane of the stripline and a second ground plane of the stripline. As a result, in an exemplary embodiment, first conductive plate 402 may be vertically positioned between first loaded conductive plate 404 and second loaded conductive plate 412. In an exemplary embodiment, placing first conductive plate 402 (step 914) may further include horizontally positioning first conductive plate 402 between a respective proximal end and a respective distal end of each of first graphene monolayer 430 and second graphene monolayer 432. In an exemplary embodiment, when cross-sections of first graphene monolayer 430 and second graphene monolayer 432 are larger than a cross section of first conductive plate 402, microwave signal 806 may be blocked through entire of a cross section of metamaterial switch 400 and may not pass through a right side or a left side of a cross section of metamaterial switch 400. As a result, in an exemplary embodiment, an isolation of metamaterial switch 400 may increase, that is, a power of microwave signal 806 may be sufficiently attenuated when metamaterial switch 400 is configured to be open.

In an exemplary embodiment, step 916 may include positioning first graphene monolayer 430 between first conductive plate 402 and second conductive plate 408. In an exemplary embodiment, first conductive plate 402 may include a strip conductor of an underlying transmission line and second conductive plate 408 may include a ground plane of the underlying transmission line. As a result, in an exemplary embodiment, positioning first graphene monolayer 430 between first conductive plate 402 and second conductive plate 408 may result in an EMNZ medium between first conductive plate 402 and second conductive plate 408 when a tunable conductivity of first graphene monolayer 430 is tuned to a predetermined value. An exemplary EMNZ medium may block microwave signal 806 to pass through the underlying transmission line.

In an exemplary embodiment, step 918 may include depositing first magneto-dielectric material 406B on first loaded conductive plate 404. In an exemplary embodiment, first magneto-dielectric material 406B may be deposited by deposition techniques such as chemical deposition and physical deposition. Chemical deposition may cause a chemical change in a fluid on a solid surface, resulting in a solid layer. Physical deposition may utilize mechanical, electromechanical or thermodynamic means to produce a solid layer.

In an exemplary embodiment, step 920 may include tuning a first tunable conductivity of first graphene monolayer 430. In an exemplary embodiment, an effective permittivity of metamaterial switch 400 may be controlled by tuning the first tunable conductivity. In an exemplary embodiment, the first tunable conductivity may be electrically tuned to different values by applying different electric potentials to first graphene monolayer 430 corresponding to different values of the first tunable conductivity. In an exemplary embodiment, applying a first electric potential to first graphene monolayer 430 may tune the effective permittivity to be near-zero. As a result, metamaterial switch 400 may become an EMNZ metamaterial cell that blocks microwave signal 806. On the other hand, in an exemplary embodiment, applying a second electric potential may tune the effective permittivity to be larger than zero. As a result, metamaterial switch 400 may pass microwave signal 806.

In an exemplary embodiment, adjusting an effective permittivity of metamaterial switch 400 (step 908) may further include placing second loaded conductive plate 412 in parallel with second conductive plate 408 (step 922), positioning second graphene monolayer 432 between first conductive plate 402 and third conductive plate 414 (step 924), coating first dielectric spacer 434 on first graphene monolayer 430 (step 926), attaching first dielectric spacer 434 to second conductive plate 408 (step 928), coating second dielectric spacer 436 on second graphene monolayer 432 (step 930), attaching second dielectric spacer 436 to third conductive plate 414 (step 932), and setting a second tunable conductivity of second graphene monolayer 432 equal to the first tunable conductivity (step 934). In an exemplary embodiment, metamaterial switch 400 may be implemented through a stripline. An exemplary stripline may include an additional ground plane compared with a microstrip. As a result, in an exemplary embodiment, adjusting the effective permittivity of metamaterial switch 400 may include additional steps compared with adjusting the effective permittivity when metamaterial switch 400 is implemented utilizing a microstrip.

In an exemplary embodiment, step 922 may include placing second loaded conductive plate 412 in parallel with second conductive plate 408. In an exemplary embodiment, metamaterial switch 400 may be integrated with a stripline. An exemplary stripline may include two parallel ground planes that facilitate a transmission of microwave signal 806. In an exemplary embodiment, first loaded conductive plate 404 may include a first ground plane of a stripline. In an exemplary embodiment, second loaded conductive plate 412 may include a second ground plane of a stripline. In an exemplary embodiment, second loaded conductive plate 412 may be placed in parallel with second conductive plate 408 to be integrated with a first ground plane and a second ground plane of a stripline.

In an exemplary embodiment, step 924 may include positioning second graphene monolayer 432 between first conductive plate 402 and third conductive plate 414. In an exemplary embodiment, first conductive plate 402 may include a strip conductor of an underlying transmission line and third conductive plate 414 may include a ground plane of the underlying transmission line. As a result, in an exemplary embodiment, positioning second graphene monolayer 432 between first conductive plate 402 and third conductive plate 414 may result in an EMNZ medium between first conductive plate 402 and third conductive plate 414 when a tunable conductivity of second graphene monolayer 432 is tuned to a predetermined value. An exemplary EMNZ medium may block microwave signal 806 to pass through the underlying transmission line.

In an exemplary embodiment, step 926 may include coating first dielectric spacer 434 on first graphene monolayer 430. In an exemplary embodiment, coating first dielectric spacer 434 may include setting a thickness of first dielectric spacer 434. In an exemplary embodiment, the thickness may be set equal to or smaller than a quarter of a guided wavelength of microwave signal 806. In an exemplary embodiment, when the thickness is large compared with the guided wavelength, a combination of first graphene monolayer 430 and first dielectric spacer 434 may not impose an impedance surface boundary condition on microwave signal 806. As a result, in an exemplary embodiment, metamaterial switch 400 may not exhibit EMNZ characteristics.

In an exemplary embodiment, step 928 may include attaching first dielectric spacer 434 to second conductive plate 408. In an exemplary embodiment, first dielectric spacer 434 may be directly attached to second conductive plate 408. In an exemplary embodiment, attaching first dielectric spacer 434 to second conductive plate 408 may avoid first graphene monolayer 430 from being short-circuited with second conductive plate 408. As a result, in an exemplary embodiment, first graphene monolayer 430 may impose an impedance surface boundary condition on microwave signal 806.

In an exemplary embodiment, step 930 may include coating second dielectric spacer 436 on second graphene monolayer 432. In an exemplary embodiment, coating second dielectric spacer 436 may include setting a thickness of second dielectric spacer 436. In an exemplary embodiment, the thickness may be set equal to or smaller than a quarter of the guided wavelength. In an exemplary embodiment, when the thickness is large compared with the guided wavelength, a combination of second graphene monolayer 432 and second dielectric spacer 436 may not impose an impedance surface boundary condition on microwave signal 806. As a result, in an exemplary embodiment, metamaterial switch 400 may not exhibit EMNZ characteristics.

In an exemplary embodiment, step 932 may include attaching second dielectric spacer 436 to third conductive plate 414. In an exemplary embodiment, second dielectric spacer 436 may be directly attached to third conductive plate 414. In an exemplary embodiment, attaching second dielectric spacer 436 to third conductive plate 414 may avoid second graphene monolayer 432 to be short-circuited with third conductive plate 414. As a result, in an exemplary embodiment, second graphene monolayer 432 may impose an impedance surface boundary condition on microwave signal 806.

In an exemplary embodiment, step 934 may include setting a second tunable conductivity of second graphene monolayer 432 equal to the first tunable conductivity. In an exemplary embodiment, an effective permittivity of metamaterial switch 400 may be controlled by tuning the second tunable conductivity. In an exemplary embodiment, the second tunable conductivity may be electrically tuned to different values by applying different electric potentials to second graphene monolayer 432 corresponding to different values of the second tunable conductivity. In an exemplary embodiment, applying a first electric potential to second graphene monolayer 432 may tune the effective permittivity to be near-zero. As a result, metamaterial switch 400 may become an EMNZ metamaterial cell that blocks microwave signal 806. On the other hand, in an exemplary embodiment, applying a second electric potential may tune the effective permittivity to be larger than zero. As a result, metamaterial switch 400 may pass microwave signal 806.

Referring again to FIGS. 8A and 9B, in an exemplary embodiment, step 910 may include closing metamaterial switch 400. In an exemplary embodiment, metamaterial switch 400 may be closed responsive to receiving a data bit equal to a first value. An exemplary first value may be equal to 1. In an exemplary embodiment, when metamaterial switch is closed, a permittivity of metamaterial switch 400 is larger than zero, and consequently, metamaterial switch 400 may pass microwave signal 806. In an exemplary embodiment, when the data bit includes a value equal to 1, modulated microwave signal 808 may be generated by passing microwave signal 806 through metamaterial switch 400. In an exemplary embodiment, closing metamaterial switch 400 may include setting each of the first tunable conductivity and the second tunable conductivity to be larger than a conductivity threshold. In an exemplary embodiment, the first tunable conductivity and the second tunable conductivity may be set larger than the conductivity threshold by applying a first electric potential to each of first graphene monolayer 430 and second graphene monolayer 432.

In an exemplary embodiment, step 912 may include opening metamaterial switch 400. In an exemplary embodiment, metamaterial switch 400 may be opened responsive to receiving a data bit equal to a second value. An exemplary second value may be equal to 0. In an exemplary embodiment, when metamaterial switch is opened, a permittivity of metamaterial switch 400 is near-zero, and consequently, metamaterial switch 400 may block microwave signal 806. In an exemplary embodiment, when the data bit includes a value equal to 0, modulated microwave signal 808 may be generated by blocking microwave signal 806. In an exemplary embodiment, opening metamaterial switch 400 may include setting each of the first tunable conductivity and the second tunable conductivity smaller than the conductivity threshold. In an exemplary embodiment, the first tunable conductivity and the second tunable conductivity may be set smaller than the conductivity threshold by applying a second electric potential to each of first graphene monolayer 430 and second graphene monolayer 432.

Figure 9D:
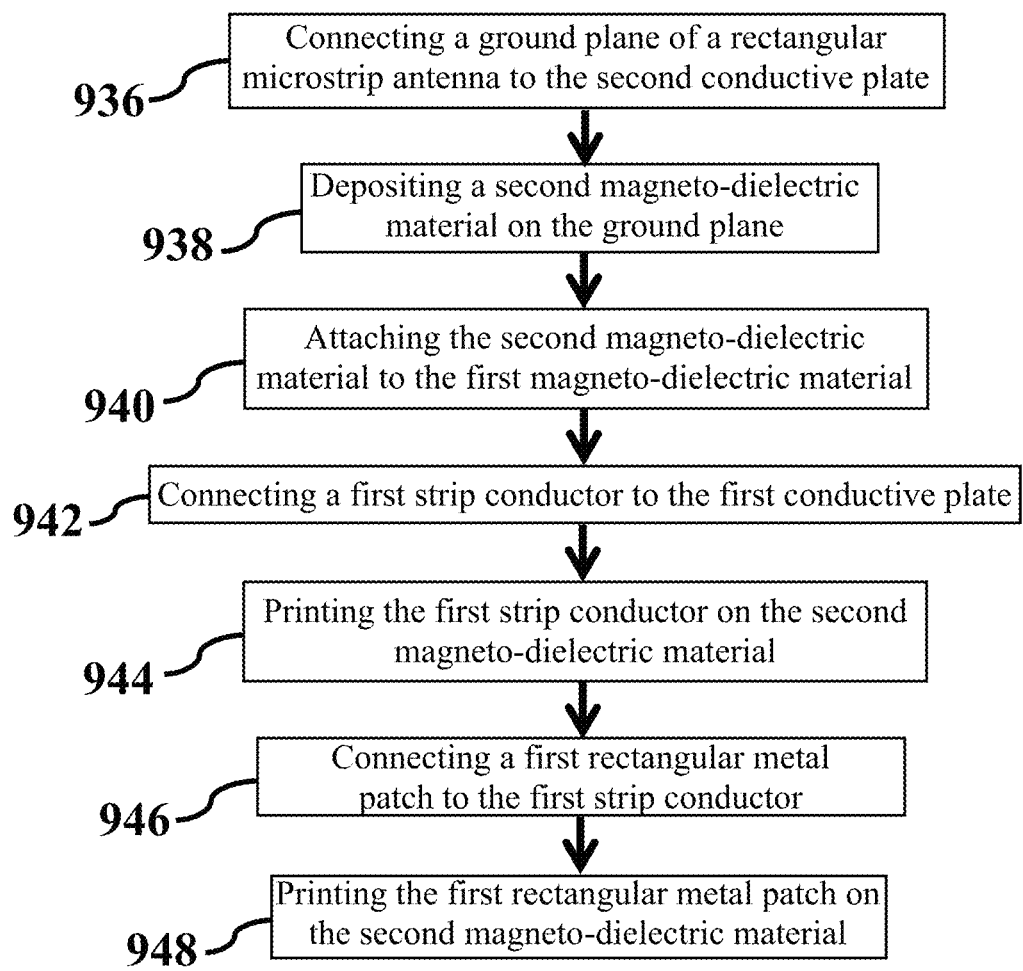
FIG. 9D shows a flowchart of a method for radiating a modulated microwave signal utilizing a rectangular microstrip antenna, consistent with one or more exemplary embodiments of the present disclosure.

In further detail with regard to step 906, FIG. 9D shows a flowchart of a method for radiating a modulated microwave signal utilizing a rectangular microstrip antenna, consistent with one or more exemplary embodiments of the present disclosure. Referring to FIGS. 8A-8C, 9A, and 9D, in an exemplary embodiment, a method 906A may include a first implementation of step 906. In an exemplary embodiment, method 906A may include radiating modulated microwave signal 808 utilizing rectangular microstrip antenna 804A. In an exemplary embodiment, method 906A may include connecting ground plane 810 to second conductive plate 408 (step 936), depositing second magneto-dielectric material 812 on ground plane 810 (step 938), attaching second magneto-dielectric material 812 to first magneto-dielectric material 406B (step 940), connecting first strip conductor 814 to first conductive plate 402 (step 942), printing first strip conductor 814 on second magneto-dielectric material 812 (step 944), connecting first rectangular metal patch 816 to first strip conductor 814 (step 946), and printing first rectangular metal patch 816 on second magneto-dielectric material 812 (step 948). In an exemplary embodiment, rectangular microstrip antenna 804A may radiate modulated microwave signal 808 in a plane perpendicular to a plane of first rectangular metal patch 816.

In an exemplary embodiment, step 936 may include connecting ground plane 810 to second conductive plate 408. In an exemplary embodiment, ground plane 810 may be connected to second conductive plate 408 by printing a seamless conductive plate on a bottom surface of first magneto-dielectric material 406B and a bottom surface of second magneto-dielectric material 812. An exemplary seamless conductive plate may include ground plane 810 and second conductive plate 408.

In an exemplary embodiment, step 938 may include depositing second magneto-dielectric material 812 on ground plane 810. In an exemplary embodiment, second magneto-dielectric material 812 may be deposited by deposition techniques such as chemical deposition and physical deposition. In an exemplary embodiment, depositing second magneto-dielectric material 812 may include setting a permittivity of second magneto-dielectric material 812 equal to a permittivity of first magneto-dielectric material 406B. In an exemplary embodiment, depositing second magneto-dielectric material 812 may further include setting a permeability of second magneto-dielectric material 812 equal to a permeability of first magneto-dielectric material 406B.

In an exemplary embodiment, step 940 may include attaching second magneto-dielectric material 812 to first magneto-dielectric material 406B. In an exemplary embodiment, second magneto-dielectric material 812 may be attached to first magneto-dielectric material 406B by depositing a single magneto-dielectric material on both second conductive plate 408 and ground plane 810.

In an exemplary embodiment, step 942 may include connecting first strip conductor 814 to first conductive plate 402. In an exemplary embodiment, connecting first strip conductor 814 to first conductive plate 402 may result in passing modulated microwave signal 808 from metamaterial switch 400 through rectangular microstrip antenna 804A. In an exemplary embodiment, first strip conductor 814 may be connected to first conductive plate 402 by printing a seamless conductive plate on first magneto-dielectric material 406B and second magneto-dielectric material 812. An exemplary seamless conductive plate may include first strip conductor 814 and first conductive plate 402.

In an exemplary embodiment, step 944 may include printing first strip conductor 814 on second magneto-dielectric material 812. In an exemplary embodiment, first strip conductor 814 may be printed on second magneto-dielectric material 812 by an inkjet printing method. An exemplary inkjet printing method may print first strip conductor 814 by printing a conductive ink on second magneto-dielectric material 812. An exemplary conductive ink may include nanoparticles of conductors such as copper, silver, and gold.

In an exemplary embodiment, step 946 may include connecting first rectangular metal patch 816 to first strip conductor 814. In an exemplary embodiment, connecting first rectangular metal patch 816 to first strip conductor 814 may configure first rectangular metal patch 816 to radiate modulated microwave signal 808. In an exemplary embodiment, first rectangular metal patch 816 may be connected to first strip conductor 814 by printing a seamless conductive plate on second magneto-dielectric material 812. An exemplary seamless conductive plate may include first strip conductor 814 and first rectangular metal patch 816.

In an exemplary embodiment, step 948 may include printing first rectangular metal patch 816 on second magneto-dielectric material 812. In an exemplary embodiment, first rectangular metal patch 816 may be printed on second magneto-dielectric material 812 by an inkjet printing method. An exemplary inkjet printing method may print first rectangular metal patch 816 by printing a conductive ink on second magneto-dielectric material 812. An exemplary conductive ink may include nanoparticles of conductors such as copper, silver, and gold.

Figure 9E:
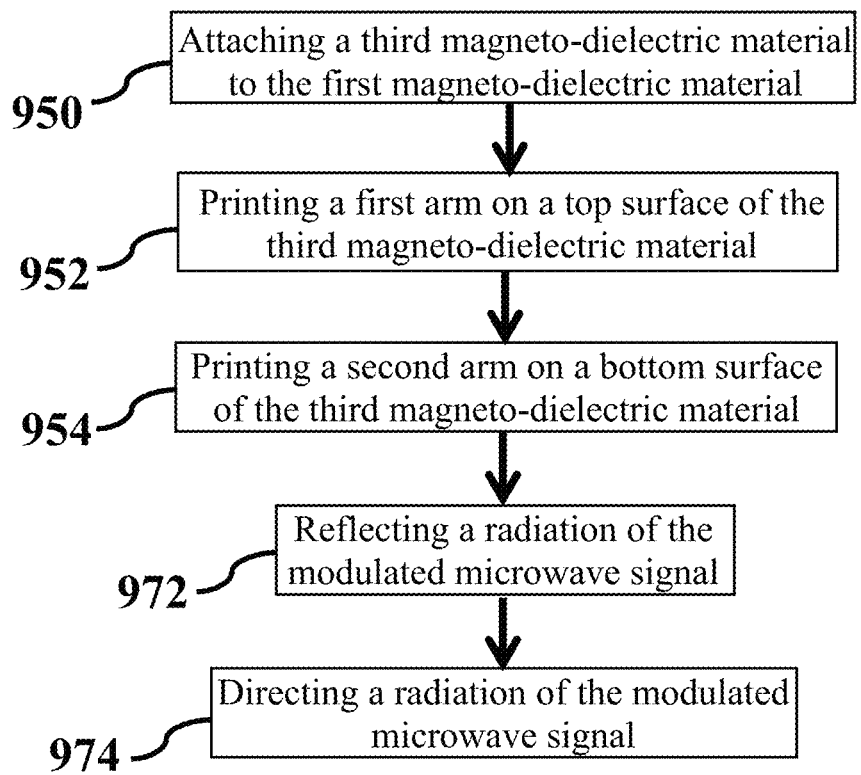
FIG. 9E shows a flowchart of a method for radiating a modulated microwave signal utilizing a dipole microstrip antenna, consistent with one or more exemplary embodiments of the present disclosure.

FIG. 9E shows a flowchart of a method for radiating a modulated microwave signal utilizing a dipole microstrip antenna, consistent with one or more exemplary embodiments of the present disclosure. Specifically, FIG. 9E provides exemplary details of step 906. Referring to FIGS. 8A, 8D-8F, 9A, and 9E, in an exemplary embodiment, method 906B may include a second implementation of step 906. In an exemplary embodiment, method 906B may include radiating modulated microwave signal 808 utilizing dipole microstrip antenna 804B. In an exemplary embodiment, method 906B may include attaching third magneto-dielectric material 818 to first magneto-dielectric material 406B (step 950), printing first arm 817 on a top surface 840 of third magneto-dielectric material 818 (step 952), and printing second arm 819 on a bottom surface 842 of third magneto-dielectric material 818 (step 954).

In further detail regarding step 950, in an exemplary embodiment, attaching third magneto-dielectric material 818 to first magneto-dielectric material 406B may include setting a permittivity of third magneto-dielectric material 818 equal to a permittivity of first magneto-dielectric material 406B. In an exemplary embodiment, attaching third magneto-dielectric material 818 to first magneto-dielectric material 406B may further include setting a permeability of third magneto-dielectric material 818 equal to a permeability of first magneto-dielectric material 406B. In an exemplary embodiment, third magneto-dielectric material 818 may be attached to first magneto-dielectric material 406B by fabricating a seamless magneto-dielectric material to implement both second conductive plate 408 and ground plane 810.

Figure 9F:
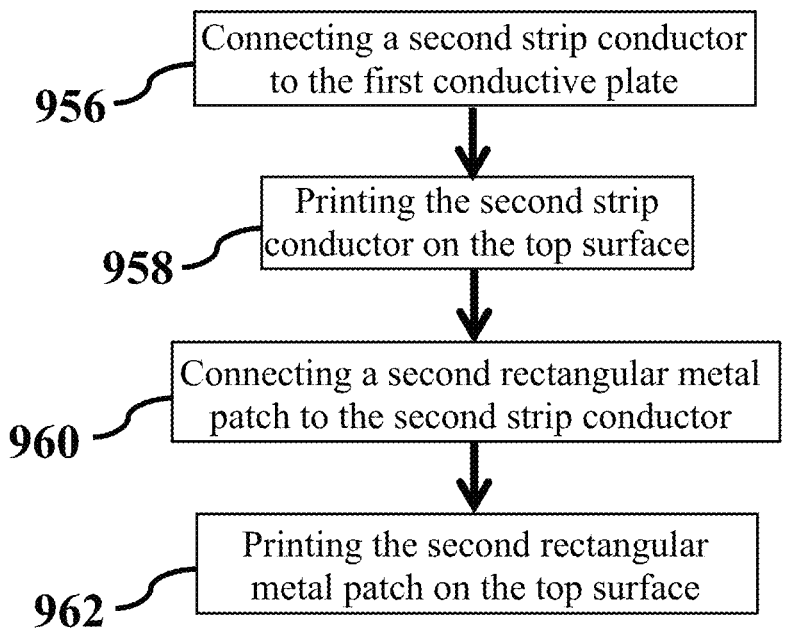
FIG. 9F shows a flowchart of a method for printing a first arm on a top surface, consistent with one or more exemplary embodiments of the present disclosure.

For further detail with respect to step 952, FIG. 9F shows a flowchart of a method for printing a first arm on a top surface, consistent with one or more exemplary embodiments of the present disclosure. Referring to FIGS. 8D-8F and 9F, in an exemplary embodiment, step 952 may include printing first arm 817 on top surface 840. In an exemplary embodiment, printing first arm 817 on top surface 840 may include connecting second strip conductor 820 to first conductive plate 402 (step 956), printing second strip conductor 820 on top surface 840 (step 958), connecting second rectangular metal patch 822 to second strip conductor 820 (step 960), and printing second rectangular metal patch 822 on top surface 840 (step 962).

For further detail with respect to step 956, in an exemplary embodiment, connecting second strip conductor 820 to first conductive plate 402 may result in passing modulated microwave signal 808 from metamaterial switch 400 through dipole microstrip antenna 804B. In an exemplary embodiment, second strip conductor 830 may be connected to first conductive plate 402 by printing a seamless conductive plate on first magneto-dielectric material 406B and third magneto-dielectric material 818. An exemplary seamless conductive plate may include second strip conductor 820 and first conductive plate 402.

In an exemplary embodiment, step 958 may include printing second strip conductor 820 on top surface 840. In an exemplary embodiment, second strip conductor 820 may be printed on top surface 840 by an inkjet printing method. An exemplary inkjet printing method may print second strip conductor 820 by printing a conductive ink on top surface 840. An exemplary conductive ink may include nanoparticles of conductors such as copper, silver, and gold.

In an exemplary embodiment, step 960 may include connecting second rectangular metal patch 822 to second strip conductor 820. In an exemplary embodiment, connecting second rectangular metal patch 822 to second strip conductor 820 may configure second rectangular metal patch 822 to radiate modulated microwave signal 808. In an exemplary embodiment, second rectangular metal patch 822 may be connected to second strip conductor 820 by printing a seamless conductive plate on top surface 840. An exemplary seamless conductive plate may include second strip conductor 820 and second rectangular metal patch 822.

In an exemplary embodiment, step 962 may include printing second rectangular metal patch 822 on top surface 840. In an exemplary embodiment, second rectangular metal patch 822 may be printed on top surface 840 by an inkjet printing method. An exemplary inkjet printing method may print second rectangular metal patch 822 by printing a conductive ink on top surface 840. An exemplary conductive ink may include nanoparticles of conductors such as copper, silver, and gold.

Figure 9G:
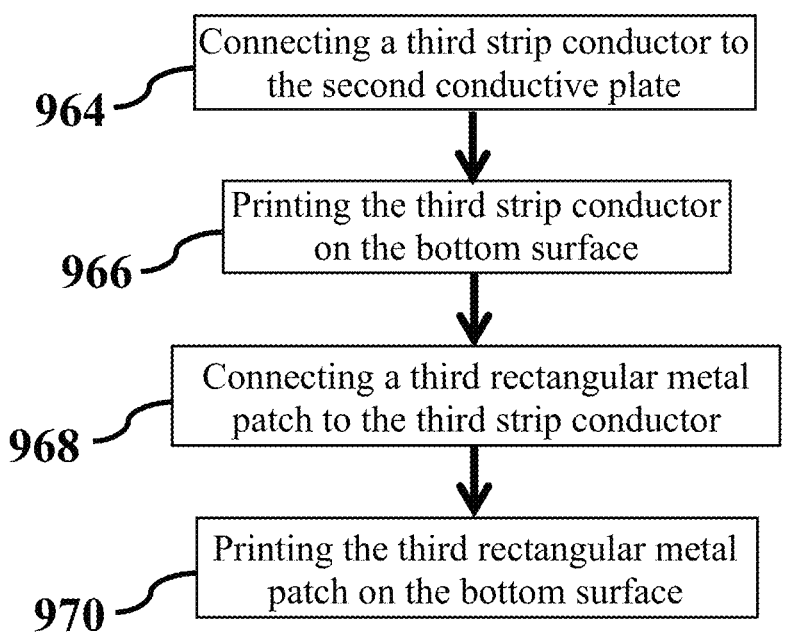
FIG. 9G shows a flowchart of a method for printing a second arm on a bottom surface, consistent with one or more exemplary embodiments of the present disclosure.

FIG. 9G shows a flowchart of a method for printing a second arm on a bottom surface, consistent with one or more exemplary embodiments of the present disclosure. Specifically, FIG. 9G provides exemplary details of step 954. Referring to FIGS. 8D-8F, 9E, and 9G, in an exemplary embodiment, step 954 may include printing second arm 819 on bottom surface 842. In an exemplary embodiment, printing second arm 819 on bottom surface 842 may include connecting third strip conductor 824 to second conductive plate 408 (step 964), printing third strip conductor 824 on bottom surface 842 (step 966), connecting third rectangular metal patch 826 to third strip conductor 824 (step 968), and printing third rectangular metal patch 826 on bottom surface 842 (step 970).

For further detail with respect to step 964, in an exemplary embodiment, connecting third strip conductor 824 to second conductive plate 408 may result in passing modulated microwave signal 808 from metamaterial switch 400 through dipole microstrip antenna 804B. In an exemplary embodiment, third strip conductor 824 may be connected to second conductive plate 408 by printing a seamless conductive plate on first magneto-dielectric material 406B and third magneto-dielectric material 818. An exemplary seamless conductive plate may include third strip conductor 824 and second conductive plate 408.

In an exemplary embodiment, step 966 may include printing third strip conductor 824 on bottom surface 842. In an exemplary embodiment, third strip conductor 824 may be printed on bottom surface 842 by an inkjet printing method. An exemplary inkjet printing method may print third strip conductor 824 by printing a conductive ink on bottom surface 842. An exemplary conductive ink may include nanoparticles of conductors such as copper, silver, and gold.

In an exemplary embodiment, step 968 may include connecting third rectangular metal patch 826 to third strip conductor 824. In an exemplary embodiment, connecting third rectangular metal patch 826 to third strip conductor 824 may configure third rectangular metal patch 826 to radiate modulated microwave signal 808. In an exemplary embodiment, third rectangular metal patch 826 may be connected to third strip conductor 824 by printing a seamless conductive plate on bottom surface 842. An exemplary seamless conductive plate may include third strip conductor 824 and third rectangular metal patch 826.

In an exemplary embodiment, step 970 may include printing third rectangular metal patch 826 on bottom surface 842. In an exemplary embodiment, third rectangular metal patch 826 may be printed on bottom surface 842 by an inkjet printing method. An exemplary inkjet printing method may print third rectangular metal patch 826 by printing a conductive ink on bottom surface 842. An exemplary conductive ink may include nanoparticles of conductors such as copper, silver, and gold.

Referring again to FIG. 9E, radiating modulated microwave signal 808 utilizing dipole microstrip antenna 804B (method 906B) may further include reflecting a radiation of modulated microwave signal 808 (step 972), and directing a radiation of modulated microwave signal 808 (step 974). In further detail with respect to step 972, in an exemplary embodiment, reflecting a radiation of modulated microwave signal 808 may include printing first reflector patch 832 on a left-side of second strip conductor 820. In an exemplary embodiment, first reflector patch 832 may be printed on a left side of second strip conductor 820 by an inkjet printing method. An exemplary inkjet printing method may print first reflector patch 832 by printing a conductive ink on top surface 840. An exemplary conductive ink may include nanoparticles of conductors such as copper, silver, and gold.

In an exemplary embodiment, reflecting a radiation of modulated microwave signal 808 (step 972) may further include printing second reflector patch 834 on a right side of second strip conductor 820. In an exemplary embodiment, second reflector patch 834 may be printed on a left side of second strip conductor 820 by an inkjet printing method. An exemplary inkjet printing method may print second reflector patch 834 by printing a conductive ink on top surface 840. An exemplary conductive ink may include nanoparticles of conductors such as copper, silver, and gold.

In an exemplary embodiment, reflecting a radiation of modulated microwave signal 808 (step 972) may further include printing third reflector patch 836 on a right side of third strip conductor 824. In an exemplary embodiment, third reflector patch 836 may be printed on a right side of third strip conductor 824 by an inkjet printing method. An exemplary inkjet printing method may print third reflector patch 836 by printing a conductive ink on bottom surface 842. An exemplary conductive ink may include nanoparticles of conductors such as copper, silver, and gold.

In an exemplary embodiment, reflecting a radiation of modulated microwave signal 808 (step 972) may further include printing fourth reflector patch 838 on a left side of third strip conductor 824. In an exemplary embodiment, fourth reflector patch 838 may be printed on a left side of third strip conductor 824 by an inkjet printing method. An exemplary inkjet printing method may print fourth reflector patch 838 by printing a conductive ink on bottom surface 842. An exemplary conductive ink may include nanoparticles of conductors such as copper, silver, and gold.

In an exemplary embodiment, step 974 may include directing a radiation of modulated microwave signal 808. In an exemplary embodiment, a radiation of modulated microwave signal 808 may be directed in a plane parallel with second rectangular metal patch 822. In an exemplary embodiment, a radiation of modulated microwave signal 808 may be directed by printing plurality of director patches 828 on top surface 840 and in parallel with second rectangular metal patch 822. In an exemplary embodiment, plurality of director patches 828 may be printed by an inkjet printing method. An exemplary inkjet printing method may print plurality of director patches 828 by printing a conductive ink on top surface 840. An exemplary conductive ink may include nanoparticles of conductors such as copper, silver, and gold.

Figure 10:
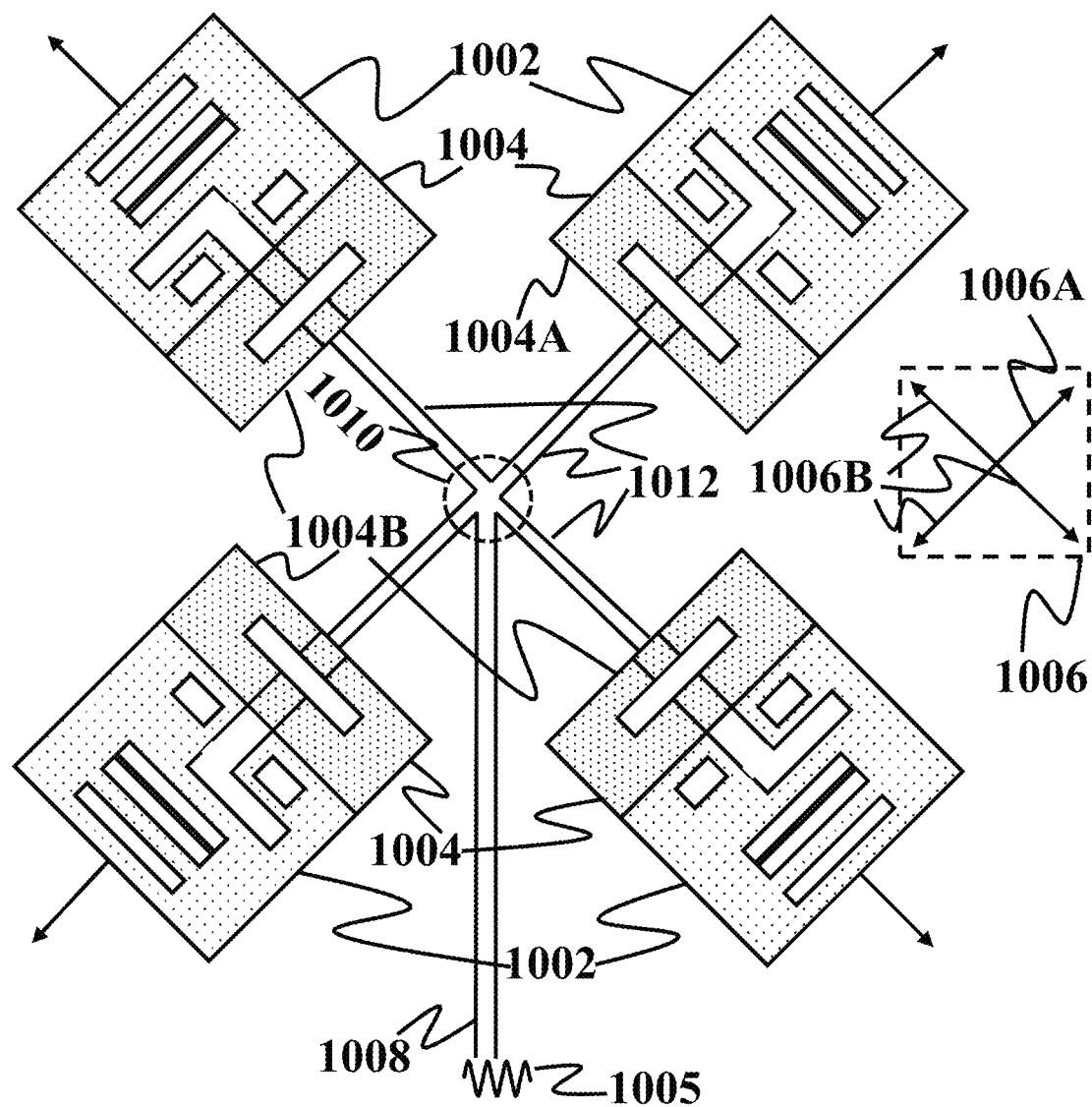
FIG. 10 shows a system for EMNZ metamaterial-based switched-beam array antenna, consistent with one or more exemplary embodiments of the present disclosure.

FIG. 10 shows a system for EMNZ metamaterial-based switched-beam array antenna, consistent with one or more exemplary embodiments of the present disclosure. An exemplary switched-beam array may direct a radiation pattern of a microwave signal to a predetermined direction by routing the microwave signal to a predetermined antenna of an antenna array. Each antenna of the antenna array may be directed in a respective direction. As a result, a radiation of the microwave signal may be directed by routing a microwave signal to a predetermined antenna of the antenna array. Routing the microwave signal may be performed by a plurality of switches that are coupled with antenna array. An exemplary radiation pattern of the microwave signal may be directed in a predetermined direction when a respective switch that is coupled with the predetermined antenna is closed and other switches are open.

In an exemplary embodiment, an EMNZ metamaterial-based switched-beam array antenna 1000 may include a plurality of antennas 1002 and a plurality of metamaterial switches 1004. In an exemplary embodiment, plurality of antennas 1002 may be configured to radiate a microwave signal 1005. In an exemplary embodiment, each of plurality of antennas 1002 may be aligned with a respective direction of a plurality of directions 1006, that is, a main lobe of each of plurality of antennas 1002 may be aligned with a respective direction of a plurality of directions 1006. In an exemplary embodiment, each direction of plurality of directions 1006 may be aligned with a respective azimuth angle of a plurality of azimuth angles. In an exemplary embodiment, plurality of directions 1006 may include a predetermined direction 1006A and a direction set 1006B. In an exemplary embodiment, a radiation pattern of EMNZ metamaterial-based switched-beam array antenna 1000 may be determined to include a main lobe in predetermined direction 1006A. In an exemplary embodiment, an angular resolution of directing the radiation pattern may depend on a number of plurality of antennas 1002. In an exemplary embodiment, EMNZ metamaterial-based switched-beam array antenna 1000 may direct the radiation pattern with an accuracy of 360/M degrees, where M is a number of plurality of antennas 1002. As a result, an angular resolution of EMNZ metamaterial-based switched-beam array antenna 1000 may increase when EMNZ metamaterial-based switched-beam array antenna 1000 includes a larger number of plurality of antennas 1002.

In an exemplary embodiment, the plurality of metamaterial switches 1004 may include a predetermined metamaterial switch 1004A and a metamaterial switch set 1004B. In an exemplary embodiment, plurality of metamaterial switches 1004 may be configured to direct a radiation of the microwave signal to predetermined direction 1006A. In an exemplary embodiment, each of plurality of metamaterial switches 1004 may be coupled with a respective antenna of plurality of antennas 1002. In an exemplary embodiment, to direct the radiation pattern in predetermined direction 1006A, predetermined metamaterial switch 1004A may pass microwave signal 1005 to a respective antenna and each metamaterial switch in metamaterial switch set 1004B may block microwave signal 1005.

In an exemplary embodiment, predetermined metamaterial switch 1004A may be configured to direct a radiation of microwave signal 1005 to predetermined direction 1006A by being closed. In an exemplary embodiment, each respective metamaterial switch in metamaterial switch set 1004B may be configured to block microwave signal 1005 from a respective direction in direction set 1006B by being open.

Referring again to FIGS. 4A, 4C, and 10, in an exemplary embodiment, predetermined metamaterial switch 1004A may be similar to one of metamaterial switch 400 and metamaterial switch 400A. In an exemplary embodiment, predetermined metamaterial switch 1004A may be configured to be open by setting each of a first tunable conductivity of a first graphene monolayer and a second tunable conductivity of a second graphene monolayer to be larger than a conductivity threshold. In an exemplary embodiment, the first graphene monolayer may be similar to first graphene monolayer 430. In an exemplary embodiment, the second graphene monolayer may be similar to second graphene monolayer 432. In an exemplary embodiment, each of the first tunable conductivity and the second tunable conductivity may be configured to be set larger than the conductivity threshold by applying a first electric potential to each of the first graphene monolayer and the second graphene monolayer.

In an exemplary embodiment, each metamaterial switch in metamaterial switch set 1004B may be similar to one of metamaterial switch 400 and metamaterial switch 400A. In an exemplary embodiment, each metamaterial switch in metamaterial switch set 1004B may be configured to be open by setting each of a first tunable conductivity of a first graphene monolayer and a second tunable conductivity of a second graphene monolayer smaller than a conductivity threshold. In an exemplary embodiment, the first graphene monolayer may be similar to first graphene monolayer 430. In an exemplary embodiment, the second graphene monolayer may be similar to second graphene monolayer 432. In an exemplary embodiment, each of the first tunable conductivity and the second tunable conductivity may be configured to be set smaller than the conductivity threshold by applying a second electric potential to each of the first graphene monolayer and the second graphene monolayer.

In an exemplary embodiment, EMNZ metamaterial-based switched-beam array antenna 1000 may further include an array feed line 1008, a power splitter 1010, and a plurality of antenna feed lines 1012. In an exemplary embodiment, power splitter 1010 may be configured to receive the microwave signal from array feed line 1008. In an exemplary embodiment, plurality of antenna feed lines 1012 may be connected to power splitter 1008. In an exemplary embodiment, each of plurality antenna feed lines 1012 may be configured to receive the microwave signal from power splitter 1008 and transmit the microwave signal to a respective metamaterial switch of plurality of metamaterial switches 1004. In an exemplary embodiment, each of plurality of antennas 1002 may include dipole microstrip antenna 804B.

Figure 11:
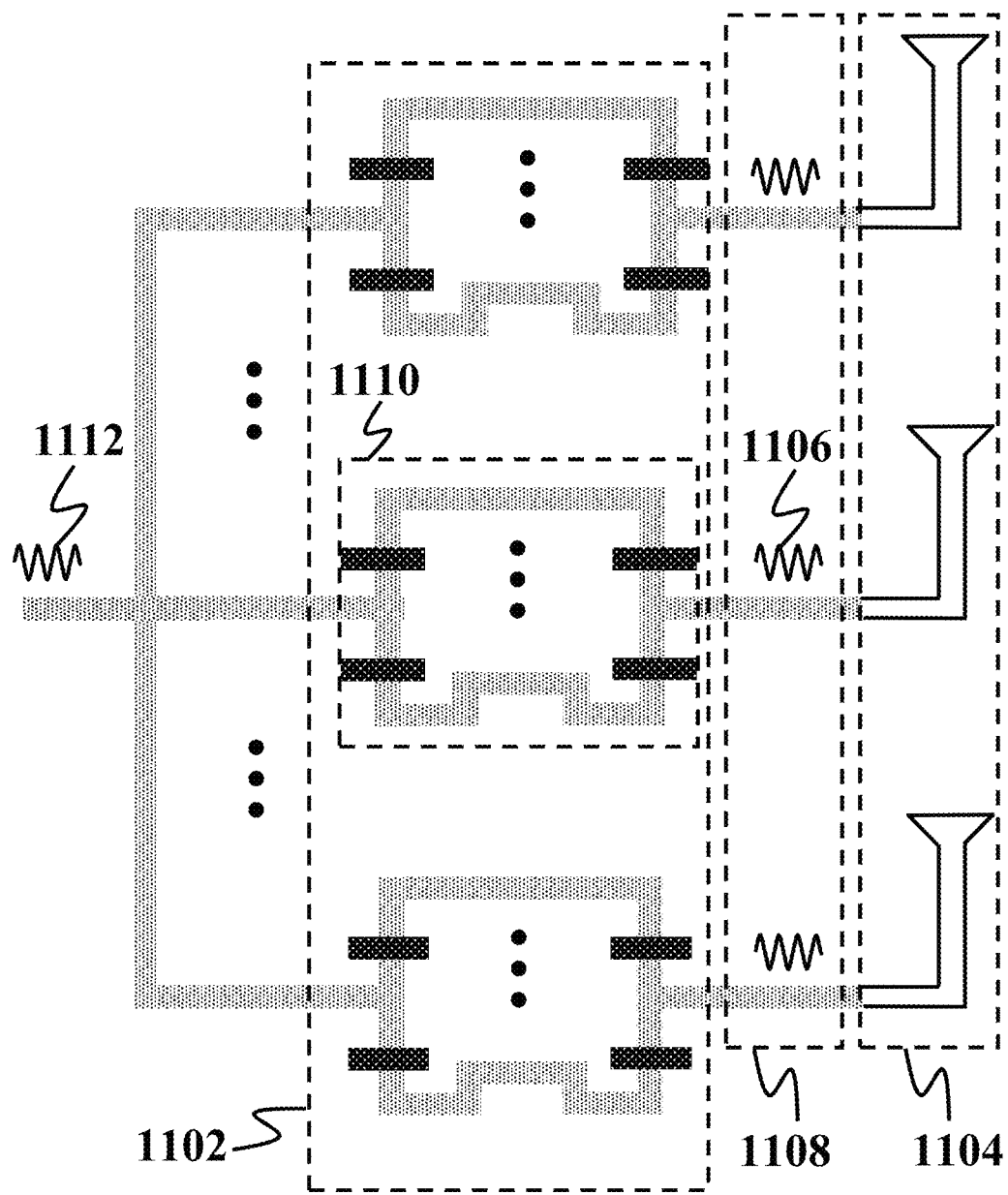
FIG. 11 shows a schematic of an EMNZ metamaterial-based phased array antenna, consistent with one or more exemplary embodiments of the present disclosure.

FIG. 11 shows a schematic of an EMNZ metamaterial-based phased array antenna, consistent with one or more exemplary embodiments of the present disclosure. In an exemplary embodiment, an EMNZ metamaterial-based phased array antenna 1100 may include a plurality of metamaterial phase shifters 1102 and a plurality of antennas 1104.

Figure 12A:
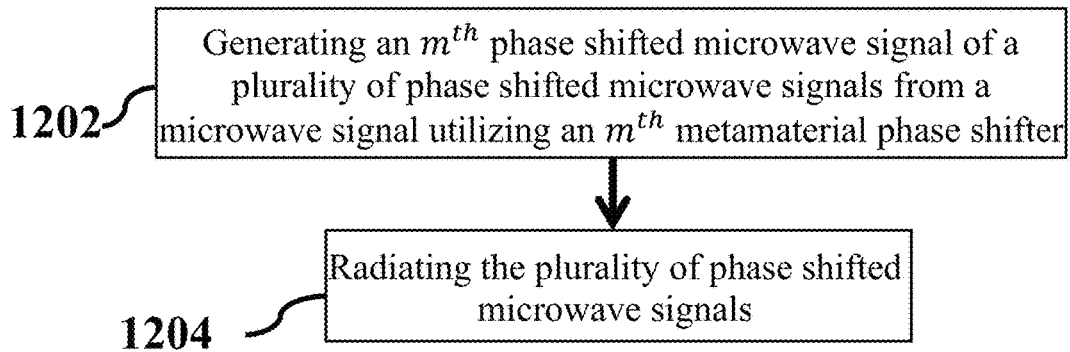
FIG. 12A shows a flowchart of a method for forming a radiation pattern of an EMNZ metamaterial-based phased array antenna, consistent with one or more exemplary embodiments of the present disclosure.

FIG. 12A shows a flowchart of a method for forming a radiation pattern of an EMNZ metamaterial-based phased array antenna, consistent with one or more exemplary embodiments of the present disclosure. In an exemplary embodiment, a method 1200 may include generating an $m^{th}$ phase shifted microwave signal 1106 of a plurality of phase shifted microwave signals 1108 (step 1202) and radiating plurality of phase shifted microwave signals 1108 (step 1204). In an exemplary embodiment, different steps of method 1200 may be implemented utilizing EMNZ metamaterial-based phased array antenna 1100.

Referring to FIGS. 11 and 12A, in an exemplary embodiment step 1202 may include generating $m^{th}$ phase shifted microwave signal 1106. In an exemplary embodiment, $m^{th}$ phase shifted microwave signal 1106 may be generated utilizing an $m^{th}$ metamaterial phase shifter 1110 of plurality of metamaterial phase shifters 1102. In an exemplary embodiment, $m^{th}$ metamaterial phase shifter 1110 may be similar to metamaterial phase shifter 700. In an exemplary embodiment, $m^{th}$ phase shifted microwave signal 1106 may be generated by applying an $m^{th}$ phase shift of a plurality of phase shifts on a microwave signal 1112 where $1 \leq m \leq M$ and M is a number of plurality of metamaterial phase shifters 1102. In an exemplary embodiment, the radiation pattern may change by changing the plurality of phase shifts. To achieve an exemplary radiation pattern, the plurality of phase shifts may be obtained accordingly. In an exemplary embodiment, obtaining the plurality of phase shifts may depend on characteristics of an exemplary radiation pattern such as main lobe and side lobe levels. In an exemplary embodiment, the values of the plurality of phase shifts may be determined based on a geometry of an arrangement of plurality of antennas 1104. In an exemplary embodiment, plurality of antennas 1104 may be arranged in one of a linear, a planar, and a circular arrangement. In an exemplary embodiment, EMNZ metamaterial-based phased array antenna 1100 may include a linear array antenna. In an exemplary embodiment, for steering a radiation pattern of EMNZ metamaterial-based phased array antenna 1100, an $n^{th}$ phase shift of the plurality of phase shifts may be set to $$\frac{2\pi}{\lambda}(n-1)\sin\theta$$

to point the radiation pattern to an azimuth angle $\theta$ where $\lambda$ is an operating wavelength of EMNZ metamaterial-based phased array antenna 1100.

Figure 12B:
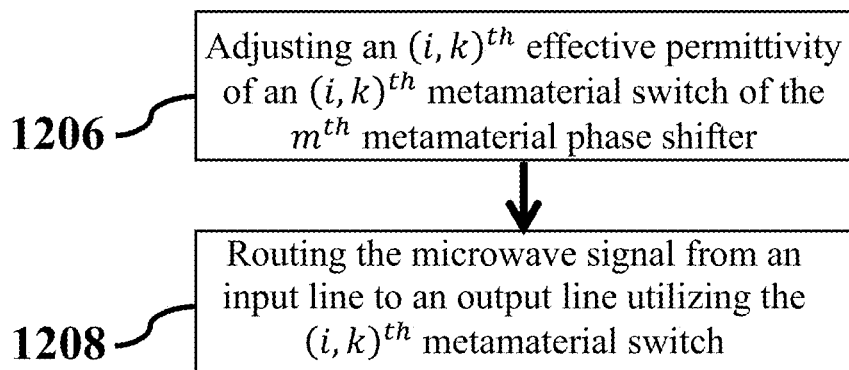
FIG. 12B shows a flowchart of a method for applying an $m^{th}$ phase shift on a microwave signal, consistent with one or more exemplary embodiments of the present disclosure.

FIG. 12B shows a flowchart of a method for applying an $m^{th}$ phase shift on a microwave signal, consistent with one or more exemplary embodiments of the present disclosure. Referring to FIGS. 11, 12A, and 12B, in an exemplary embodiment, applying the $m^{th}$ phase shift (step 1202) may include adjusting an $(i, k)^{th}$ effective permittivity of an $(i, k)^{th}$ metamaterial switch (step 1206) and routing microwave signal 1106 from an input line of $m^{th}$ metamaterial phase shifter 1110 to an output line of $m^{th}$ metamaterial phase shifter 1110 (step 1208). In an exemplary embodiment, the $(i, k)^{th}$ metamaterial switch may be similar to one of metamaterial switch 400 and stripline metamaterial switch 400A.

Figure 12C:
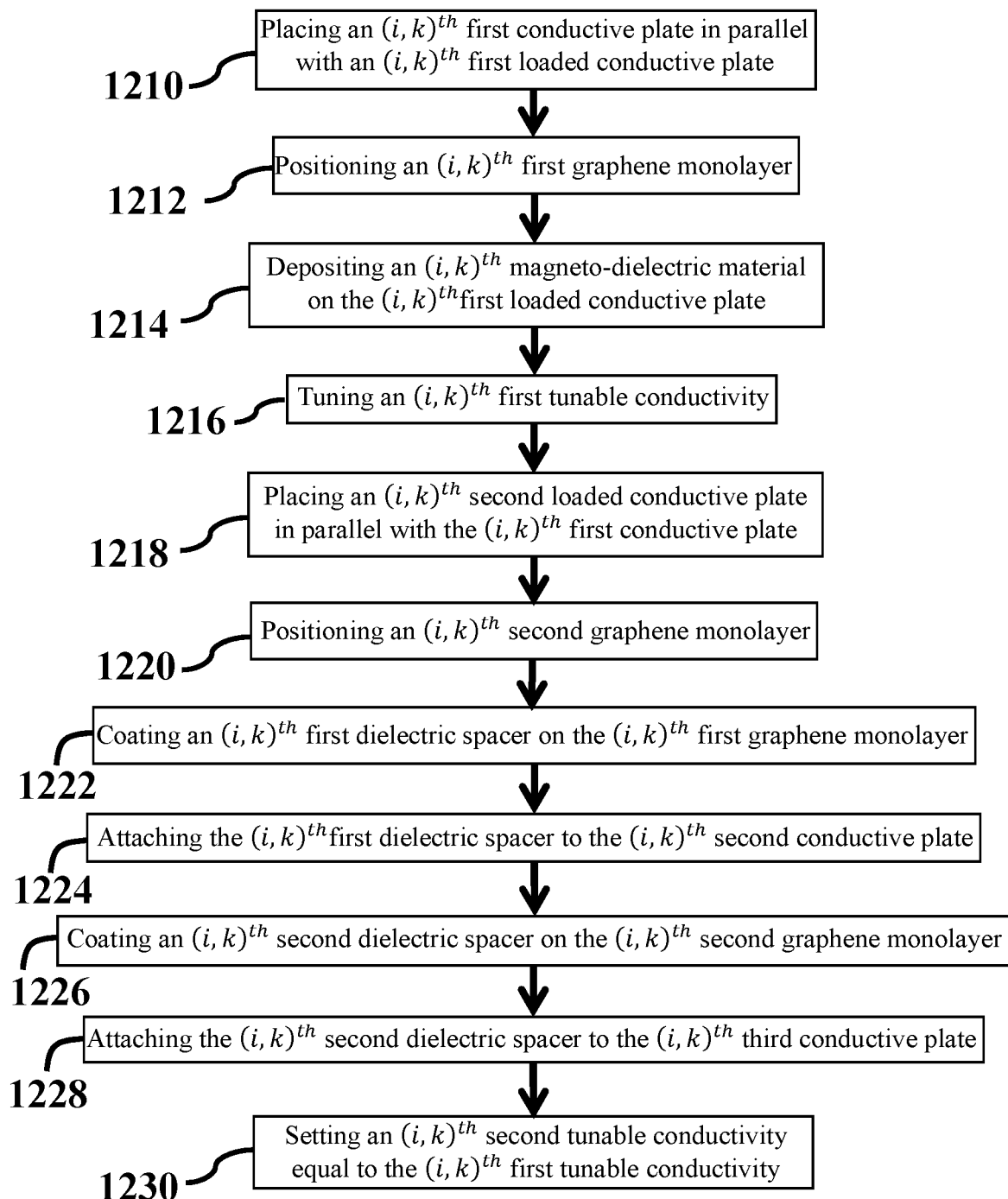
FIG. 12C shows a flowchart of a method for adjusting an $(i, k)^{th}$ effective permittivity of an $(i, k)^{th}$ metamaterial switch, consistent with one or more exemplary embodiments of the present disclosure.

FIG. 12C shows a flowchart of a method for adjusting an $(i, k)^{th}$ effective permittivity of an $(i, k)^{th}$ metamaterial switch, consistent with one or more exemplary embodiments of the present disclosure. In further detail with respect to step 1206, in an exemplary embodiment, adjusting the $(i, k)^{th}$ effective permittivity of the $(i, k)^{th}$ metamaterial switch may include placing an $(i, k)^{th}$ first conductive plate of the $(i, k)^{th}$ metamaterial switch (step 1210), positioning an $(i, k)^{th}$ first graphene monolayer of the $(i, k)^{th}$ metamaterial switch (step 1212), depositing an $(i, k)^{th}$ magneto-dielectric material of the $(i, k)^{th}$ metamaterial switch (step 1214), and tuning an $(i, k)^{th}$ first tunable conductivity of the $(i, k)^{th}$ first graphene monolayer (step 1216).

Referring again to FIGS. 4A, 4B, 11 and 12C, in an exemplary embodiment, step 1210 may include placing the $(i, k)^{th}$ first conductive plate in parallel with the $(i, k)^{th}$ first loaded conductive plate. An exemplary $(i, k)^{th}$ first conductive plate may be similar to first conductive plate 402. An exemplary first loaded conductive plate 404. In an exemplary embodiment, the $(i, k)^{th}$ metamaterial switch may be integrated with a transmission line such as a microstrip. An exemplary transmission line may include two parallel conductive plates that facilitate a transmission of microwave signal 1112. As a result, the $(i, k)^{th}$ first conductive plate may be placed in parallel with the $(i, k)^{th}$ first loaded conductive plate to be integrated with parallel conductive plates of a transmission line crossing the $(i, k)^{th}$ metamaterial switch. In an exemplary embodiment, placing the $(i, k)^{th}$ first conductive plate may include vertically positioning the $(i, k)^{th}$ first conductive plate between the first loaded conductive plate and an $(i, k)^{th}$ second loaded conductive plate of the $(i, k)^{th}$ metamaterial switch. An exemplary $(i, k)^{th}$ second loaded conductive plate may be similar to second loaded conductive plate 412. In an exemplary embodiment, the $(i, k)^{th}$ first conductive plate may include a strip conductor of a stripline. In an exemplary embodiment, the $(i, k)^{th}$ first loaded conductive plate may include a first ground plane of the stripline. An exemplary $(i, k)^{th}$ second loaded conductive plate may include a second ground plane of the stripline. An exemplary strip conductor of a stripline may be vertically positioned between a first ground plane of the stripline and a second ground plane of the stripline. As a result, in an exemplary embodiment, the $(i, k)^{th}$ first conductive plate may be vertically positioned between the $(i, k)^{th}$ first loaded conductive plate and the $(i, k)^{th}$ second loaded conductive plate.

In an exemplary embodiment, placing the $(i, k)^{th}$ first conductive plate (step 1210) may further include horizontally positioning the $(i, k)^{th}$ first conductive plate between a respective proximal end and a respective distal end of each of the $(i, k)^{th}$ first graphene monolayer and an $(i, k)^{th}$ second graphene monolayer of the $(i, k)^{th}$ metamaterial switch. An exemplary $(i, k)^{th}$ first graphene monolayer may be similar to first graphene monolayer 430. An exemplary $(i, k)^{th}$ second graphene monolayer may be similar to second graphene monolayer 432. In an exemplary embodiment, when cross-sections of the $(i, k)^{th}$ first graphene monolayer and the $(i, k)^{th}$ second graphene monolayer are larger than a cross section of the $(i, k)^{th}$ first conductive plate, microwave signal 1112 may be blocked through the entirety of a cross section of the $(i, k)^{th}$ metamaterial switch and may not pass through a right side or a left side of a cross section of the $(i, k)^{th}$ metamaterial switch. As a result, in an exemplary embodiment, an isolation of the $(i, k)^{th}$ metamaterial switch may increase.

In an exemplary embodiment, step 1212 may include positioning the $(i, k)^{th}$ first graphene monolayer between the $(i, k)^{th}$ first conductive plate and the $(i, k)^{th}$ second conductive plate. In an exemplary embodiment, the $(i, k)^{th}$ first conductive plate may include a strip conductor of an underlying transmission line and the $(i, k)^{th}$ second conductive plate may include a ground plane of the underlying transmission line. As a result, in an exemplary embodiment, positioning the $(i, k)^{th}$ first graphene monolayer between the $(i, k)^{th}$ first conductive plate and the $(i, k)^{th}$ second conductive plate may result in an EMNZ medium between the $(i, k)^{th}$ first conductive plate and the $(i, k)^{th}$ second conductive plate when a tunable conductivity of the $(i, k)^{th}$ first graphene monolayer is tuned to a predetermined value. An exemplary EMNZ medium may block microwave signal 1112 to pass through the underlying transmission line.

In an exemplary embodiment, step 1214 may include depositing the $(i, k)^{th}$ magneto-dielectric material on the $(i, k)^{th}$ first loaded conductive plate. An exemplary $(i, k)^{th}$ magneto-dielectric material may be similar to magneto-dielectric material 406. In an exemplary embodiment, the $(i, k)^{th}$ first magneto-dielectric material may be deposited by deposition techniques such as chemical deposition and physical deposition. Chemical deposition may cause a chemical change in a fluid on a solid surface, resulting in a solid layer. Physical deposition may utilize mechanical, electromechanical or thermodynamic means to produce a solid layer.

In an exemplary embodiment, step 1216 may include tuning the $(i, k)^{th}$ first tunable conductivity of the $(i, k)^{th}$ first graphene monolayer. In an exemplary embodiment, an $(i, k)^{th}$ effective permittivity of the $(i, k)^{th}$ metamaterial switch may be controlled by tuning the $(i, k)^{th}$ first tunable conductivity. In an exemplary embodiment, the $(i, k)^{th}$ first tunable conductivity may be electrically tuned to different values by applying different electric potentials to the $(i, k)^{th}$ first graphene monolayer corresponding to different values of the $(i, k)^{th}$ first tunable conductivity. In an exemplary embodiment, applying a first electric potential to the $(i, k)^{th}$ first graphene monolayer may tune the $(i, k)^{th}$ effective permittivity to be near-zero. As a result, the $(i, k)^{th}$ metamaterial switch may become an EMNZ metamaterial cell that blocks microwave signal 1112. On the other hand, in an exemplary embodiment, applying a second electric potential may tune the $(i, k)^{th}$ effective permittivity to be larger than zero. As a result, the $(i, k)^{th}$ metamaterial switch may pass microwave signal 1112.

In an exemplary embodiment, adjusting the $(i, k)^{th}$ effective permittivity (step 1206) may further include placing an $(i, k)^{th}$ second loaded conductive plate in parallel with the $(i, k)^{th}$ second conductive plate (step 1218), positioning the $(i, k)^{th}$ second graphene monolayer between the $(i, k)^{th}$ first conductive plate and an $(i, k)^{th}$ third conductive plate of the $(i, k)^{th}$ metamaterial switch (step 1220), coating an $(i, k)^{th}$ first dielectric spacer of the $(i, k)^{th}$ metamaterial switch on the $(i, k)^{th}$ first graphene monolayer (step 1222), attaching the $(i, k)^{th}$ first dielectric spacer to the $(i, k)^{th}$ second conductive plate (step 1224), coating an $(i, k)^{th}$ second dielectric spacer of the $(i, k)^{th}$ metamaterial switch on the $(i, k)^{th}$ second graphene monolayer (step 1226), attaching the $(i, k)^{th}$ second dielectric spacer to the $(i, k)^{th}$ third conductive plate (step 1228), and setting a second tunable conductivity of the $(i, k)^{th}$ second graphene monolayer equal to the first tunable conductivity (step 1230). An exemplary $(i, k)^{th}$ second loaded conductive plate may be similar to second loaded conductive plate 412. An exemplary $(i, k)^{th}$ third conductive plate may be similar to third conductive plate 414. An exemplary $(i, k)^{th}$ first dielectric spacer may be similar to first dielectric spacer 434. An exemplary $(i, k)^{th}$ second dielectric spacer may be similar to second dielectric spacer 436. In an exemplary embodiment, the $(i, k)^{th}$ metamaterial switch may be implemented through a stripline. An exemplary stripline may include an additional ground plane compared with a microstrip. As a result, in an exemplary embodiment, adjusting the $(i, k)^{th}$ effective permittivity may include additional steps compared with adjusting the $(i, k)^{th}$ effective permittivity when the $(i, k)^{th}$ metamaterial switch is implemented utilizing a microstrip.

In an exemplary embodiment, step 1218 may include placing the $(i, k)^{th}$ second loaded conductive plate in parallel with the $(i, k)^{th}$ second conductive plate. In an exemplary embodiment, the $(i, k)^{th}$ metamaterial switch may be integrated with a stripline. An exemplary stripline may include two parallel ground planes that facilitate a transmission of microwave signal 1112. In an exemplary embodiment, the $(i, k)^{th}$ first loaded conductive plate may include a first ground plane of a stripline. In an exemplary embodiment, the $(i, k)^{th}$ second loaded conductive plate may include a second ground plane of a stripline. In an exemplary embodiment, the $(i, k)^{th}$ second loaded conductive plate may be placed in parallel with the $(i, k)^{th}$ second conductive plate to be integrated with a first ground plane and a second ground plane of a stripline.

In an exemplary embodiment, step 1220 may include positioning the $(i, k)^{th}$ second graphene monolayer between the $(i, k)^{th}$ first conductive plate and the $(i, k)^{th}$ third conductive plate. In an exemplary embodiment, the $(i, k)^{th}$ first conductive plate may include a strip conductor of an underlying transmission line and the $(i, k)^{th}$ third conductive plate may include a ground plane of the underlying transmission line. As a result, in an exemplary embodiment, positioning the $(i, k)^{th}$ second graphene monolayer between the $(i, k)^{th}$ first conductive plate and the $(i, k)^{th}$ third conductive plate may result in an EMNZ medium between the $(i, k)^{th}$ first conductive plate and the $(i, k)^{th}$ third conductive plate when a tunable conductivity of the $(i, k)^{th}$ second graphene monolayer is tuned to a predetermined value. An exemplary EMNZ medium may block microwave signal 1112 to pass through the underlying transmission line.

In an exemplary embodiment, step 1222 may include coating the $(i, k)^{th}$ first dielectric spacer on the $(i, k)^{th}$ first graphene monolayer. In an exemplary embodiment, coating the $(i, k)^{th}$ first dielectric spacer may include setting a thickness of the $(i, k)^{th}$ first dielectric spacer. In an exemplary embodiment, the thickness may be set equal to or smaller than a quarter of a guided wavelength of microwave signal 1112. In an exemplary embodiment, when the thickness is large compared with the guided wavelength, a combination of the $(i, k)^{th}$ first graphene monolayer and the $(i, k)^{th}$ first dielectric spacer may not impose an impedance surface boundary condition on microwave signal 1112. As a result, in an exemplary embodiment, the $(i, k)^{th}$ metamaterial switch may not exhibit EMNZ characteristics.

In an exemplary embodiment, step 1224 may include attaching the $(i, k)^{th}$ first dielectric spacer to the $(i, k)^{th}$ second conductive plate. In an exemplary embodiment, the $(i, k)^{th}$ first dielectric spacer may be directly attached to the $(i, k)^{th}$ second conductive plate. In an exemplary embodiment, attaching the $(i, k)^{th}$ first dielectric spacer to the $(i, k)^{th}$ second conductive plate may avoid the $(i, k)^{th}$ first graphene monolayer from being short-circuited with the $(i, k)^{th}$ second conductive plate. As a result, in an exemplary embodiment, the $(i, k)^{th}$ first graphene monolayer may impose an impedance surface boundary condition on microwave signal 1112.

In an exemplary embodiment, step 1226 may include coating the $(i, k)^{th}$ second dielectric spacer on the $(i, k)^{th}$ second graphene monolayer. In an exemplary embodiment, coating the $(i, k)^{th}$ second dielectric spacer may include setting a thickness of the $(i, k)^{th}$ second dielectric spacer. In an exemplary embodiment, the thickness may be set equal to or smaller than a quarter of the guided wavelength. In an exemplary embodiment, when the thickness is large compared with the guided wavelength, a combination of the $(i, k)^{th}$ second graphene monolayer and the $(i, k)^{th}$ second dielectric spacer may not impose an impedance surface boundary condition on microwave signal 1112. As a result, in an exemplary embodiment, the $(i, k)^{th}$ metamaterial switch may not exhibit EMNZ characteristics.

In an exemplary embodiment, step 1228 may include attaching the $(i, k)^{th}$ second dielectric spacer to the $(i, k)^{th}$ third conductive plate. In an exemplary embodiment, the (i, k)$^{th}$ second dielectric spacer may be directly attached to the (i, k)$^{th}$ third conductive plate. In an exemplary embodiment, attaching the (i, k)$^{th}$ second dielectric spacer to the (i, k)$^{th}$ third conductive plate may avoid the (i, k)$^{th}$ second graphene monolayer from being short-circuited with the (i, k)$^{th}$ third conductive plate. As a result, in an exemplary embodiment, the (i, k)$^{th}$ second graphene monolayer may impose an impedance surface boundary condition on microwave signal 1112.

In an exemplary embodiment, step 1230 may include setting an (i, k)$^{th}$ second tunable conductivity of the (i, k)$^{th}$ second graphene monolayer equal to the (i, k)$^{th}$ first tunable conductivity. In an exemplary embodiment, the (i, k)$^{th}$ effective permittivity may be controlled by tuning the (i, k)$^{th}$ second tunable conductivity. In an exemplary embodiment, the (i, k)$^{th}$ second tunable conductivity may be electrically tuned to different values by applying different electric potentials to the (i, k)$^{th}$ second graphene monolayer corresponding to different values of the (i, k)$^{th}$ second tunable conductivity. In an exemplary embodiment, applying a first electric potential to the (i, k)$^{th}$ second graphene monolayer may tune the (i, k)$^{th}$ effective permittivity to be near-zero. As a result, the (i, k)$^{th}$ metamaterial switch may become an EMNZ metamaterial cell that blocks microwave signal 1112. On the other hand, in an exemplary embodiment, applying a second electric potential may tune the (i, k)$^{th}$ effective permittivity to be larger than zero. As a result, the (i, k)$^{th}$ metamaterial switch may pass microwave signal 1112.

Referring again to FIGS. 7A, 11, and 12B, in an exemplary embodiment, step 1208 may include routing microwave signal 1106 from an input line of m$^{th}$ metamaterial phase shifter 1110 to an output line of m$^{th}$ metamaterial phase shifter 1110. In an exemplary embodiment, m$^{th}$ metamaterial phase shifter 1110 may be implemented utilizing metamaterial phase shifter 700. An exemplary input line of m$^{th}$ metamaterial phase shifter 1110 may be similar to input line 702. An exemplary output line of m$^{th}$ metamaterial phase shifter 1110 may be similar to output line 704.

Figure 12D:
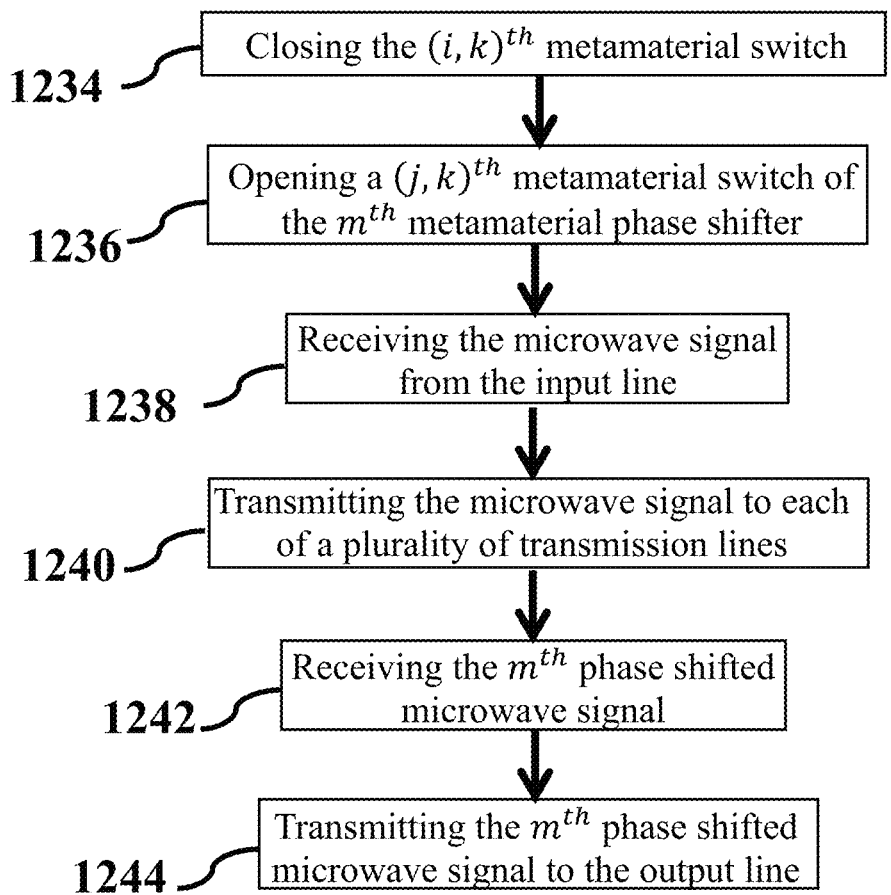
FIG. 12D shows a flowchart of a method for routing a microwave signal from an input line of a metamaterial phase shifter to an output line of a metamaterial phase shifter, consistent with one or more exemplary embodiments of the present disclosure.

FIG. 12D shows a flowchart of a method for routing a microwave signal from an input line of a metamaterial phase shifter to an output line of a metamaterial phase shifter, consistent with one or more exemplary embodiments of the present disclosure. Referring to FIGS. 7A, 11, and 12D, in an exemplary embodiment, routing microwave signal 1106 from the input line to the output line (step 1208) may include closing the (i, k)$^{th}$ metamaterial switch (step 1234), opening a (j, k)$^{th}$ metamaterial switch of the m$^{th}$ metamaterial phase shifter (step 1236), receiving microwave signal 1112 from the input line (step 1238), transmitting microwave signal 1112 to each of a plurality of transmission lines of m$^{th}$ metamaterial phase shifter 1110 (step 1240), receiving m$^{th}$ phase shifted microwave signal 1106 (step 1242), and transmitting m$^{th}$ phase shifted microwave signal 1106 to the output line (step 1244). In an exemplary embodiment, the (j, k)$^{th}$ metamaterial switch may be similar to a (j, k)$^{th}$ metamaterial switch 756 of a j$^{th}$ transmission line 758 of metamaterial phase shifter 700 in FIG. 7A.

In further detail regarding step 1234, in an exemplary embodiment, the (i, k)$^{th}$ metamaterial switch may be closed by setting each of the (i, k)$^{th}$ first tunable conductivity and the (i, k)$^{th}$ second tunable conductivity to be larger than a conductivity threshold. In an exemplary embodiment, each of the (i, k)$^{th}$ first tunable conductivity and the (i, k)$^{th}$ second tunable conductivity may be configured to be set larger than the conductivity threshold by applying a first electric potential to each of the (i, k)$^{th}$ first graphene monolayer and the (i, k)$^{th}$ second graphene monolayer.

For further detail with respect to step 1236, in an exemplary embodiment, the (j, k)$^{th}$ metamaterial switch may be opened by setting each of a (j, k)$^{th}$ first tunable conductivity of a (j, k)$^{th}$ first graphene monolayer and a (j, k)$^{th}$ second tunable conductivity of a (j, k)$^{th}$ second graphene monolayer smaller than the conductivity threshold. In an exemplary embodiment, each of the (j, k)$^{th}$ first tunable conductivity and the (j, k)$^{th}$ second tunable conductivity may be configured to be set smaller than the conductivity threshold by applying a second electric potential to each of the (j, k)$^{th}$ first graphene monolayer and the (j, k)$^{th}$ second graphene monolayer, where 1≤j≤N and j≠i.

In an exemplary embodiment, step 1238 may include receiving microwave signal 1112 from the input line. In an exemplary embodiment, microwave signal 1112 may be received utilizing a power splitter of m$^{th}$ metamaterial phase shifter 1110. An exemplary power splitter may be similar to power splitter 714.

In an exemplary embodiment, step 1240 may include transmitting microwave signal 1112 to each of the plurality of transmission lines. In an exemplary embodiment, the plurality of transmission lines may be similar to plurality of transmission lines 706. In an exemplary embodiment, microwave signal may 1112 be transmitted utilizing the power combiner. In an exemplary embodiment, transmitting microwave signal 1112 to each the plurality of transmission lines may include passing microwave signal 1112 through an i$^{th}$ delay line of the i$^{th}$ transmission line. An exemplary i$^{th}$ delay line may be similar to i$^{th}$ delay line 712.

Figure 12E:
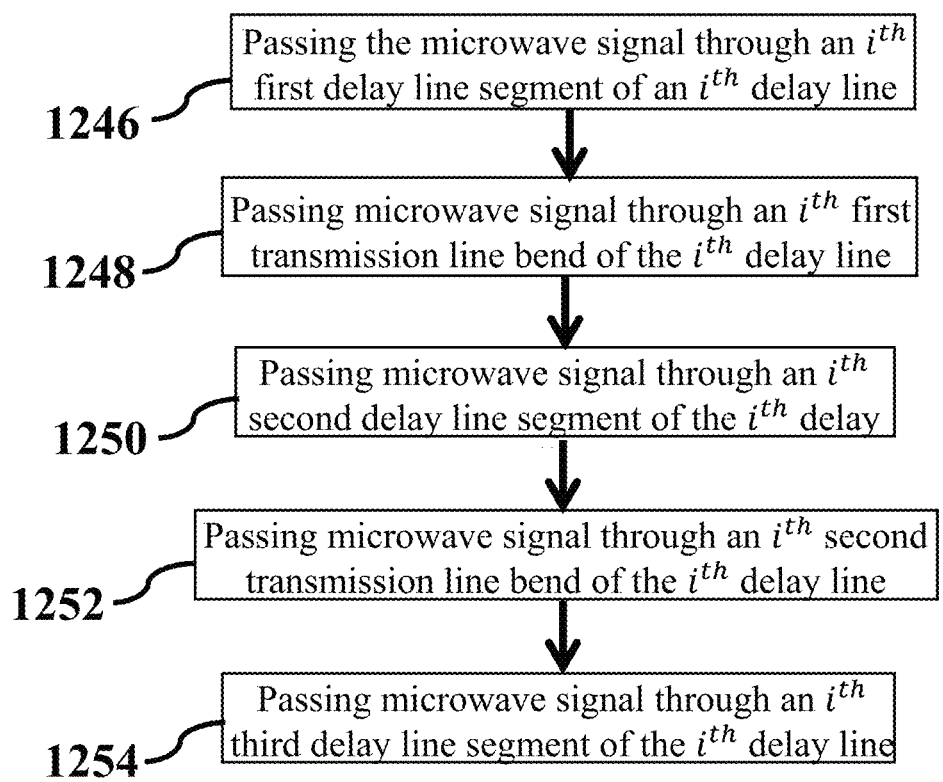
FIG. 12E shows a flowchart of a method for passing a microwave signal through an $i^{th}$ delay line of a metamaterial phase shifter, consistent with one or more exemplary embodiments of the present disclosure.

FIG. 12E shows a flowchart of a method for passing a microwave signal through an i$^{th}$ delay line of a metamaterial phase shifter, consistent with one or more exemplary embodiments of the present disclosure. Referring to FIGS. 7B, 11, and 12E, in an exemplary embodiment, passing microwave signal 1112 through the i$^{th}$ delay line (step 1240) may include passing microwave signal 1112 through an i$^{th}$ first delay line segment of the i$^{th}$ delay line (step 1246), passing microwave signal 1112 through an i$^{th}$ first transmission line bend of the i$^{th}$ delay line (step 1248), passing microwave signal 1112 through an i$^{th}$ second delay line segment of the i$^{th}$ delay line (step 1250), passing microwave signal 1112 through an i$^{th}$ second transmission line bend of the i$^{th}$ delay line (step 1252), passing microwave signal 1112 through an i$^{th}$ third delay line segment of the i$^{th}$ delay line (step 1254).

In further detail regarding step 1246, in an exemplary embodiment, a length $l_i$ of the i$^{th}$ first delay line segment may satisfy a condition according to $$\left| l_i - \frac{\lambda_g}{2} \times \frac{\Delta\phi_i}{360} - \frac{\lambda_g}{24} \right| \leq \frac{\lambda_g}{20},$$

where $\Delta\phi_m$ is the m$^{th}$ phase shift and $\lambda_g$ is a guided wavelength of microwave signal 1112. In an exemplary embodiment, passing microwave signal 1112 through the i$^{th}$ first delay line segment may result in a phase shift equal to $\Delta\phi_m/2$ to microwave signal 1112. In an exemplary embodiment, the i$^{th}$ first delay line segment may be similar to i$^{th}$ first delay line segment 718.

For further detail with respect to step 1248, in an exemplary embodiment, passing microwave signal 1112 through the i$^{th}$ first transmission line bend may turn a direction of propagation of microwave signal 1112 by 90 degrees. In an exemplary embodiment, the $i^{th}$ first transmission line bend may be similar to $i^{th}$ first transmission line bend 724.

In an exemplary embodiment, step 1250 may include passing microwave signal 1112 through the $i^{th}$ second delay line segment. In an exemplary embodiment, microwave signal 1112 may be passed through the $i^{th}$ second delay line segment by connecting the $i^{th}$ second delay line segment to the $i^{th}$ first transmission line bend. In an exemplary embodiment, the $i^{th}$ second delay line segment may be similar to $i^{th}$ third delay line segment 722.

In an exemplary embodiment, step 1252 may include passing microwave signal 1112 through the $i^{th}$ second transmission line bend. In an exemplary embodiment, passing microwave signal 1112 through the $i^{th}$ second transmission line bend may turn a direction of propagation of microwave signal 1112 by 90 degrees. In an exemplary embodiment, the $i^{th}$ second transmission line bend may be similar to $i^{th}$ second transmission line bend 726.

In an exemplary embodiment, step 1254 may include passing microwave signal 1112 through the $i^{th}$ third delay line segment. In an exemplary embodiment, microwave signal 1112 may be passed through the $i^{th}$ third delay line segment by connecting the $i^{th}$ third delay line segment to the $i^{th}$ second transmission line bend. In an exemplary embodiment, the $i^{th}$ third delay line segment may be similar to $i^{th}$ second delay line segment 720. In an exemplary embodiment, a length of the $i^{th}$ third delay line segment may be equal to the length $l_i$. As a result, in an exemplary embodiment, passing microwave signal 1112 through the $i^{th}$ third delay line segment may result in a phase shift equal to $\Delta\phi_m/2$ to microwave signal 1112.

Referring again to FIGS. 7B, 11, and 12D, in an exemplary embodiment, step 1242 may include receiving $m^{th}$ phase shifted microwave signal 1106. In an exemplary embodiment, $m^{th}$ phase shifted microwave signal 1106 may be received utilizing a power combiner of $m^{th}$ metamaterial phase shifter 1110. In an exemplary embodiment, the power combiner may be similar to power combiner 716. In an exemplary embodiment, step 1244 may include transmitting $m^{th}$ phase shifted microwave signal 1106 to the output line. In an exemplary embodiment, $m^{th}$ phase shifted microwave signal 1106 may be transmitted to the output line utilizing the power combiner.

Example 1

In this example, a performance of a method (similar to method 100) for adjusting a cutoff frequency of an EMNZ metamaterial (similar to EMNZ metamaterial 200) in terahertz frequency range is demonstrated. Different steps of the method are implemented utilizing an EMNZ metamaterial similar to EMNZ metamaterial 200. The EMNZ metamaterial includes a graphene-loaded waveguide (similar to graphene-loaded waveguide 202E). The EMNZ metamaterial includes a magneto-dielectric material (similar to magneto-dielectric material 204) with a permittivity about $\in=2$. A length 1 of the graphene-loaded waveguide (similar to length l) is about l=0.1 μm. A height of the graphene-loaded waveguide (similar to distance a) is about a=2 μm. A width of the graphene-loaded waveguide (similar to a distance b in FIG. 2E) is about b=5 μm.

Figure 13:
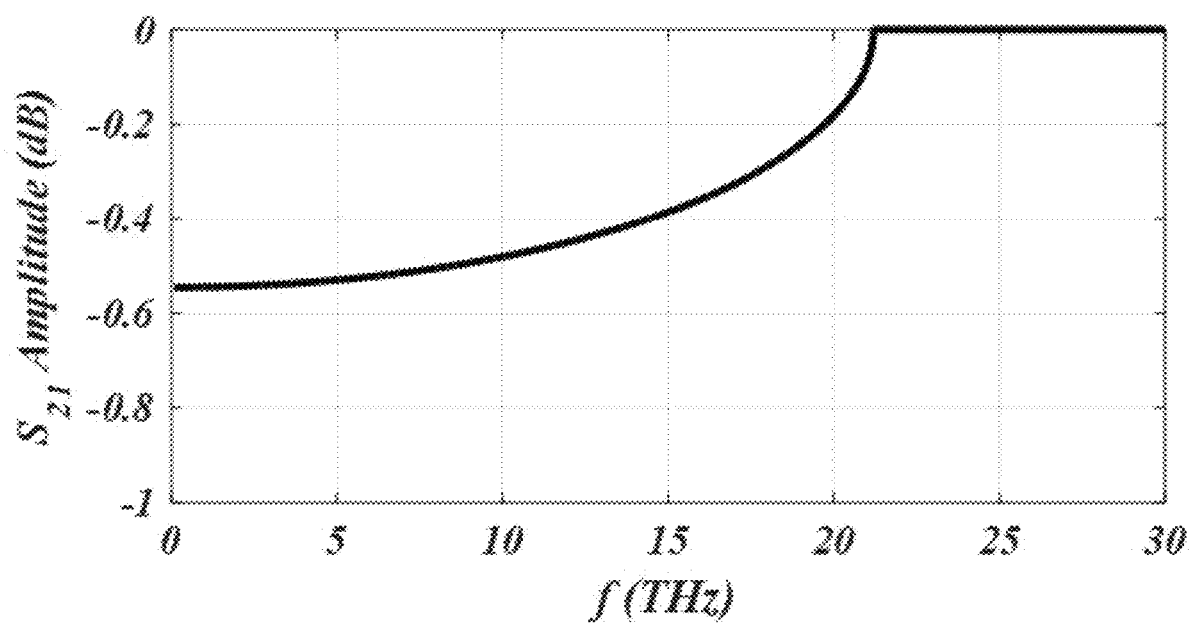
FIG. 13 shows an insertion loss of an EMNZ metamaterial in a terahertz frequency range, consistent with one or more exemplary embodiments of the present disclosure.

FIG. 13 shows an insertion loss of an EMNZ metamaterial in a terahertz (THz) frequency range, consistent with one or more exemplary embodiments of the present disclosure. Amplitude variations of an insertion loss $S_{21}$ of the EMNZ metamaterial versus frequency (f) are depicted in decibels (dB) in FIG. 13. An exemplary cutoff frequency (similar to cutoff frequency $f_c$) of the EMNZ metamaterial is about 21 THz. An insertion loss of the EMNZ metamaterial is less than about 0.6 dB in frequencies less than about 21 THz. As a result, a passing wave with a frequency less than about 21 THz may pass through the EMNZ metamaterial with a low amount of energy dissipation.

Figure 14:
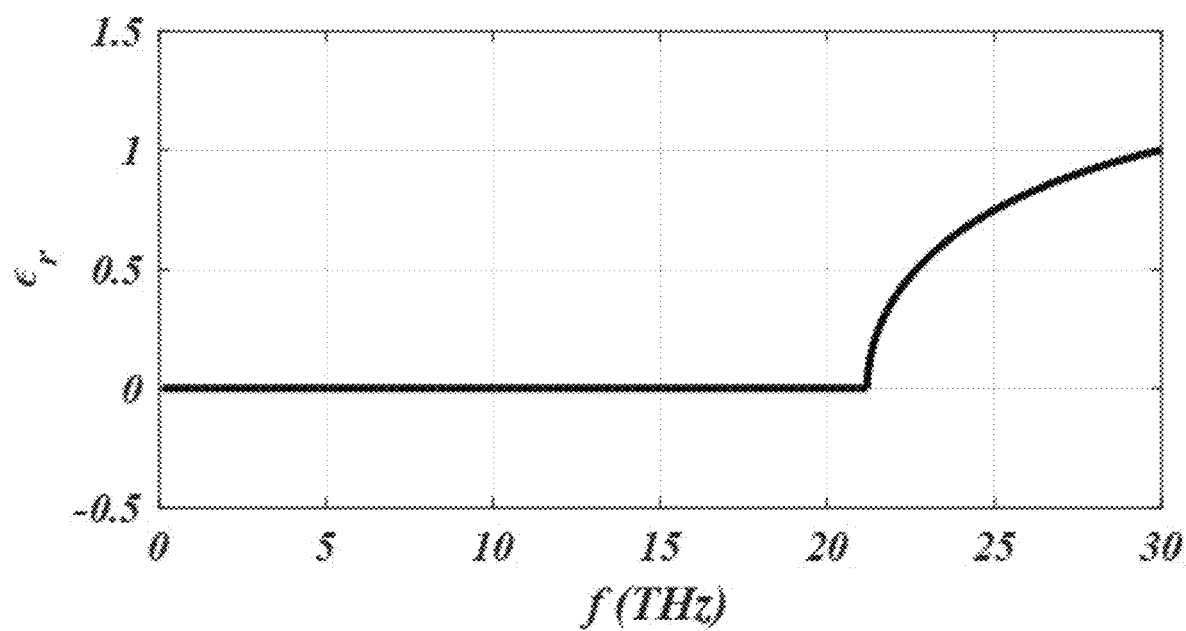
FIG. 14 shows an effective permittivity of an EMNZ metamaterial in a terahertz frequency range, consistent with one or more exemplary embodiments of the present disclosure.

FIG. 14 shows an effective permittivity $\epsilon_r$ of an EMNZ metamaterial in a terahertz (THz) frequency range, consistent with one or more exemplary embodiments of the present disclosure. An exemplary effective permittivity $\epsilon_r$ of the EMNZ metamaterial is about to zero in frequencies less than about 21 THz. In other words, a passing wave with a frequency f less than about 21 THz experiences an epsilon-near-zero (ENZ) medium when passes through the EMNZ metamaterial. In frequencies larger than about 21 THz, however, effective permittivity $\epsilon_r$ of the EMNZ metamaterial increases. As a result, the EMNZ metamaterial does not exhibit ENZ characteristics in frequencies larger than about 21 THz.

Figure 15:
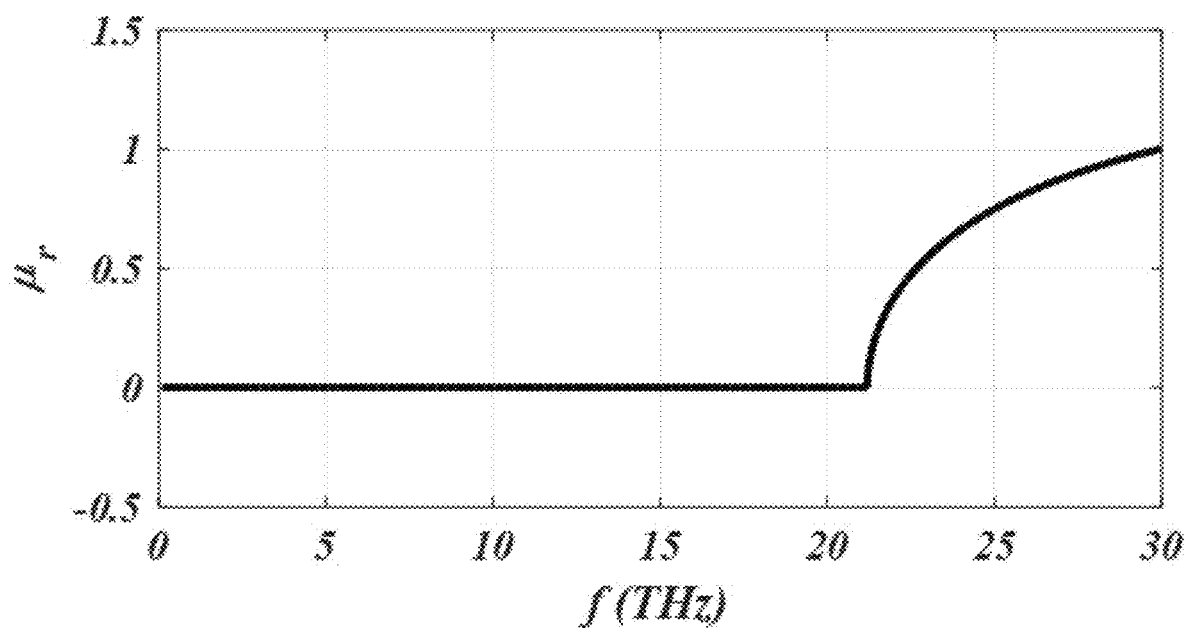
FIG. 15 shows an effective permeability of an EMNZ metamaterial in a terahertz frequency range, consistent with one or more exemplary embodiments of the present disclosure.

FIG. 15 shows an effective permeability of an EMNZ metamaterial in a terahertz (THz) frequency range, consistent with one or more exemplary embodiments of the present disclosure. An exemplary effective permeability $\mu_r$ of the EMNZ metamaterial is about to zero in frequencies less than about 21 THz. In other words, a passing wave with a frequency f less than about 21 THz experiences a mu-near-zero (MNZ) medium when the wave passes through the EMNZ metamaterial. In frequencies larger than about 21 THz, however, effective permeability $\mu_r$ of the EMNZ metamaterial increases. As a result, the EMNZ metamaterial does not exhibit MNZ characteristics in frequencies larger than about 21 THz.

Example 2

In this example, a performance of a method (similar to method 100) for adjusting a cutoff frequency of an EMNZ metamaterial (similar to EMNZ metamaterial 200) in terahertz frequency range is demonstrated. Different steps of the method are implemented utilizing an EMNZ metamaterial similar to EMNZ metamaterial 200. The EMNZ metamaterial includes a graphene-loaded waveguide (similar to graphene-loaded waveguide 202E). The EMNZ metamaterial includes a magneto-dielectric material (similar to magneto-dielectric material 204) with a permittivity about $\epsilon=2$. A length/of the graphene-loaded waveguide (similar to length l) is about l=1 nm. A height of the graphene-loaded waveguide (similar to distance a) is about a=40 nm. A chemical potential (similar to chemical potential $\mu_c$) of a graphene monolayer (similar to graphene monolayer 210) is about 0 electron-volt (eV).

Figure 16:
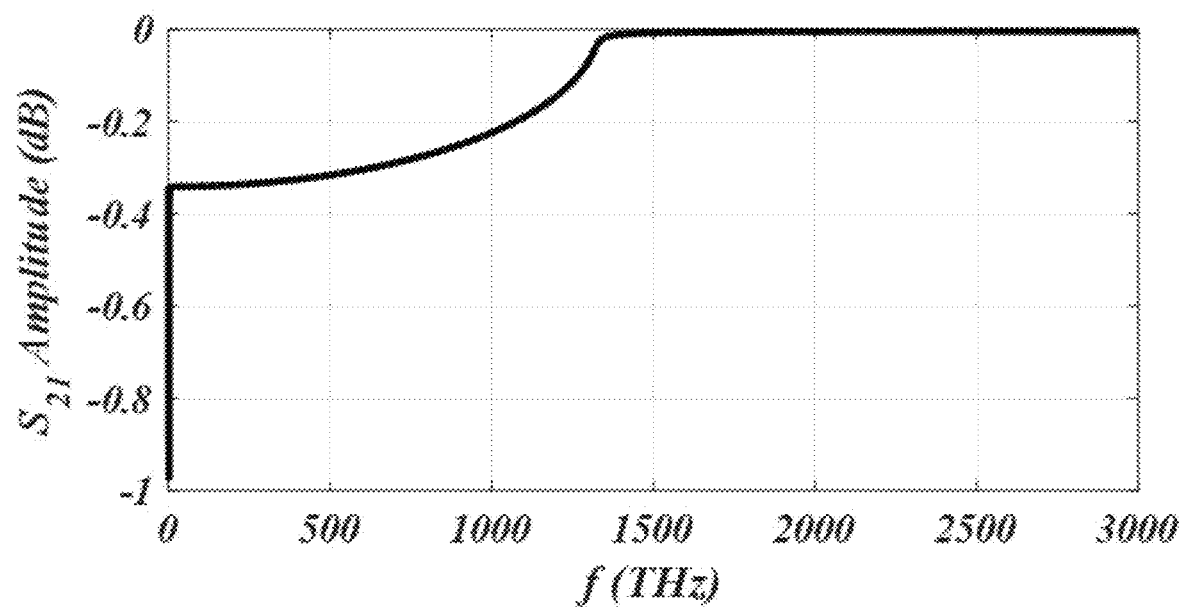
FIG. 16 shows an insertion loss of an EMNZ metamaterial in a visible light frequency range, consistent with one or more exemplary embodiments of the present disclosure.

FIG. 16 shows an insertion loss of an EMNZ metamaterial in a visible light frequency range, consistent with one or more exemplary embodiments of the present disclosure. Amplitude variations of an insertion loss $S_{21}$ of the EMNZ metamaterial in different frequencies are depicted in decibels (dB) in FIG. 16. An exemplary cutoff frequency (similar to cutoff frequency $f_c$) of the EMNZ metamaterial is about 1300 THz. An insertion loss amplitude of the EMNZ metamaterial decreases from about 1 dB to less than about 0.4 dB in a very narrow frequency range (from 0 to about 2 THz, demonstrated by an almost vertical line at the left edge of the diagram of FIG. 16), and remains less than about 0.4 dB in frequencies less than about 1300 THz. As a result, a passing wave with a frequency f in a range of about 2 THz to less than about 1300 THz may pass through the EMNZ metamaterial with a low amount of energy dissipation.

Figure 17:
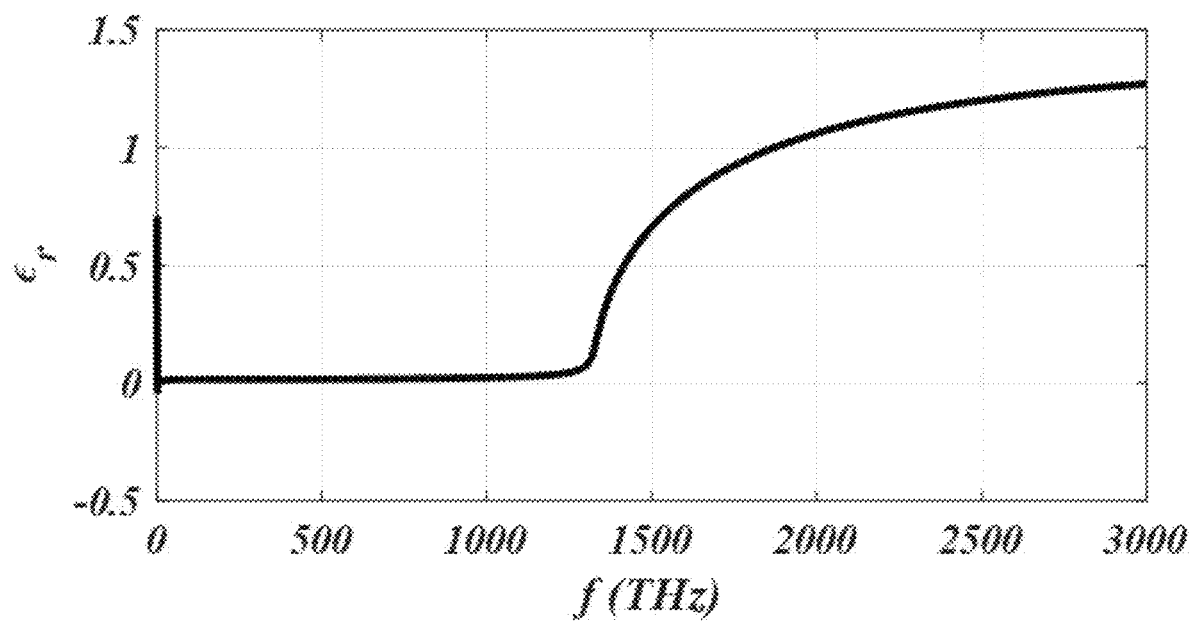
FIG. 17 shows an effective permittivity of an EMNZ metamaterial in a visible light frequency range, consistent with one or more exemplary embodiments of the present disclosure.

FIG. 17 shows an effective permittivity of an EMNZ metamaterial in a visible light frequency range, consistent with one or more exemplary embodiments of the present disclosure. An exemplary effective permittivity $\epsilon_r$ of the EMNZ metamaterial decreases from more than 0.5 to about 0 in a very narrow frequency range (from 0 to about 2 THz, demonstrated by an almost vertical line at the left edge of the diagram of FIG. 17), and remains about zero in frequencies less than about 1300 THz. In other words, a passing wave with a frequency f in a range of about 2 THz to less than about 1300 THz experiences an ENZ medium when the wave passes through the EMNZ metamaterial. In frequencies larger than about 1300 THz, however, effective permittivity $\epsilon_r$ of the EMNZ metamaterial increases. As a result, the EMNZ metamaterial does not exhibit ENZ characteristics in frequencies larger than about 1300 THz.

Figure 18:
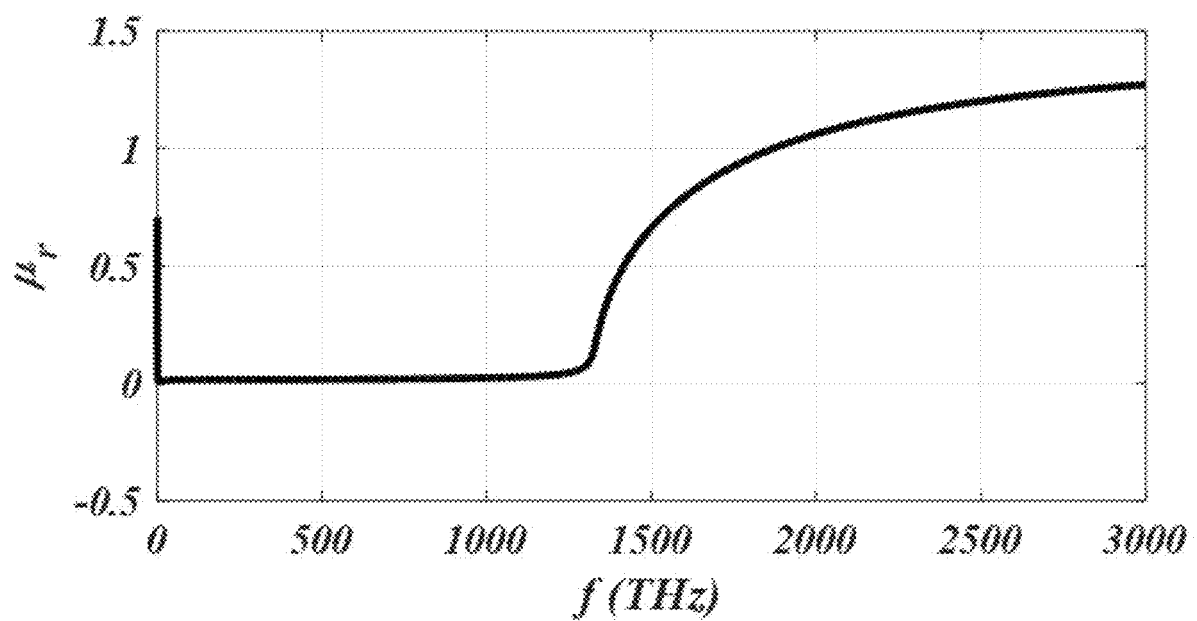
FIG. 18 shows an effective permeability of an EMNZ metamaterial in a visible light frequency range, consistent with one or more exemplary embodiments of the present disclosure.

FIG. 18 shows an effective permeability of an EMNZ metamaterial in a visible light frequency range, consistent with one or more exemplary embodiments of the present disclosure. An exemplary effective permeability $\mu_r$ of the EMNZ metamaterial decreases from more than 0.5 to about 0 in a very narrow frequency range (from 0 to about 2 THz, demonstrated by an almost vertical line at the left edge of the diagram of FIG. 18), and remains about zero in frequencies less than about 1300 THz. In other words, a passing wave with a frequency f in a range of about 2 THz to less than about 1300 THz experiences an MNZ medium when the wave passes through the EMNZ metamaterial. In frequencies larger than about 1300 THz, however, effective permeability $\mu_r$ of the EMNZ metamaterial increases. As a result, the EMNZ metamaterial does not exhibit MNZ characteristics in frequencies larger than about 1300 THz.

Example 3

In this example, a performance of a method (similar to method 100) for adjusting a cutoff frequency of an EMNZ metamaterial (similar to EMNZ metamaterial 200) in a gigahertz frequency range is demonstrated. Different steps of the method are implemented utilizing an EMNZ metamaterial similar to EMNZ metamaterial 200. The EMNZ metamaterial includes a graphene-loaded waveguide (similar to graphene-loaded waveguide 202E). The EMNZ metamaterial includes a magneto-dielectric material (similar to magneto-dielectric material 204) with a permittivity about $\epsilon=2$. A length l of the graphene-loaded waveguide (similar to length l) is about l=0.2 mm. A height of the graphene-loaded waveguide (similar to distance a) is about a=16 mm. A chemical potential (similar to chemical potential $\mu_c$) of a graphene monolayer (similar to graphene monolayer 210) is about 0.6 eV.

Figure 19:
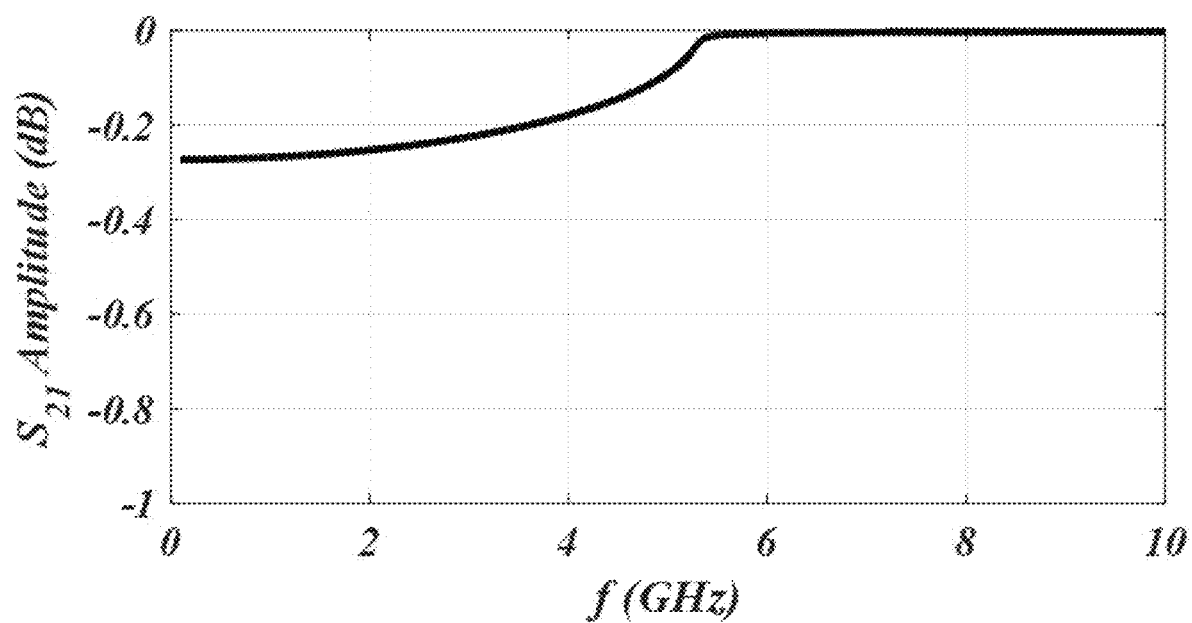
FIG. 19 shows an insertion loss of an EMNZ metamaterial in a gigahertz frequency range, consistent with one or more exemplary embodiments of the present disclosure.

FIG. 19 shows an insertion loss of an EMNZ metamaterial in a gigahertz (GHz) frequency range, consistent with one or more exemplary embodiments of the present disclosure. Amplitude variations of an insertion loss $S_{21}$ of the EMNZ metamaterial in different frequencies are depicted in decibels (dB) in FIG. 19. An exemplary cutoff frequency (similar to cutoff frequency $f_c$) of the EMNZ metamaterial is about 5 GHz. An insertion loss of the EMNZ metamaterial is less than about 0.3 dB in frequencies less than about 5 GHz. As a result, a passing wave with a frequency f less than about 5 GHz may pass through the EMNZ metamaterial with a low amount of energy dissipation.

Figure 20:
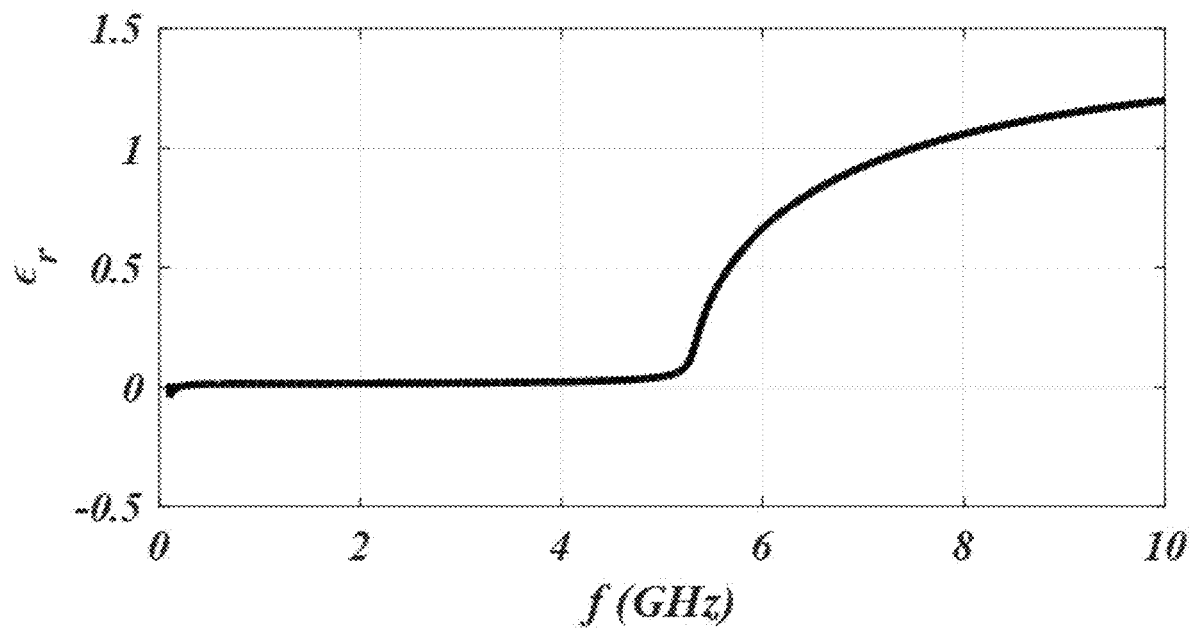
FIG. 20 shows an effective permittivity of an EMNZ metamaterial in a gigahertz frequency range, consistent with one or more exemplary embodiments of the present disclosure.

FIG. 20 shows an effective permittivity of an EMNZ metamaterial in a gigahertz (GHz) frequency range, consistent with one or more exemplary embodiments of the present disclosure. An exemplary effective permittivity $\epsilon_r$ of the EMNZ metamaterial is about to zero in frequencies less than about 5 GHz. In other words, a passing wave with a frequency f less than about 5 GHz experiences an ENZ medium when the wave passes through the EMNZ metamaterial. In frequencies larger than about 5 GHz, however, effective permittivity $\epsilon_r$ of the EMNZ metamaterial increases. As a result, the EMNZ metamaterial does not exhibit ENZ characteristics in frequencies larger than about 5 GHz.

Figure 21:
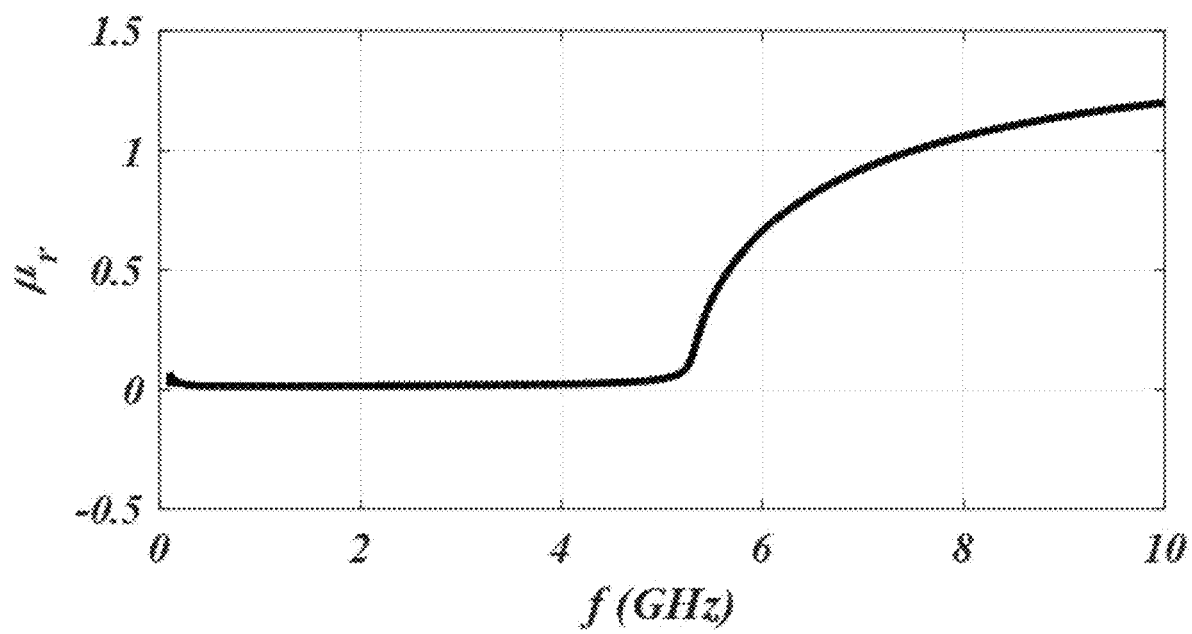
FIG. 21 shows an effective permeability of an EMNZ metamaterial in a gigahertz frequency range, consistent with one or more exemplary embodiments of the present disclosure.

FIG. 21 shows an effective permeability of an EMNZ metamaterial in a gigahertz (GHz) frequency range, consistent with one or more exemplary embodiments of the present disclosure. An exemplary effective permeability $\mu_r$ of the EMNZ metamaterial is about to zero in frequencies less than about 5 GHz. In other words, a passing wave with a frequency f less than about 5 GHz experiences an MNZ medium when the wave passes through the EMNZ metamaterial. In frequencies larger than about 5 GHz, however, effective permeability $\mu_r$ of the EMNZ metamaterial increases. As a result, the EMNZ metamaterial does not exhibit MNZ characteristics in frequencies larger than about 5 GHz.

Example 4

In this example, a performance of a method (similar to method 100) for adjusting a cutoff frequency of an EMNZ metamaterial (similar to EMNZ metamaterial 200) is demonstrated. Different steps of the method are implemented utilizing an EMNZ metamaterial similar to EMNZ metamaterial 200. The EMNZ metamaterial includes a graphene-loaded waveguide (similar to graphene-loaded waveguide 202E). The EMNZ metamaterial includes a magneto-dielectric material (similar to magneto-dielectric material 204) with a permittivity about $\epsilon=2$. A length l of the graphene-loaded waveguide (similar to length l) is about l=0.1 μm. A height of the graphene-loaded waveguide (similar to distance a) is about a=4 μm. An insertion loss, an effective permittivity, and an effective permeability of the EMNZ metamaterial is obtained for different values of a chemical potential (similar to chemical potential $\mu_c$) of a graphene monolayer (similar to graphene monolayer 210). The chemical potential is set to about 0 eV and 0.6 eV.

Figure 22:
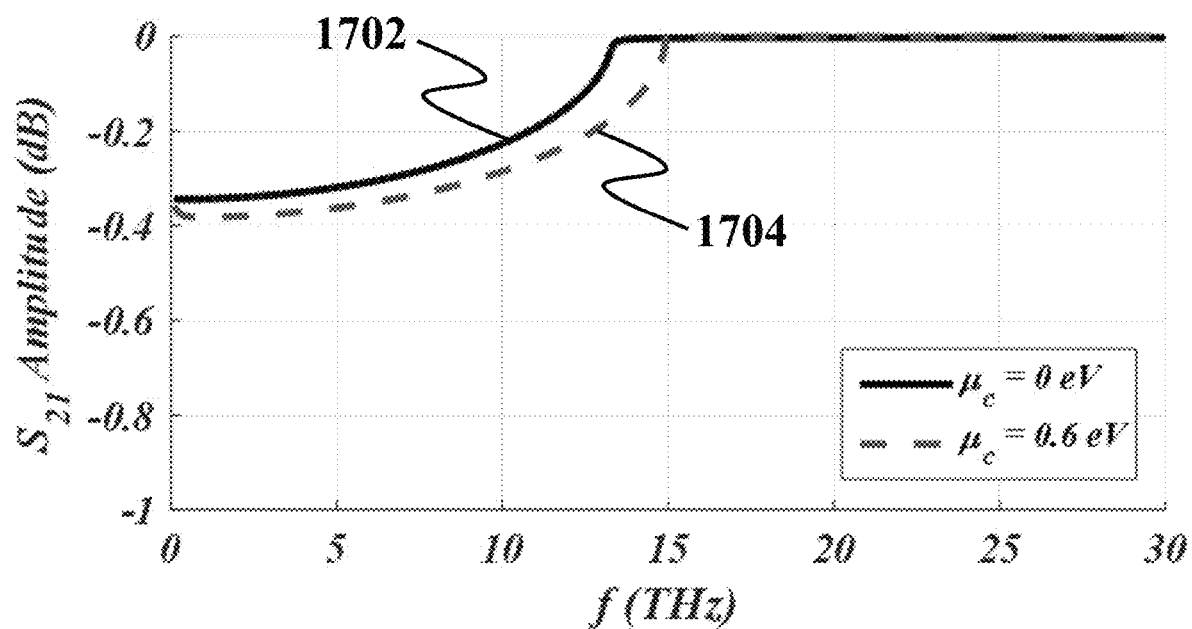
FIG. 22 shows an insertion loss of an EMNZ metamaterial for different values of a chemical potential, consistent with one or more exemplary embodiments of the present disclosure.

FIG. 22 shows an insertion loss of an EMNZ metamaterial for different values of a chemical potential, consistent with one or more exemplary embodiments of the present disclosure. Amplitude variations of an insertion loss $S_{21}$ of the EMNZ metamaterial at different frequencies f (THz) are depicted in decibels (dB) in FIG. 22. An insertion loss 1702 depicts an insertion loss of the EMNZ metamaterial with chemical potential $\mu_c$ of 0 eV. An insertion loss 1704 depicts an insertion loss of the EMNZ metamaterial with chemical potential $\mu_c$ of 0.6 eV. An exemplary cutoff frequency (similar to cutoff frequency $f_c$) of the EMNZ metamaterial is about 15 THz when the chemical potential is set to about 0.6 eV. An exemplary cutoff frequency of the EMNZ metamaterial is about 13 THz when the chemical potential is set to about 0 eV. As a result, the cutoff frequency of the EMNZ metamaterial is adjusted by changing a value of the chemical potential of the graphene monolayer.

Example 5

In this example, an insertion loss and isolation performance of a metamaterial switch (similar to metamaterial switch 400) is evaluated. The metamaterial is implemented utilizing a microstrip. The metamaterial switch includes a graphene monolayer (similar to one in graphene monolayer set 418). A length of the graphene monolayer is about 25 µm, a width of the graphene monolayer is about 2 µm, a distance between a first conductive plate (similar to first conductive plate 402) and a second conductive plate (similar to second conductive plate 408) is about 6 µm, a relative permittivity of a magneto-dielectric material (similar to magneto-dielectric material 406) is about 3.75.

Figure 23:
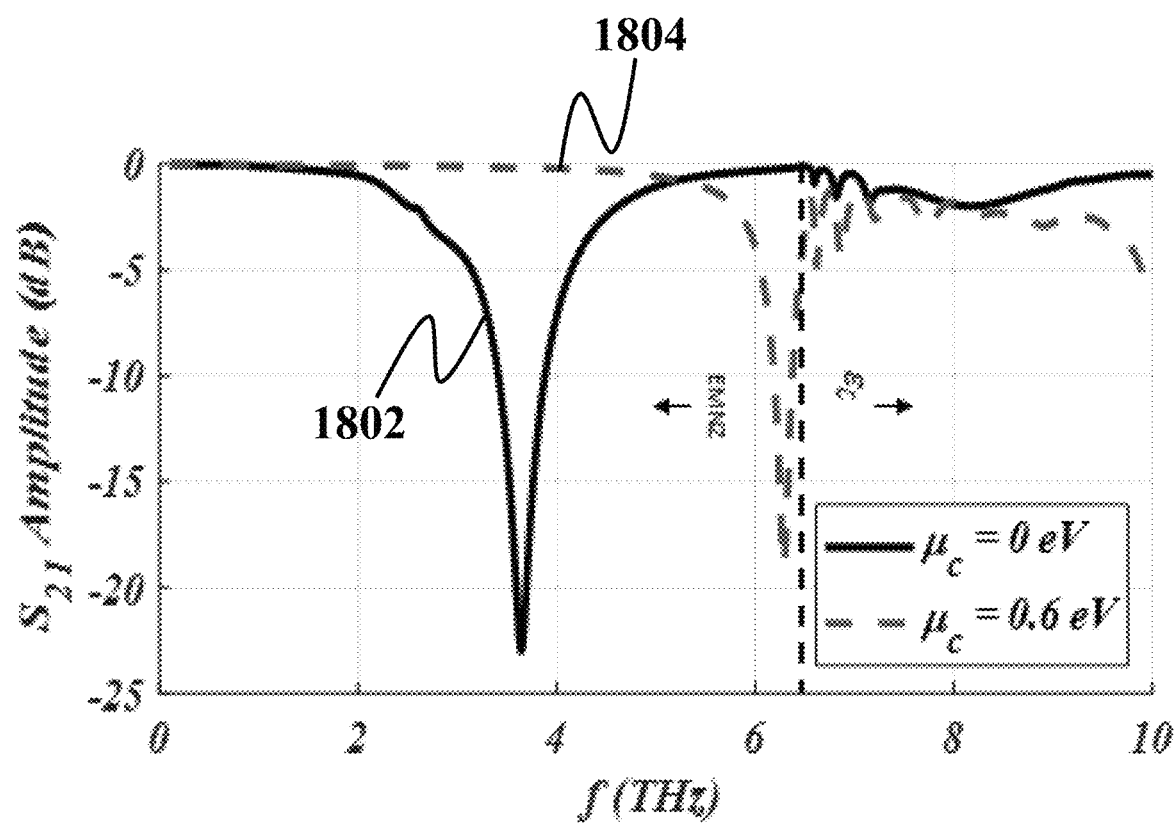
FIG. 23 shows an insertion loss of a metamaterial switch at different frequencies, consistent with one or more exemplary embodiments of the present disclosure.

FIG. 23 shows an insertion loss of a metamaterial switch at different frequencies, consistent with one or more exemplary embodiments of the present disclosure. Amplitude variations of an insertion loss $S_{21}$ of the metamaterial switch at different frequencies f (THz) are depicted in decibels (dB) in FIG. 23. An insertion loss 1802 depicts an insertion loss of the metamaterial switch with chemical potential $\mu_c$ of 0 eV. An insertion loss 1804 depicts an insertion loss of the metamaterial switch with chemical potential $\mu_c$ of 0.6 eV. A maximum isolation about 23 dB is achieved at a frequency about 3.75 THz. Moreover, in a frequency range of 3.4 THz to 3.9 THz, an isolation of the metamaterial switch exceeds about 10 dB while an insertion loss is about 0.1 dB. As a result, the metamaterial switch is configured to be opened and closed for microwave signals with frequencies ranging from 3.4 THz to 3.9 THz.

Example 6

In this example, an insertion loss and isolation performance of a stripline metamaterial switch (similar to stripline metamaterial switch 400A) is evaluated. The metamaterial switch is implemented utilizing a stripline. The metamaterial switch includes a graphene monolayer set (similar to graphene monolayer set 418). A length of each graphene monolayer in the graphene monolayer set is about 25 µm, a width of the graphene monolayer is about 2 µm, a distance between a second conductive plate (similar to second conductive plate 408A) and a third conductive plate (similar to third conductive plate 414) is about 12 µm, a relative permittivity of a magneto-dielectric material (similar to magneto-dielectric material 406) is about 3.75.

Figure 24:
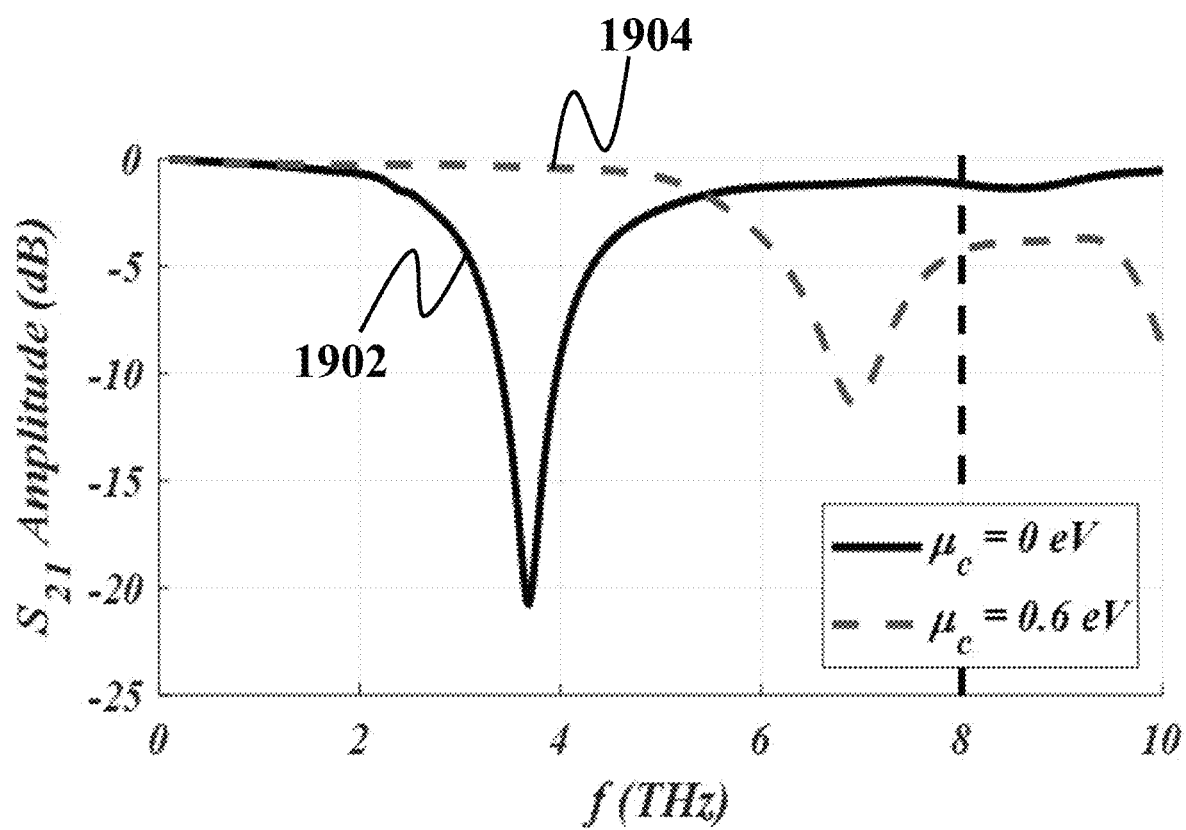
FIG. 24 shows an insertion loss of a stripline metamaterial switch at different frequencies, consistent with one or more exemplary embodiments of the present disclosure.

FIG. 24 shows an insertion loss of a stripline metamaterial switch at different frequencies, consistent with one or more exemplary embodiments of the present disclosure. Amplitude variations of an insertion loss $S_{21}$ of the stripline metamaterial switch at different frequencies f (THz) are depicted in decibels (dB) in FIG. 24. An insertion loss 1902 depicts an insertion loss of the metamaterial switch with chemical potential $\mu_c$ of 0 eV. An insertion loss 1904 depicts an insertion loss of the metamaterial switch with chemical potential $\mu_c$ of 0.6 eV. A maximum isolation about 21 dB is achieved at a frequency about 3.75 THz. Moreover, in a frequency range of 3.4 THz to 4 THz, an isolation of the metamaterial switch exceeds about 10 dB while an insertion loss is about 0.1 dB. As a result, the metamaterial switch is configured to be opened and closed for microwave signals with frequencies ranging from 3.4 THz to 4 THz.

Example 7

In this example, an insertion loss and isolation performance of a wideband metamaterial switch (similar to metamaterial switch 400) is evaluated. The metamaterial switch is implemented utilizing a microstrip. The metamaterial switch includes a graphene monolayer set (similar to graphene monolayer set 418). The graphene monolayer set includes 17 graphene monolayers. A length of each graphene monolayer satisfies the fourth length condition. A length $l_i$ of an exemplary implementation of $i^{th}$ first delay line segment 718 in FIG. 7B ranges from about 45 µm for i=1 to 15 µm for i=9. A width of each graphene monolayer in the graphene monolayer set is about 2 µm, a distance between a first conductive plate (similar to first conductive plate 402) and a second conductive plate (similar to second conductive plate 408) is about 6 µm, a relative permittivity of a magneto-dielectric material (similar to magneto-dielectric material 406) is about 3.75.

Figure 25:
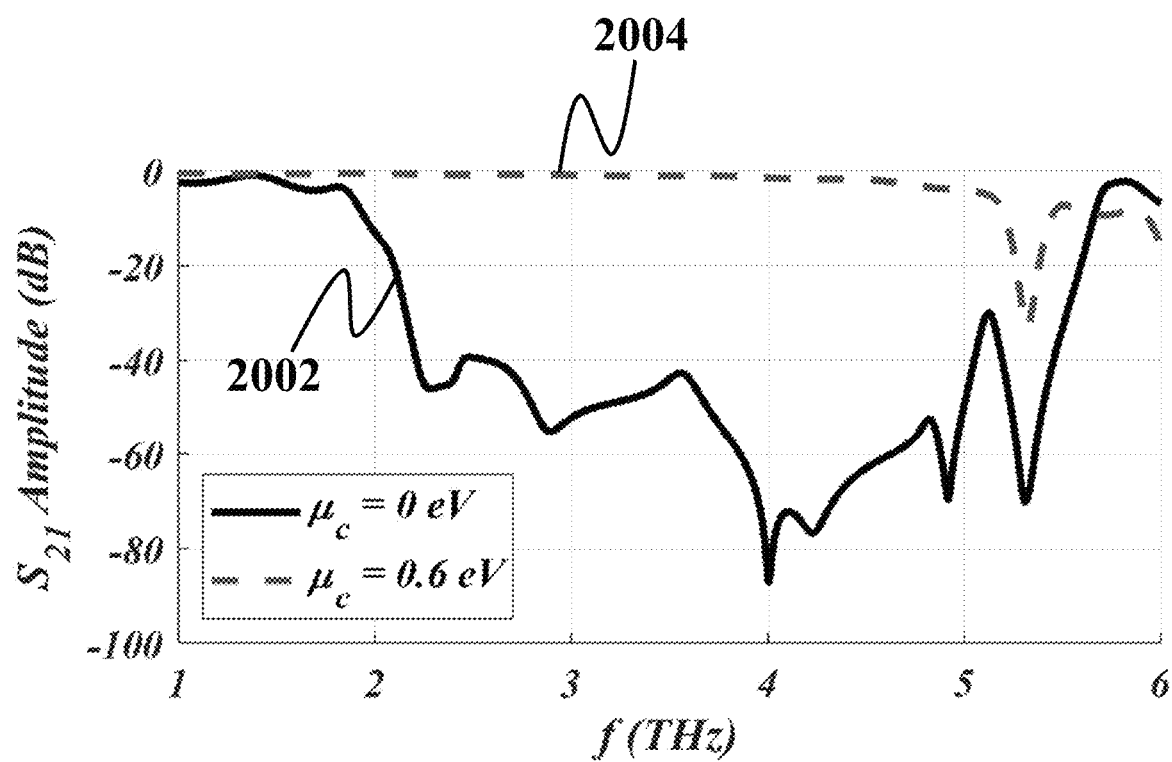
FIG. 25 shows an insertion loss of a wideband metamaterial switch at different frequencies, consistent with one or more exemplary embodiments of the present disclosure.

FIG. 25 shows an insertion loss of a wideband metamaterial switch at different frequencies, consistent with one or more exemplary embodiments of the present disclosure. Amplitude variations of an insertion loss $S_{21}$ of the wideband metamaterial switch at different frequencies f (THz) are depicted in decibels (dB) in FIG. 25. An insertion loss 2002 depicts an insertion loss of the metamaterial switch with chemical potential $\mu_c$ of 0 eV. An insertion loss 2004 depicts an insertion loss of the metamaterial switch with chemical potential $\mu_c$ of 0.6 eV. An isolation of more than about 20 dB is achieved in a frequency range of 2.1 THz to 4.75 THz, while an insertion loss is about 1 dB. As a result, the metamaterial switch is configured to be opened and closed for microwave signals with frequencies ranging from 2.1 THz to 4.75 THz.

Example 8

In this example, an insertion loss and isolation performance of a metamaterial multiplexer (similar to metamaterial multiplexer 600) is evaluated. The metamaterial multiplexer include four output lines (similar to plurality of output lines 604) and is implemented utilizing a microstrip. Each output line of the plurality of output lines includes two metamaterial switches (each similar to (i, k)$^{th}$ metamaterial switch 608). The metamaterial multiplexer includes a graphene monolayer (similar to a graphene monolayer in graphene monolayer set 418). A length of the graphene monolayer is about 55 µm and a width of the graphene monolayer is about 2 µm. A distance between a first conductive plate (similar to first conductive plate 402) and a second conductive plate (similar to second conductive plate 408) is about 6 µm, a relative permittivity of a magneto-dielectric material (similar to magneto-dielectric material 406) is about 3.75. An operating frequency of the metamaterial multiplexer is about 2 THz, resulting in a guided wavelength of about 77.4 µm. A distance between an (i, 1)$^{th}$ metamaterial switch (similar to (i, 1)$^{th}$ metamaterial switch 618) and an (i, 2)$^{th}$ metamaterial switch (similar to (i, 2)$^{th}$ metamaterial switch 620) is about $$\frac{\lambda_g}{4} = 19.3 \ \mu m,$$

a length of a first transmission line segment (similar to first transmission line segment 624) is about $$\frac{\lambda_g}{2} + \frac{\lambda_g}{8} + \frac{\lambda_g}{12} = 54.8 \ \mu m$$

and a second transmission line segment (similar to second transmission line segment 626) is about $$\frac{3\lambda_g}{4} = 29 \ \mu m.$$

Figure 26:
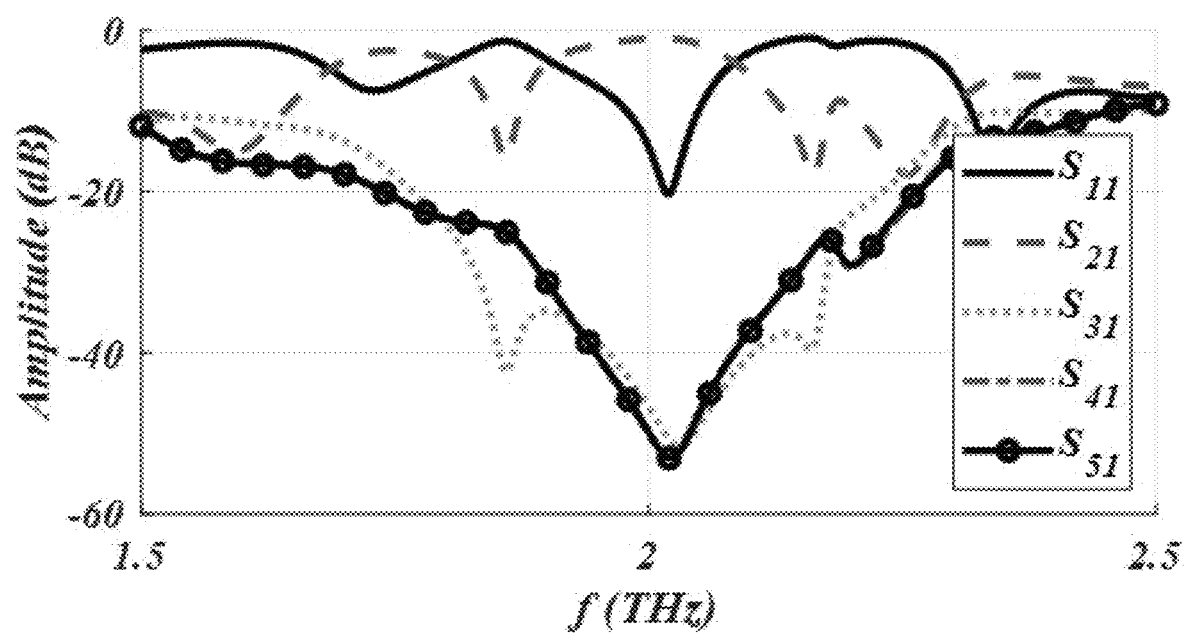
FIG. 26 shows insertion losses of a metamaterial multiplexer at different frequencies, consistent with one or more exemplary embodiments of the present disclosure.

FIG. 26 shows insertion losses of a metamaterial multiplexer at different frequencies, consistent with one or more exemplary embodiments of the present disclosure. Amplitude variations of insertion losses of the metamaterial multiplexer at different frequencies are depicted in decibels (dB) in FIG. 26. A chemical potential of metamaterial switches in exemplary implementations of $i^{th}$ output line 606 in FIG. 6A for i=2, 3, and 4 is set to about 0 eV and for i=1 is set to about 0.6 eV. In FIG. 26, $S_{11}$ is a return loss of the metamaterial multiplexer and $S_{21}$, $S_{31}$, $S_{41}$, $S_{51}$ depict insertion losses for exemplary implementations of $i^{th}$ output line 606 for i=1, 2 3, and, respectively. An isolation of more than about 50 dB is achieved in a frequency of about 2.1 THz, while an insertion loss is about 1 dB. Moreover, the return loss is about 20 dB at about 2.1 THz. As a result, the metamaterial multiplexer is configured to route a microwave signal with a frequency of about 2.1 THz to an exemplary implementation of $i^{th}$ output line 606 for i=2, while other output lines of an exemplary implementation of plurality of output lines 604 in FIG. 6A are effectively blocked.

Example 9

In this example, an insertion loss performance of a serial metamaterial phase shifter (similar to serial metamaterial phase shifter 732) is evaluated. The serial metamaterial phase shifter includes three serially connected metamaterial phase shifters. Each transmission line of each metamaterial phase shifter includes two transmission lines (similar to plurality of transmission lines 706). A first transmission line of an $n^{th}$ metamaterial phase shifter applies no phase shift while a second transmission line of $n^{th}$ phase shifter applies about n×60° phase shift to a microwave signal with 2 THz frequency. As a result, phase shifts of 60°, 120°, 180°, 300° may be applied to the microwave signal. A respective transmission line of each metamaterial phase shifter includes a graphene monolayer (similar to a graphene monolayer in graphene monolayer set 418). A length of the graphene monolayer is about 25 µm and a width of the graphene monolayer is about 5 µm. A distance between a first conductive plate (similar to first conductive plate 402) and a second conductive plate (similar to second conductive plate 408) is about 6 µm, a relative permittivity of a magneto-dielectric material (similar to magneto-dielectric material 406) is about 3.75.

Figure 27:
FIG. 27 shows a power of a microwave signal transmitted through a serial phase shifter, consistent with one or more exemplary embodiments of the present disclosure.

FIG. 27 shows a power of a microwave signal transmitted through a serial phase shifter, consistent with one or more exemplary embodiments of the present disclosure. A chemical potential of metamaterial switches in an exemplary implementation of $i^{th}$ transmission line 708 in FIG. 7A for i=2 of a first metamaterial phase shifter (similar to metamaterial phase shifter 700) in the serial metamaterial phase shifter is set to about 0 eV. A chemical potential of metamaterial switches in an exemplary implementation of $i^{th}$ transmission line 708 in FIG. 7A for i=1 of a second metamaterial phase shifter (similar to metamaterial phase shifter 700) in the serial metamaterial phase shifter is set to about 0 eV. A chemical potential of metamaterial switches in an exemplary implementation of $i^{th}$ transmission line 708 in FIG. 7A for i=1 of a third metamaterial phase shifter (similar to metamaterial phase shifter 700) in the serial metamaterial phase shifter is set to about 0 eV. Moreover, a chemical potential of metamaterial switches in exemplary implementation of $i^{th}$ transmission line 708 in FIG. 7A for i=1, 2, and 2 of the first metamaterial phase shifter, the second metamaterial phase shifter, and the third metamaterial phase shifter, respectively, is set to about 0.6 eV. As a result, a phase shift of about 120°+180°=300° is applied to the microwave signal.

In FIG. 27, a power of the microwave signal is shown that is passed through exemplary implementations of $i^{th}$ transmission line 708 in FIG. 7A for i=1, 2, and 2 of the first metamaterial phase shifter, the second metamaterial phase shifter, and the third metamaterial phase shifter, respectively. Meanwhile, exemplary implementation of $i^{th}$ transmission line 708 in FIG. 7A for i=2, 1, and 1 of the first metamaterial phase shifter, the second metamaterial phase shifter, and the third metamaterial phase shifter, respectively, block the microwave signal.

Example 10

In this example, a performance of a system for direct antenna modulation (similar to system 800) is evaluated. The system implements an on-off keying on a microwave signal (similar to microwave signal 806) and radiates a modulated microwave signal (similar to modulated microwave signal 808). The systems includes a rectangular microstrip antenna (similar to rectangular microstrip antenna 804A). A width of a first rectangular metal patch (similar to rectangular metal patch 816) is about 36.1 µm and a length of the rectangular metal patch is about 48.7 µm. A width of a first conductive plate (similar to first conductive plate 402) and a width of a first strip conductor (similar to first strip conductor 814) is about 5 µm. A distance between the first conductive plate and a second conductive plate (similar to second conductive plate 408) is about 6 µm. A distance between the first conductive plate and a third conductive plate (similar to third conductive plate 414) is about 6 µm. A relative permittivity of a first magneto-dielectric material (similar to first magneto-dielectric material 406B) is about 3.75. A length of a first graphene monolayer (similar to first graphene monolayer 430) and a length of a second graphene monolayer (similar to second graphene monolayer 432) is about 45 µm. A width of the first graphene monolayer and a width of the second graphene monolayer is about 20 µm.

Figure 28:
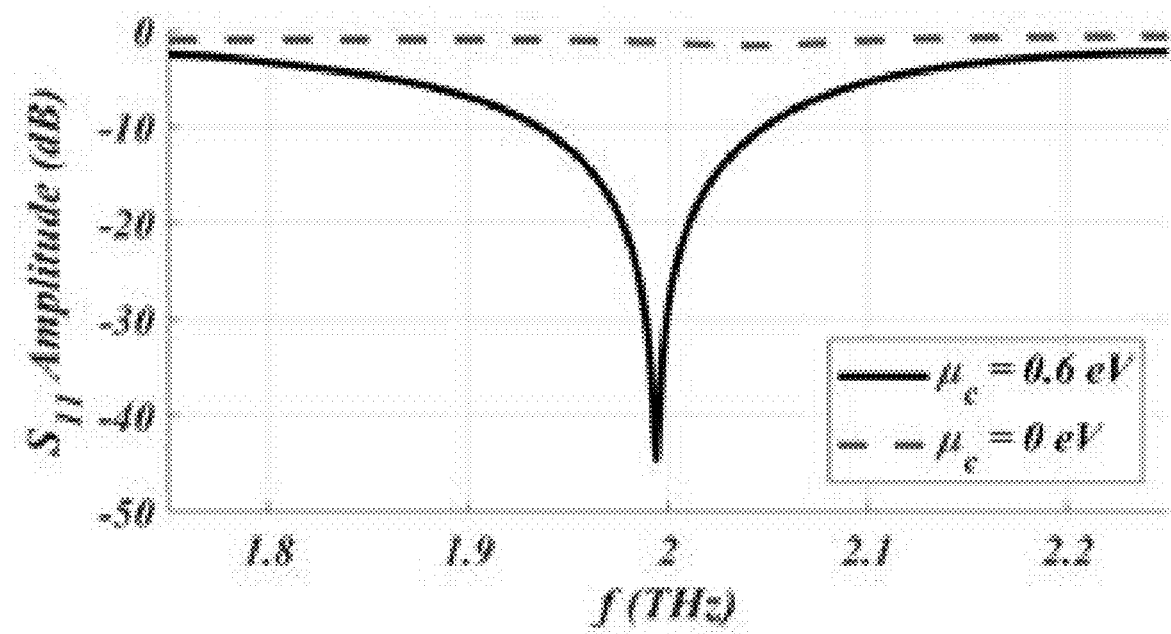
FIG. 28 shows a return loss of a system for direct antenna modulation, consistent with one or more exemplary embodiments of the present disclosure.

FIG. 28 shows a return loss of a system for direct antenna modulation, consistent with one or more exemplary embodiments of the present disclosure. An exemplary return loss amplitude $S_{11}$ versus frequency f (THz) of the system depends on a value of a chemical potential $\mu_c$ that is applied to the first graphene monolayer and the second graphene monolayer. When chemical potential $\mu_c$ is set to about 0 ev, the return loss is near-zero, that is, the microwave signal returns from the rectangular microstrip antenna and does not radiate. On the other hand, when chemical potential $\mu_c$ is set to about 0.6 ev, the return loss less than −40 dB at a frequency about 2 THz, that is, the microwave signal does not return from the rectangular microstrip antenna and the rectangular microstrip antenna radiates.

Example 11

In this example, a performance of an EMNZ metamaterial-based switched-beam array antenna (similar to EMNZ metamaterial-based switched-beam array antenna 1000) is evaluated. The EMNZ metamaterial-based switched-beam array antenna includes 4 dipole microstrip antennas (each similar to dipole microstrip antenna 804B). A width of a first conductive plate (similar to first conductive plate 402) and a width of a second strip conductor (similar to second strip conductor 820) is about 10 µm. A distance between the first conductive plate and a second conductive plate (similar to second conductive plate 408) is about 6 µm. A distance between the first conductive plate and a third conductive plate (similar to third conductive plate 414) is about 6 µm. A relative permittivity of a first magneto-dielectric material (similar to first magneto-dielectric material 406B) is about 3.75.

Figure 29:
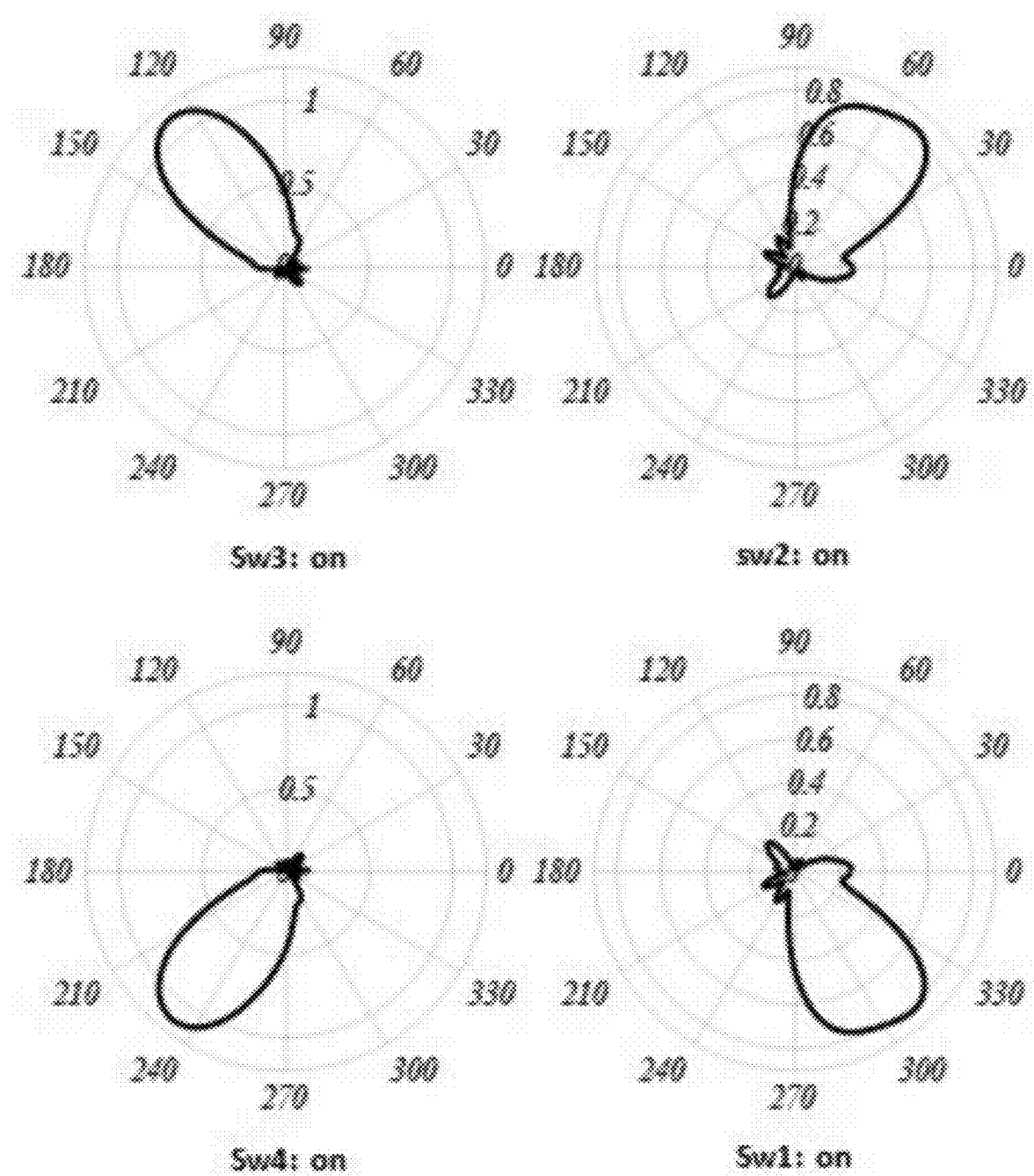
FIG. 29 shows a radiation pattern of an EMNZ metamaterial-based switched-beam array antenna, consistent with one or more exemplary embodiments of the present disclosure.

FIG. 29 shows a radiation pattern of an EMNZ metamaterial-based switched-beam array antenna, consistent with one or more exemplary embodiments of the present disclosure. A respective radiation pattern corresponding to each of metamaterial switches is depicted. A metamaterial switch (similar to a respective metamaterial switch of plurality of metamaterial switches 1004) is closed (i.e., turned on) in each pattern and other metamaterial switches are open. The bottom right pattern in FIG. 29 corresponds to closing a switch Sw1 (analogous to the bottom right metamaterial switch in FIG. 10) of plurality of metamaterial switches 1004. The top right pattern in FIG. 29 corresponds to closing a switch sw2 (analogous to the top right metamaterial switch in FIG. 10) of plurality of metamaterial switches 1004. The top left pattern in FIG. 29 corresponds to closing a switch Sw3 (analogous to the top left metamaterial switch in FIG. 10) of plurality of metamaterial switches 1004. The bottom left pattern in FIG. 29 corresponds to closing a switch Sw4 (analogous to the bottom left metamaterial switch in FIG. 10) of plurality of metamaterial switches 1004. As shown in FIG. 29, an angular resolution about 90 degrees is achieved by implementing an array with four antennas.

Example 12

In this example, a performance of an EMNZ metamaterial-based phased array antenna (similar to EMNZ metamaterial-based phased array antenna 1100) is evaluated. The EMNZ metamaterial-based phased array antenna includes a plurality of metamaterial phase shifters (similar to plurality of metamaterial phase shifters 1102) including five metamaterial phase shifters and a plurality of antennas (similar to plurality of antennas 1104) including five antennas. The EMNZ metamaterial-based phased array antenna is configured to provide an angular resolution of 30 degrees, i.e., to direct a radiation pattern of the EMNZ metamaterial-based phased array antenna in 0, 30, 60, 90, 120, 150, and 180 degrees. The required phase shifts for each phase shifter in each angle is tabulated in Table 1. Phase shifter of the plurality of phase shifters are labeled by PS1, PS2, PS3, PS4, and PS5.

TABLE 1

| Δφ | PS1 | PS2 | PS3 | PS4 | PS5 |
|---|---|---|---|---|---|
| 0 | 0 | 0 | 0 | 0 | 0 |
| 30 | 0 | 30 | 60 | 90 | 120 |
| 60 | 0 | 60 | 120 | 180 | 240 |
| 90 | 0 | 90 | 180 | 270 | 0 |
| 120 | 0 | 120 | 240 | 0 | 120 |
| 150 | 0 | 150 | 300 | 90 | 240 |
| 180 | 0 | 180 | 0 | 180 | 0 |

According to Table 1, PS2 and PS4 need to apply a set of phase shifts about 0, 30, 60, 90, and 180 degrees on a microwave signal (similar to microwave signal 1112), PS 3 needs to apply a set of phase shifts about 0, 60, 120, and 180 degrees on microwave signal 1112, and PS5 needs to apply a set of phase shifts about 0, 120, and 240 on microwave signal 1112. A serial metamaterial phase shifter (similar to serial metamaterial phase shifter 732) is utilized for implementation of each of the plurality of phase shifters. The required phase shifts are obtained by combination of a set of phase shifts about 30, 60, 90, and 180 degrees. For example, a phase shift of about 120 degrees in each of PS2 and PS3 may be implemented utilizing a combination of a phase shift of about 30 degrees and another phase shift of about 90 degrees.

Figure 30:
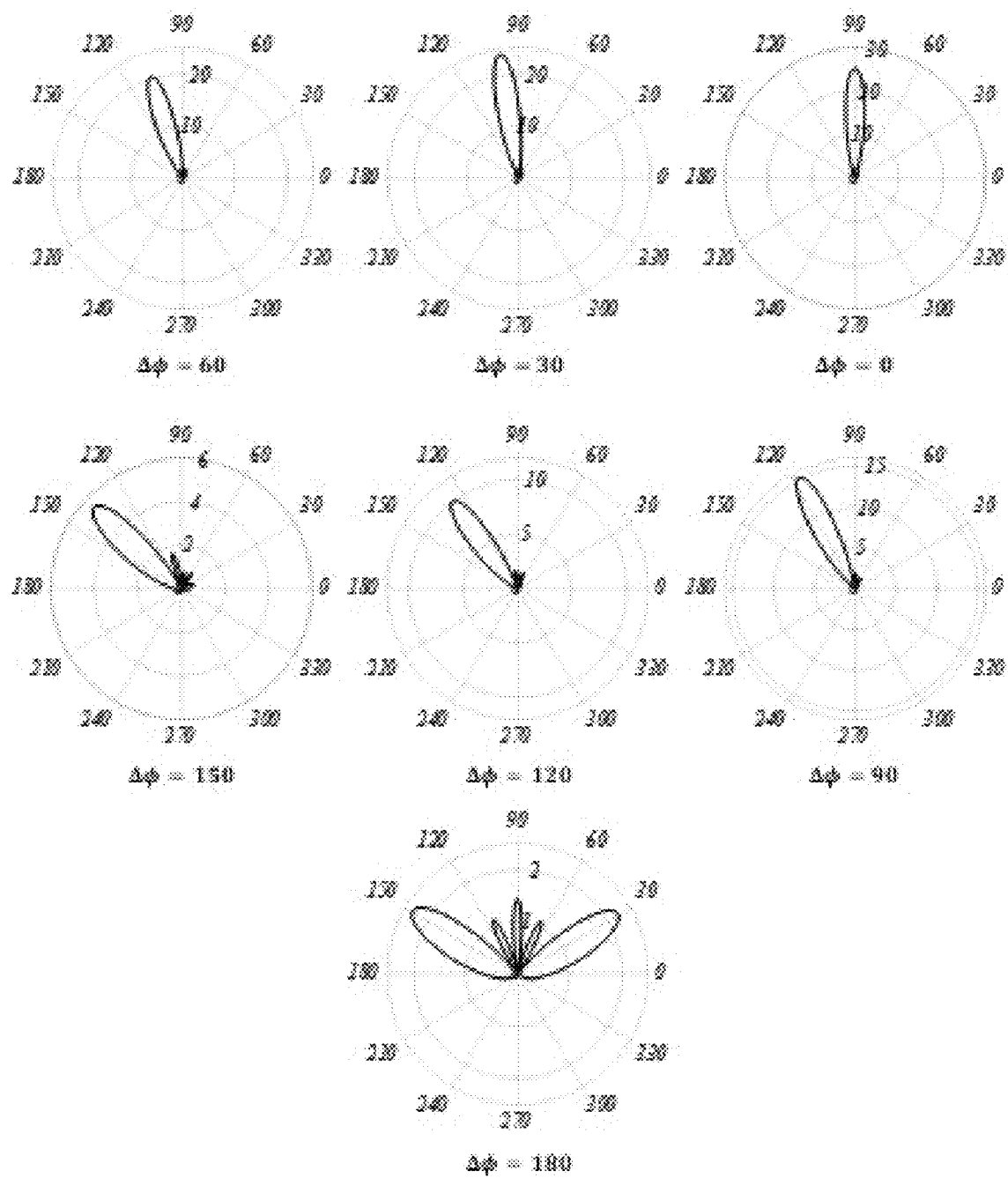
FIG. 30 shows a radiation pattern of an EMNZ metamaterial-based phased array antenna, consistent with one or more exemplary embodiments of the present disclosure.

FIG. 30 shows a radiation pattern of an EMNZ metamaterial-based phased array antenna, consistent with one or more exemplary embodiments of the present disclosure. A radiation pattern of the EMNZ metamaterial-based phased array antenna for different directions is depicted in FIG. 30. The EMNZ metamaterial-based phased array antenna succeeds to steer a main lobe of the radiation pattern toward predetermined directions, i.e., steering the main lobe at an angle Δφ of about 0 (resulting in the top right pattern in FIG. 30), 30 (resulting in the top center pattern in FIG. 30), 60 (resulting in the top left pattern in FIG. 30), 90 (resulting in the middle right pattern in FIG. 30), 120 (resulting in the middle center pattern in FIG. 30), 150 (resulting in the middle left pattern in FIG. 30), and 180 degrees (resulting in the down center pattern in FIG. 30), by applying different phase shifts to the plurality of metamaterial phase shifters as in Table 1.

While the foregoing description has described what may be considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various implementations. This is for purposes of streamlining the disclosure, and is not to be interpreted as reflecting an intention that the claimed implementations require more features than are expressly recited in each claim. Rather, as the following claims reflect, inventive subject matter lies in less than all features of a single disclosed implementation. Thus, the following claims are hereby incorporated into the Detailed Description, with each claim standing on its own as a separately claimed subject matter.

While various implementations have been described, the description is intended to be exemplary, rather than limiting and it will be apparent to those of ordinary skill in the art that many more implementations and implementations are possible that are within the scope of the implementations. Although many possible combinations of features are shown in the accompanying figures and discussed in this detailed description, many other combinations of the disclosed features are possible. Any feature of any implementation may be used in combination with or substituted for any other feature or element in any other implementation unless specifically restricted. Therefore, it will be understood that any of the features shown and/or discussed in the present disclosure may be implemented together in any suitable combination. Accordingly, the implementations are not to be restricted except in light of the attached claims and their equivalents. Also, various modifications and changes may be made within the scope of the attached claims.

What is claimed is:

1. A system for epsilon-and-mu-near-zero (EMNZ) metamaterial-based direct antenna modulation, the system comprising:
   a signal generator configured to generate a microwave signal;
   a metamaterial switch configured to generate a modulated microwave signal from the microwave signal by selectively passing the microwave signal through the metamaterial switch, the metamaterial switch comprising:
      a first conductive plate;
      a first loaded conductive plate comprising:
         a second conductive plate parallel with the first conductive plate; and
         a first graphene monolayer comprising a first tunable conductivity, the first graphene monolayer positioned between the first conductive plate and the second conductive plate; and
      a first magneto-dielectric material deposited on the first loaded conductive plate; and
   an antenna coupled with the metamaterial switch, the antenna configured to radiate the modulated microwave signal,
   wherein an effective permittivity of the metamaterial switch is configured to be adjusted to a predetermined value responsive to tuning the first tunable conductivity.

2. The system of claim 1, wherein the metamaterial switch further comprises:
   a second loaded conductive plate comprising:
      a third conductive plate parallel with the second conductive plate; and
      a second graphene monolayer comprising a second tunable conductivity equal to the first tunable conductivity, the second graphene monolayer positioned between the first conductive plate and the third conductive plate;
   a first dielectric spacer coated on the first graphene monolayer and attached to the second conductive plate, a thickness of the first dielectric spacer equal to or smaller than a quarter of a guided wavelength of the microwave signal, a permittivity of the first dielectric spacer equal to a permittivity of the first magneto-dielectric material, and a permeability of the first dielectric spacer equal to a permeability of the first magneto-dielectric material; and
   a second dielectric spacer coated on the second graphene monolayer and attached to the third conductive plate, a thickness of the second dielectric spacer equal to or smaller than a quarter of the guided wavelength, a permittivity of the second dielectric spacer equal to a permittivity of the first magneto-dielectric material, and a permeability of the second dielectric spacer equal to a permeability of the first magneto-dielectric material,
   wherein the first conductive plate is vertically positioned between the first loaded conductive plate and the second loaded conductive plate and is horizontally positioned between a respective proximal end and a respective distal end of each of the first graphene monolayer and the second graphene monolayer.

3. The system of claim 2, wherein the metamaterial switch is configured to selectively pass the microwave signal by:
   being closed responsive to receiving a data bit equal to a first value; and
   being opened responsive to receiving the data bit equal to a second value.

4. The system of claim 3, wherein the metamaterial switch is configured to:
   be closed by setting each of the first tunable conductivity and the second tunable conductivity to be larger than a conductivity threshold, each of the first tunable conductivity and the second tunable conductivity configured to be set larger than the conductivity threshold by applying a first electric potential to each of the first graphene monolayer and the second graphene monolayer; and
   be opened by setting each of the first tunable conductivity and the second tunable conductivity to be smaller than the conductivity threshold, each of the first tunable conductivity and the second tunable conductivity configured to be set smaller than the conductivity threshold by applying a second electric potential to each of the first graphene monolayer and the second graphene monolayer.

5. The system of claim 1, wherein the antenna comprises one of a rectangular microstrip antenna and a dipole microstrip antenna, wherein:
   the rectangular microstrip antenna comprises:
      a ground plane connected to the second conductive plate;

a second magneto-dielectric material deposited on the ground plane and attached to the first magneto-dielectric material, a permittivity of the second magneto-dielectric material equal to a permittivity of the first magneto-dielectric material and a permeability of the second magneto-dielectric material equal to a permeability of the first magneto-dielectric material;
a first strip conductor connected to the first conductive plate and printed on the second magneto-dielectric material; and
a first rectangular metal patch connected to the first strip conductor and printed on the second magneto-dielectric material; and the dipole microstrip antenna comprises:
a third magneto-dielectric material attached to the first magneto-dielectric material, a permittivity of the third magneto-dielectric material equal to a permittivity of the first magneto-dielectric material and a permeability of the third magneto-dielectric material equal to a permeability of the first magneto-dielectric material;
a first arm comprising:
a second strip conductor connected to the first conductive plate and printed on a top surface of the third magneto-dielectric material; and
a second rectangular metal patch connected to the second strip conductor and printed on the top surface; and
a second arm comprising:
a third strip conductor connected to the second conductive plate and printed on a bottom surface of the third magneto-dielectric material; and
a third rectangular metal patch connected to the third strip conductor and printed on the bottom surface.

6. The system of claim 5, wherein the dipole microstrip antenna further comprises:
a plurality of reflector patches configured to reflect the modulated microwave signal, the plurality of reflector patches comprising:
a first reflector patch printed on the top surface and placed on a left-side of the second strip conductor and a front side of the second rectangular metal patch;
a second reflector patch printed on the top surface and placed on a right-side of the second strip conductor and the front side of the second rectangular metal patch;
a third reflector patch printed on the bottom surface and placed on a left-side of the third strip conductor and a front side of the third rectangular metal patch;
a fourth reflector patch printed on the bottom surface and placed on a right-side of the third strip conductor and the front side of the third rectangular metal patch; and
a plurality of director patches printed on the top surface and placed in parallel with the second rectangular metal patch, the plurality of director patches configured to direct the modulated microwave signal in a plane parallel with the second rectangular metal patch.

7. A method for EMNZ metamaterial-based direct antenna modulation, comprising:
generating, utilizing a signal generator, a microwave signal;
generating, utilizing a metamaterial switch, a modulated microwave signal from the microwave signal by selectively passing the microwave signal through the metamaterial switch, wherein the selectively passing the microwave signal comprises adjusting an effective permittivity of the metamaterial switch to a predetermined value by:
placing a first conductive plate of the metamaterial switch in parallel with a first loaded conductive plate of the metamaterial switch, the first loaded conductive plate comprising a first graphene monolayer;
positioning the first graphene monolayer between the first conductive plate and a second conductive plate of the first loaded conductive plate;
depositing a first magneto-dielectric material of the metamaterial switch on the first loaded conductive plate; and
tuning a first tunable conductivity of the first graphene monolayer; and
radiating the modulated microwave signal by coupling an antenna with the metamaterial switch.

8. The method of claim 7, wherein the adjusting the effective permittivity further comprises:
placing a second loaded conductive plate of the metamaterial switch in parallel with the second conductive plate, the second loaded conductive plate comprising a second graphene monolayer;
positioning the second graphene monolayer between the first conductive plate and a third conductive plate of the second loaded conductive plate;
coating a first dielectric spacer on the first graphene monolayer;
attaching the first dielectric spacer to the second conductive plate;
coating a second dielectric spacer on the second graphene monolayer;
attaching the second dielectric spacer to the third conductive plate;
setting a second tunable conductivity of the second graphene monolayer equal to the first tunable conductivity;
setting a thickness of each of the first dielectric spacer and the second dielectric spacer equal to or smaller than a quarter of a guided wavelength of the microwave signal;
setting a permittivity of each of the first dielectric spacer and the second dielectric spacer equal to a permittivity of the first magneto-dielectric material; and
setting a permeability of each of the first dielectric spacer and the second dielectric spacer equal to a permeability of the first magneto-dielectric material.

9. The method of claim 8, wherein placing the first conductive plate comprises:
vertically positioning the first conductive plate between the first loaded conductive plate and the second loaded conductive plate; and
horizontally positioning the first conductive plate between a respective proximal end and a respective distal end of each of the first graphene monolayer and the second graphene monolayer.

10. The method of claim 8, wherein the selectively passing the microwave signal further comprises:
closing the metamaterial switch responsive to receiving a data bit equal to a first value; and
opening the metamaterial switch responsive to receiving the data bit equal to a second value.

11. The method of claim 10, wherein:
closing the metamaterial switch comprises setting each of the first tunable conductivity and the second tunable conductivity to be larger than a conductivity threshold by applying a first electric potential to each of the first graphene monolayer and the second graphene monolayer; and opening the metamaterial switch comprises setting each of the first tunable conductivity and the second tunable conductivity to be smaller than the conductivity threshold by applying a second electric potential to each of the first graphene monolayer and the second graphene monolayer.

12. The method of claim 7, wherein radiating the modulated microwave signal utilizing an antenna comprises one of:

radiating the modulated microwave signal utilizing a rectangular microstrip antenna by:
connecting a ground plane of the rectangular microstrip antenna to the second conductive plate;
depositing a second magneto-dielectric material of the rectangular microstrip antenna on the ground plane, wherein:
a permittivity of the second magneto-dielectric material is equal to a permittivity of the first magneto-dielectric material; and
a permeability of the second magneto-dielectric material is equal to a permeability of the first magneto-dielectric material;
attaching the second magneto-dielectric material to the first magneto-dielectric material;
connecting a first strip conductor of the rectangular microstrip antenna to the first conductive plate;
printing the first strip conductor on the second magneto-dielectric material;
connecting a first rectangular metal patch of the rectangular microstrip antenna to the first strip conductor; and
printing the first rectangular metal patch on the second magneto-dielectric material; and radiating the modulated microwave signal utilizing a dipole microstrip antenna by:
attaching a third magneto-dielectric material of the dipole microstrip antenna to the first magneto-dielectric material, wherein:
a permittivity of the third magneto-dielectric material is equal to a permittivity of the first magneto-dielectric material; and
a permeability of the third magneto-dielectric material equal is to a permeability of the first magneto-dielectric material;
connecting a second strip conductor of a first arm of the dipole microstrip antenna to the first conductive plate;
printing the second strip conductor on a top surface of the third magneto-dielectric material;
connecting a second rectangular metal patch of the first arm to the second strip conductor; and
printing the second rectangular metal patch on the top surface;
connecting a third strip conductor of a second arm of the dipole microstrip antenna to the second conductive plate;
printing the third strip conductor on a bottom surface of the third magneto-dielectric material;
connecting a third rectangular metal patch of the second arm to the third strip conductor; and
printing the third rectangular metal patch on the bottom surface.

13. The method of claim 12, wherein radiating the modulated microwave signal utilizing the dipole microstrip antenna further comprises:
printing a first reflector patch of the dipole microstrip antenna on a left-side of the second strip conductor;
printing a second reflector patch of the dipole microstrip antenna on a right-side of the second strip conductor;
printing a third reflector patch of the dipole microstrip antenna on a right-side of the third strip conductor;
printing a fourth reflector patch of the dipole microstrip antenna on a left-side of the third strip conductor; and
directing the modulated microwave signal in a plane parallel with the second rectangular metal patch by printing a plurality of director patches of the dipole microstrip antenna on the top surface and in parallel with the second rectangular metal patch.

14. An EMNZ metamaterial-based switched-beam array antenna, comprising:
a plurality of antennas configured to radiate a microwave signal, each of the plurality of antennas associated with a respective direction of a plurality of directions, the plurality of directions comprising a predetermined direction and a direction set; and
a plurality of metamaterial switches comprising a predetermined metamaterial switch and a metamaterial switch set, the plurality of metamaterial switches configured to direct the microwave signal to the predetermined direction, each of the plurality of metamaterial switches coupled with a respective antenna of the plurality of antennas, each of the plurality of metamaterial switches comprising:
a first conductive plate;
a first loaded conductive plate comprising:
a second conductive plate parallel with the first conductive plate; and
a first graphene monolayer comprising a first tunable conductivity, the first graphene monolayer positioned between the first conductive plate and the second conductive plate; and
a first magneto-dielectric material deposited on the first loaded conductive plate;
wherein an effective permittivity of the metamaterial switch is configured to be adjusted to a predetermined value responsive to tuning the first tunable conductivity.

15. The EMNZ metamaterial-based switched-beam array antenna of claim 14, wherein each of the plurality of metamaterial switches further comprises:
a second loaded conductive plate comprising:
a third conductive plate parallel with the second conductive plate; and
a second graphene monolayer comprising a second tunable conductivity equal to the first tunable conductivity, the second graphene monolayer positioned between the first conductive plate and the third conductive plate;
a first dielectric spacer coated on the first graphene monolayer and attached to the second conductive plate, a thickness of the first dielectric spacer equal to or smaller than a quarter of a guided wavelength of the microwave signal, a permittivity of the first dielectric spacer equal to a permittivity of the first magneto-dielectric material, and a permeability of the first dielectric spacer equal to a permeability of the first magneto-dielectric material; and
a second dielectric spacer coated on the second graphene monolayer and attached to the third conductive plate, a thickness of the second dielectric spacer equal to or smaller than a quarter of the guided wavelength, a permittivity of the second dielectric spacer equal to a permittivity of the first magneto-dielectric material, and a permeability of the second dielectric spacer equal to a permeability of the first magneto-dielectric material, wherein the first conductive plate is vertically positioned between the first loaded conductive plate and the second loaded conductive plate and is horizontally positioned between a respective proximal end and a respective distal end of each of the first graphene monolayer and the second graphene monolayer.

16. The EMNZ metamaterial-based switched-beam array antenna of claim 15, wherein:

the predetermined metamaterial switch is configured to direct the microwave signal to the predetermined direction by being closed; and each respective metamaterial switch in the metamaterial switch set is configured to block the microwave signal from a respective direction in the direction set by being open.

17. The EMNZ metamaterial-based switched-beam array antenna of claim 16, wherein:

the predetermined metamaterial switch is configured to be closed by setting each of the first tunable conductivity and the second tunable conductivity to be larger than a conductivity threshold, each of the first tunable conductivity and the second tunable conductivity configured to be set larger than the conductivity threshold by applying a first electric potential to each of the first graphene monolayer and the second graphene monolayer; and each metamaterial switch in the metamaterial switch set is configured to be opened by setting each of the first tunable conductivity and the second tunable conductivity smaller than the conductivity threshold, each of the first tunable conductivity and the second tunable conductivity configured to be set smaller than the conductivity threshold by applying a second electric potential to each of the first graphene monolayer and the second graphene monolayer.

18. The EMNZ metamaterial-based switched-beam array antenna of claim 14, further comprising:

an array feed line;

a power splitter configured to receive the microwave signal from the array feed line; and a plurality of antenna feed lines connected to the power splitter, each of the plurality antenna feed lines configured to:

receive the microwave signal from the power splitter; and transmit the microwave signal to a respective metamaterial switch of the plurality of metamaterial switches.

19. The EMNZ metamaterial-based switched-beam array antenna of claim 14, wherein each of the plurality of antennas comprises a dipole microstrip antenna comprising:

a second magneto-dielectric material attached to the first magneto-dielectric material, a permittivity of the second magneto-dielectric material equal to a permittivity of the first magneto-dielectric material and a permeability of the second magneto-dielectric material equal to a permeability of the first magneto-dielectric material;

a first arm comprising:
a first strip conductor connected to the first conductive plate and printed on a top surface of the second magneto-dielectric material; and
a first rectangular metal patch connected to the first strip conductor and printed on the top surface; and a second arm comprising:
a second strip conductor connected to the second conductive plate and printed on a bottom surface of the second magneto-dielectric material; and
a second rectangular metal patch connected to the second strip conductor and printed on the bottom surface.

20. The EMNZ metamaterial-based switched-beam array antenna of claim 19, wherein the dipole microstrip antenna further comprises:

a plurality of reflector patches configured to reflect the microwave signal, the plurality of reflector patches comprising:
a first reflector patch printed on the top surface and placed on a left-side of the first strip conductor and a front side of the first rectangular metal patch;
a second reflector patch printed on the top surface and placed on a right-side of the first strip conductor and the front side of the first rectangular metal patch;
a third reflector patch printed on the bottom surface and placed on a left-side of the second strip conductor and a front side of the second rectangular metal patch;
a fourth reflector patch printed on the bottom surface and placed on a right-side of the second strip conductor and the front side of the second rectangular metal patch; and a plurality of director patches printed on the top surface and placed in parallel with the second rectangular metal patch, the plurality of director patches configured to direct the microwave signal in a plane parallel with the second rectangular metal patch.

* * * * *